(12) United States Patent
Chang et al.

(10) Patent No.: US 12,074,204 B2
(45) Date of Patent: Aug. 27, 2024

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Jung-Hung Chang, Changhua County (TW); Lo Heng Chang, Hsinchu (TW); Zhi-Chang Lin, Zhubei (TW); Shih-Cheng Chen, New Taipei (TW); Chien-Ning Yao, Hsinchu (TW); Kuo-Cheng Chiang, Zhubei (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 347 days.

(21) Appl. No.: 17/384,667

(22) Filed: Jul. 23, 2021

(65) Prior Publication Data

US 2023/0026310 A1 Jan. 26, 2023

(51) Int. Cl.
*H01L 29/417* (2006.01)
*H01L 21/8234* (2006.01)
*H01L 29/06* (2006.01)
*H01L 29/40* (2006.01)
*H01L 29/423* (2006.01)
*H01L 29/66* (2006.01)
(Continued)

(52) U.S. Cl.
CPC ............... *H01L 29/41733* (2013.01); *H01L 21/823475* (2013.01); *H01L 29/401* (2013.01); *H01L 29/42392* (2013.01); *H01L 29/66439* (2013.01); *H01L 29/66545* (2013.01); *H01L 29/66742* (2013.01); *H01L 29/775* (2013.01); *H01L 29/78606* (2013.01); *H01L 29/0653* (2013.01); *H01L 29/0665* (2013.01); *H01L 29/0673* (2013.01); *H01L 29/78696* (2013.01)

(58) Field of Classification Search
CPC ......... H01L 29/41733; H01L 29/42392; H01L 29/66439; H01L 29/66545; H01L 29/775; H01L 21/823475; H01L 29/66742
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Marcos D. Pizarro
(74) *Attorney, Agent, or Firm* — Birch, Stewart, Kolasch & Birch, LLP

(57) ABSTRACT

A method for forming a semiconductor structure is provided. The method includes forming a fin structure over a substrate. The fin structure includes a protection layer and alternating first and second semiconductor layers over the protection layer. The method also includes etching the fin structure to form a source/drain recess, forming a sacrificial contact in the source/drain recess, forming a source/drain feature over the sacrificial contact in the source/drain recess, removing the first semiconductor layers of the fin structure, thereby forming a plurality of nanostructures, forming a gate stack wrapping around the nanostructures, removing the substrate thereby exposing the protection layer and the sacrificial contact and replacing the sacrificial contact with a contact plug.

20 Claims, 61 Drawing Sheets

(51) Int. Cl.
    *H01L 29/775*     (2006.01)
    *H01L 29/786*     (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0336019 A1* | 10/2021 | Su ................... H01L 29/41725 |

* cited by examiner

SEMICONDUCTOR STRUCTURE AND METHOD FOR FORMING THE SAME

BACKGROUND

The electronics industry is experiencing ever-increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 through 2M-1, FIGS. 2A-2 through 2M-2, FIGS. 2N through 2U.

FIGS. 2V-1 and 2V-2 are cross-sectional views illustrating the formation of a semiconductor structure at various intermediate stages, in accordance with some embodiments of the disclosure.

FIGS. 4A through 4I and FIGS. 4J-1 and 4J-2 are cross-sectional views illustrating the formation of a semiconductor structure at various intermediate stages, in accordance with some embodiments of the disclosure.

FIGS. 5A through 5H and FIGS. 5I-1 and 5I-2 are cross-sectional views illustrating the formation of a semiconductor structure at various intermediate stages, in accordance with some embodiments of the disclosure.

DETAILED DESCRIPTION

Figure 1:
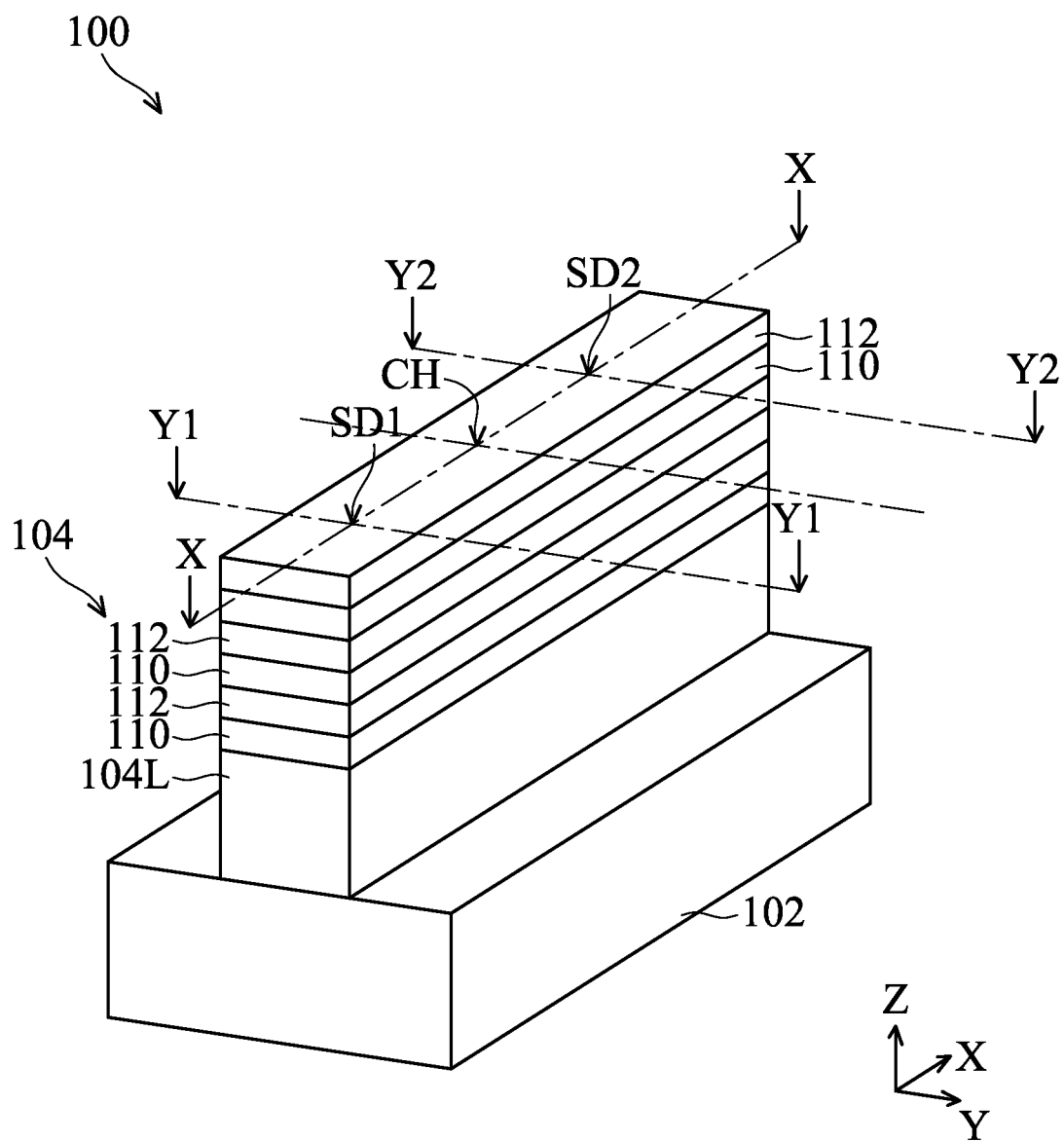
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The aspect of the embodiments of the present disclosure is direct to a semiconductor structure having a backside power rail and the method for forming the semiconductor structure. The back power rail means that the power rail is disposed at the backside of the substrate, which may be helpful in improving the density of routing tracks for signal transition and reduce the contact resistance of the power rail. The method for forming the semiconductor structure may include forming a fin structure including a protection layer and alternating first and second semiconductor layers. After source/drain features and a gate stack of a gate-all-around transistor are formed over the frontside of the semiconductor structure, the semiconductor structure is turned upside down and the substrate is etched away using the protection layer as an etching stop layer. The protection layer may protect the source/drain features from being damaged during the etching process. Therefore, the manufacturing yield and reliability of the semiconductor device are improved.

FIG. 1 is a perspective view of a semiconductor structure, in accordance with some embodiments of the disclosure. A semiconductor structure 100 is received or provided, as shown in FIG. 1, in accordance with some embodiments. The semiconductor structure 100 includes a substrate 102 and a fin structure 104 over the substrate 102, in accordance with some embodiments.

For a better understanding of the semiconductor structure, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The fin structure 104 includes a lower fin element 104L formed from a portion of the substrate 102 and an upper fin element formed from an epitaxial stack including alternating first semiconductor layers 110 and second semiconductor layer 112, in accordance with some embodiments.

The fin structure 104 extends in X direction, in accordance with some embodiments. That is, the fin structure 104 has a longitudinal axis parallel to X direction, in accordance with some embodiments. The X direction may also be referred to as the channel-extending direction.

The fin structure 104 includes a channel region CH, a first source/drain region SD1 and a second source/drain region SD2, where the channel region CH is defined between the first and second source/drain regions SD1 and SD2, in accordance with some embodiments. In some embodiments, the first source/drain region SD1 is a source region and the second source/drain region SD2 is a drain region. FIG. 1 shows one channel region CH and two source/drain regions SD1 and SD2 for illustrative purpose and is not intended to be limiting. The number of the channel region CH and the source/drain region SD1 and SD2 may be dependent on the semiconductor device design demand and/or performance consideration. Gate stack (not shown) will be formed with a longitudinal axis parallel to Y direction and extending across the channel region CH of the fin structure 104. As such, Y direction may also be referred to as a gate-extending direction.

FIG. 1 further illustrates a reference cross-section that is used in later figures. Cross-section X-X is in plans along the longitudinal axes (X direction) of the fin structure 104, in accordance with some embodiments. Cross-sections Y1-Y1 and Y2-Y2 are in plans across the first source/drain region SD1 and the second source/drain region SD2 of the fin structure 104 and parallel to the longitudinal axis (Y direction) of a gate stack, in accordance with some embodiments.

Figures 1, 2A:
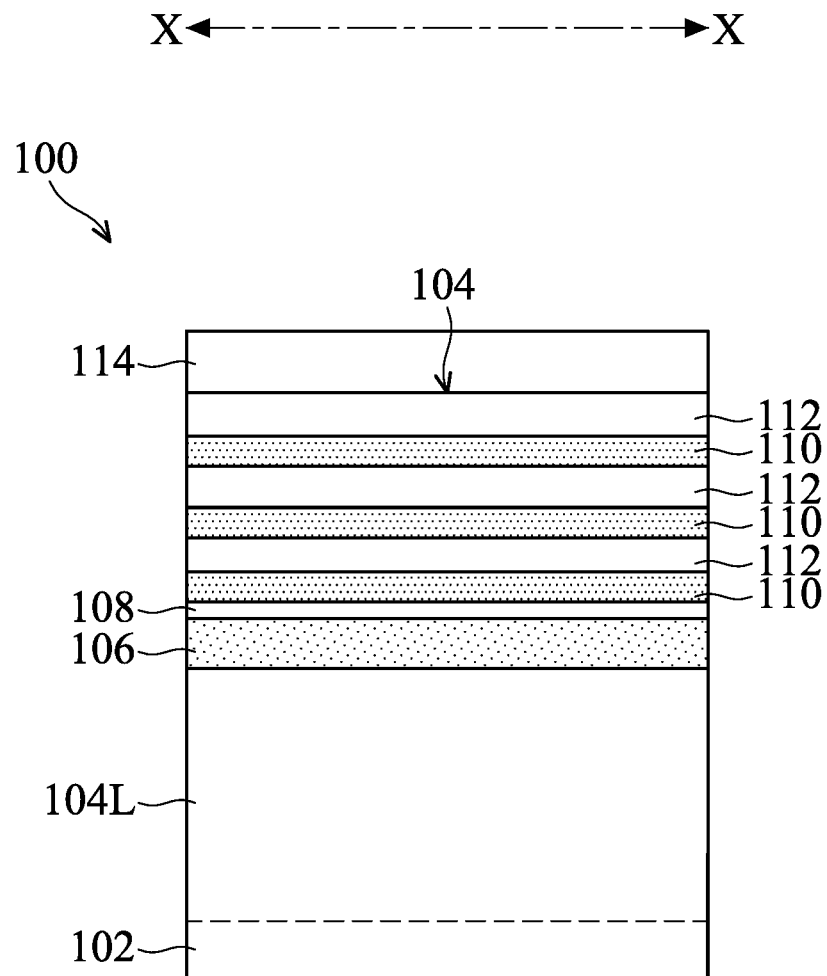
Figures 2, 2A:
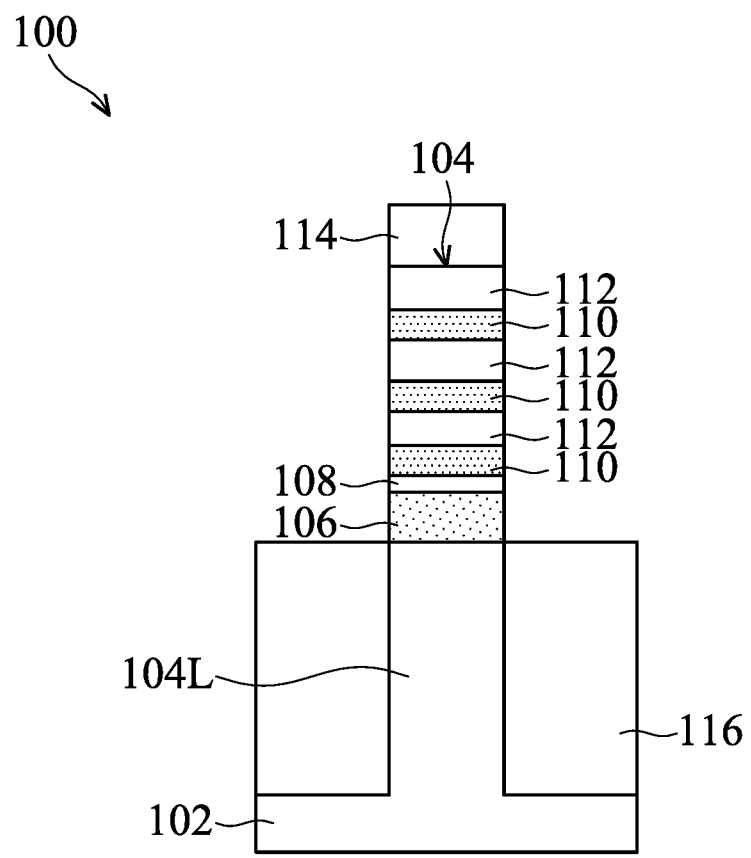
Figures 1, 2B:
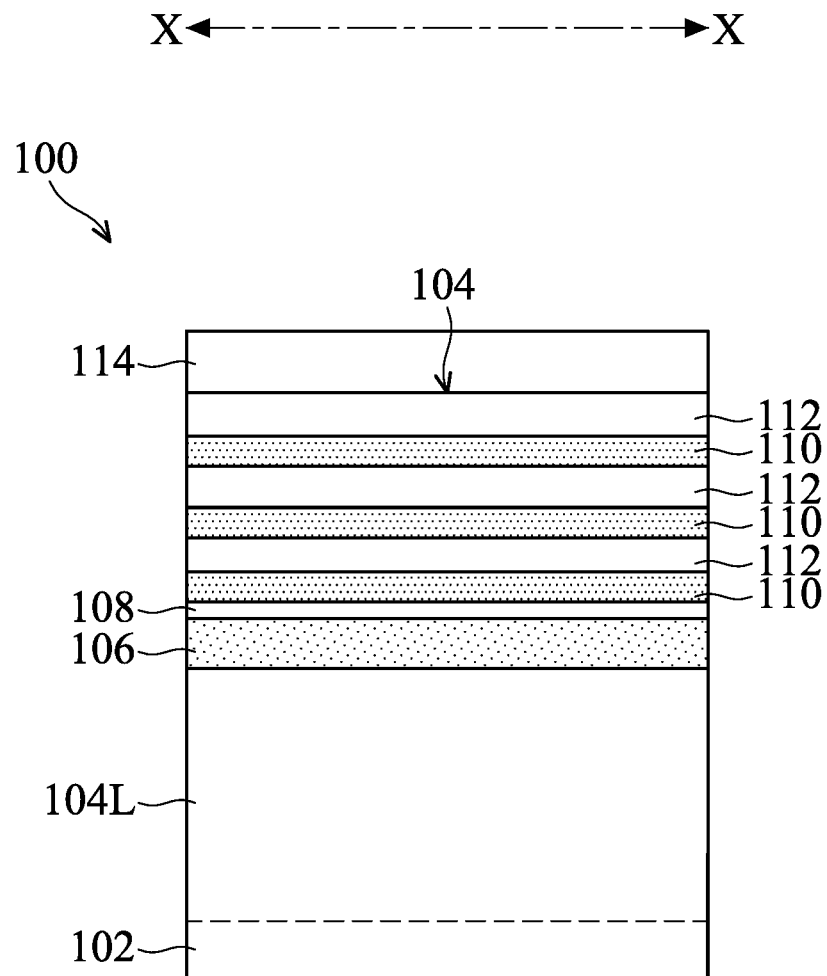
Figures 2, 2B:
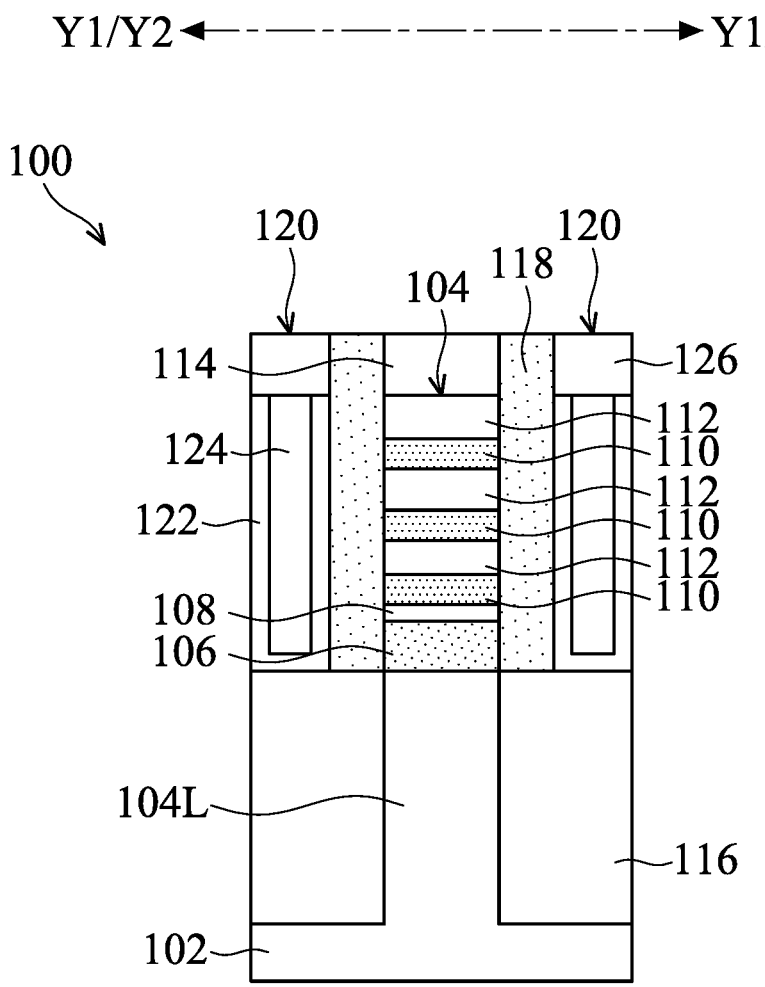
Figures 1, 2C:
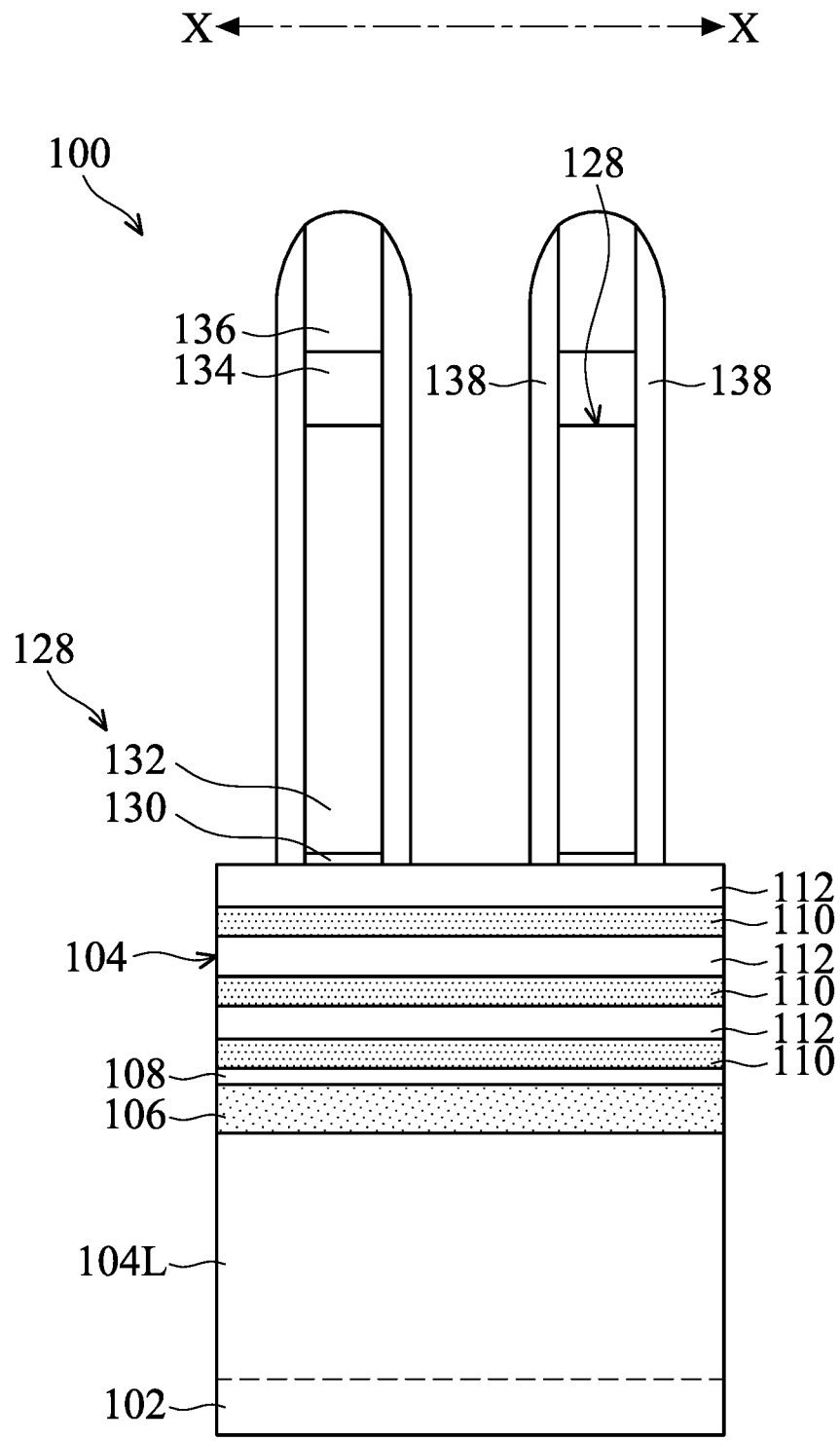
Figures 2, 2C:
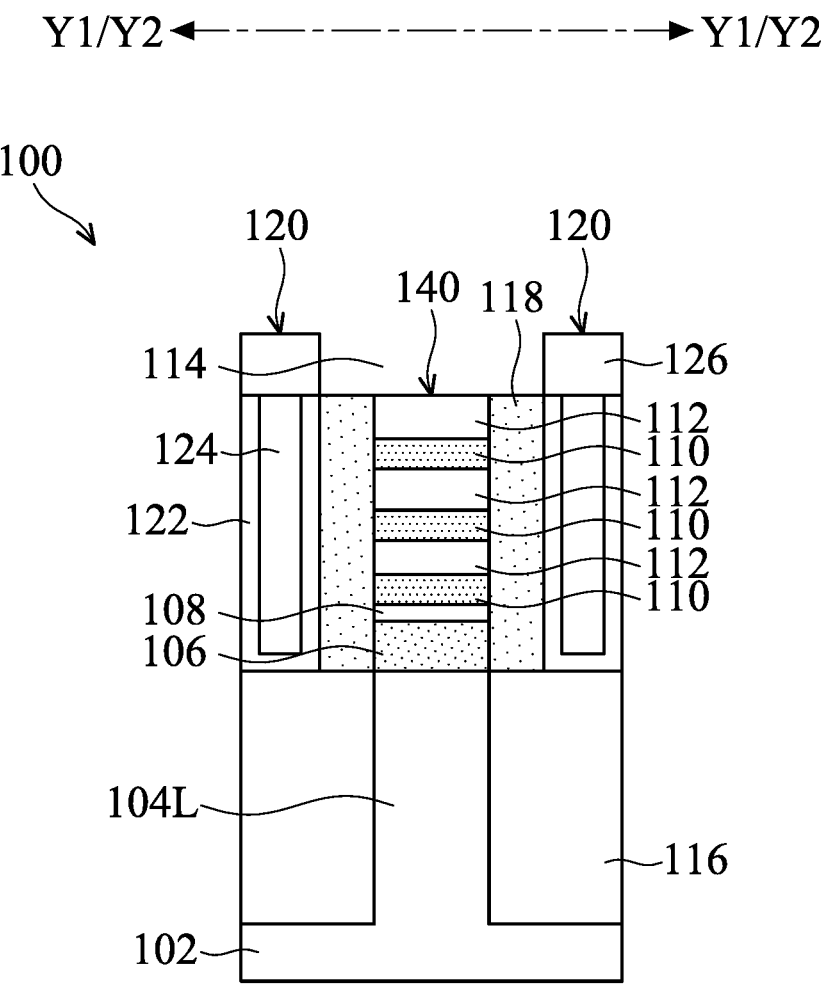
Figures 1, 2D:
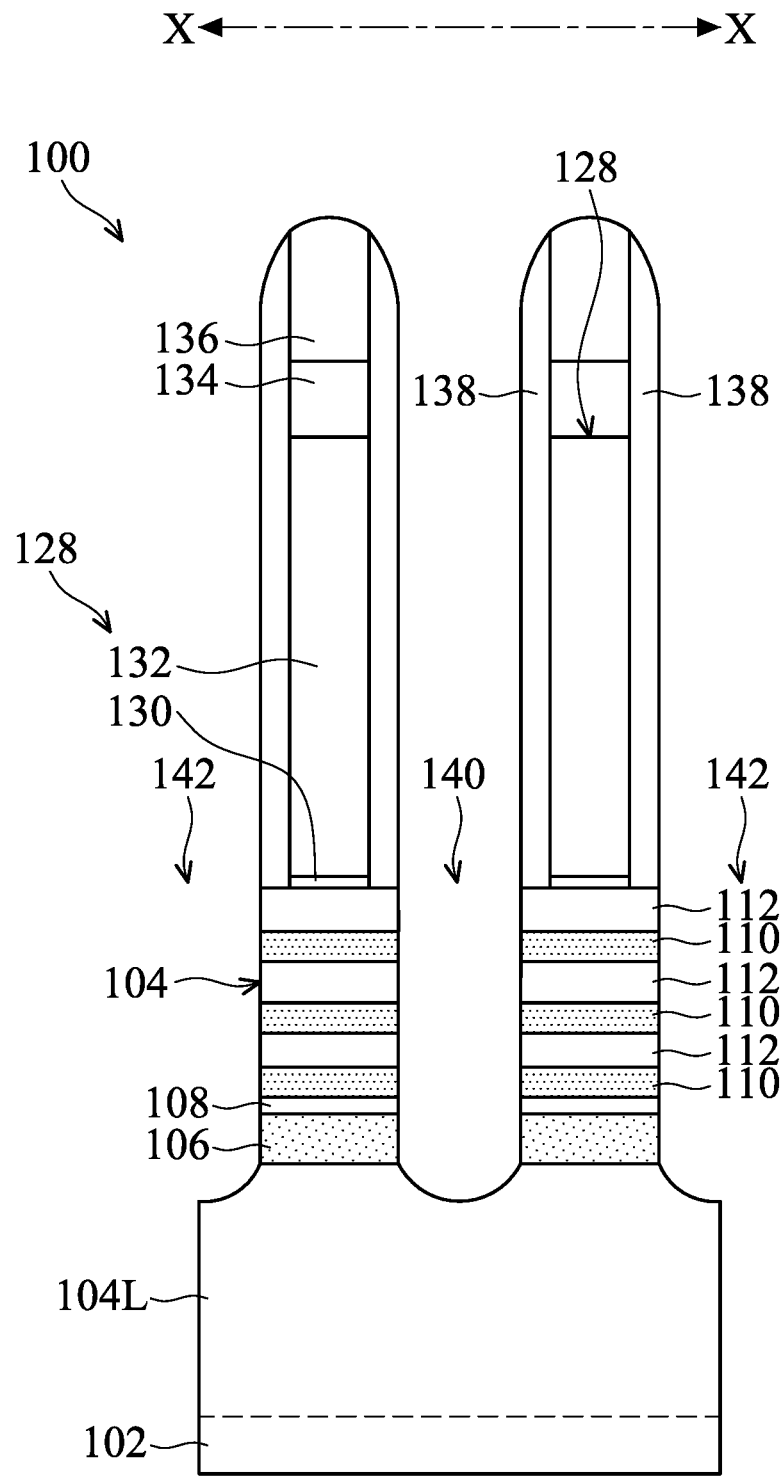
Figures 2, 2D:
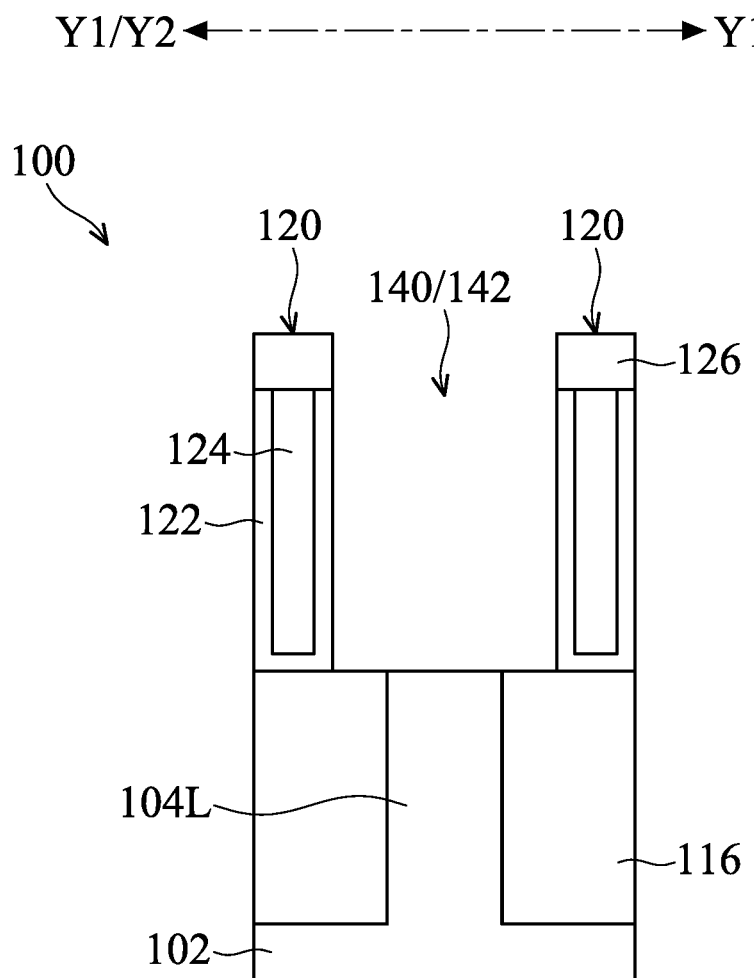
Figures 1, 2E:
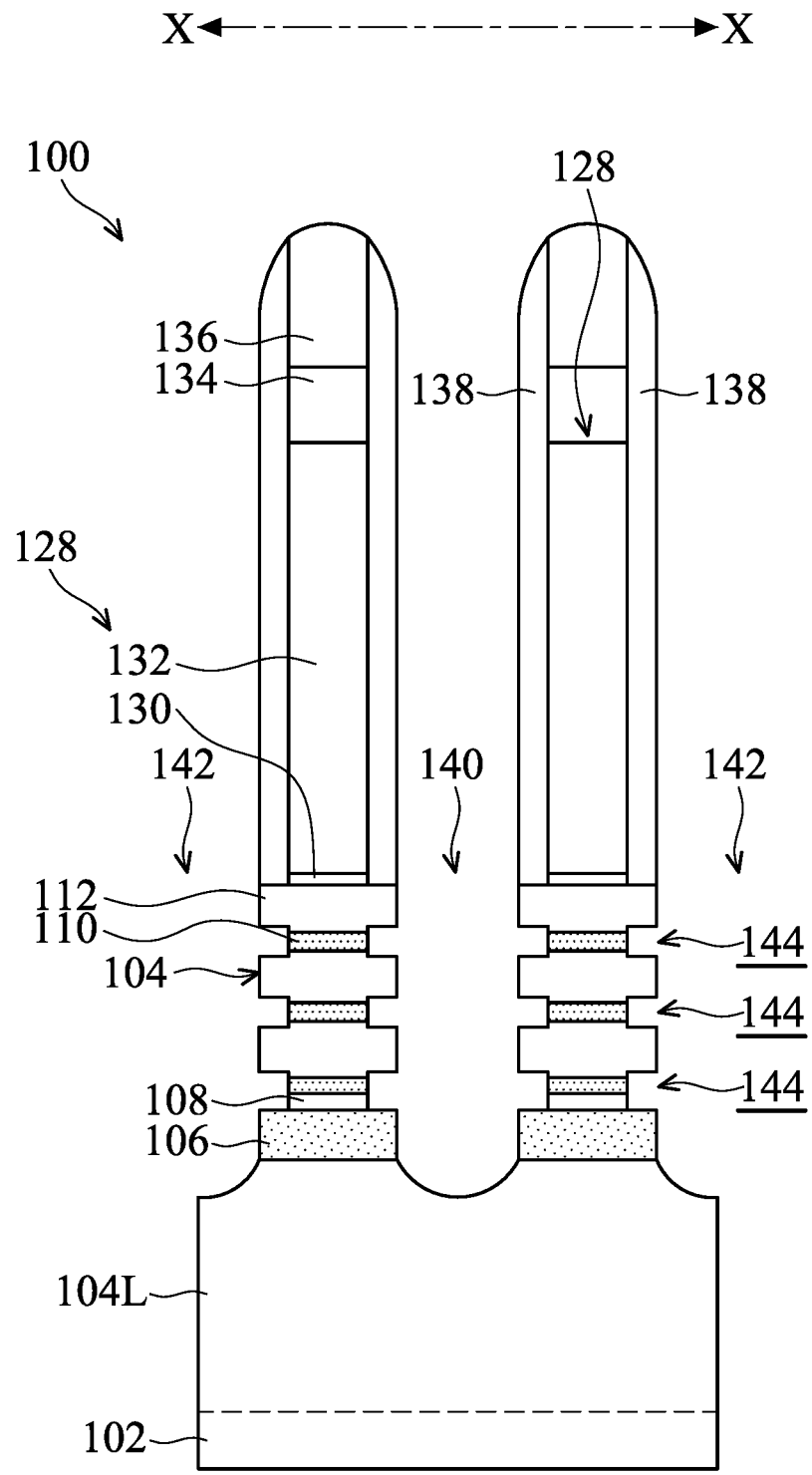
Figures 2, 2E:
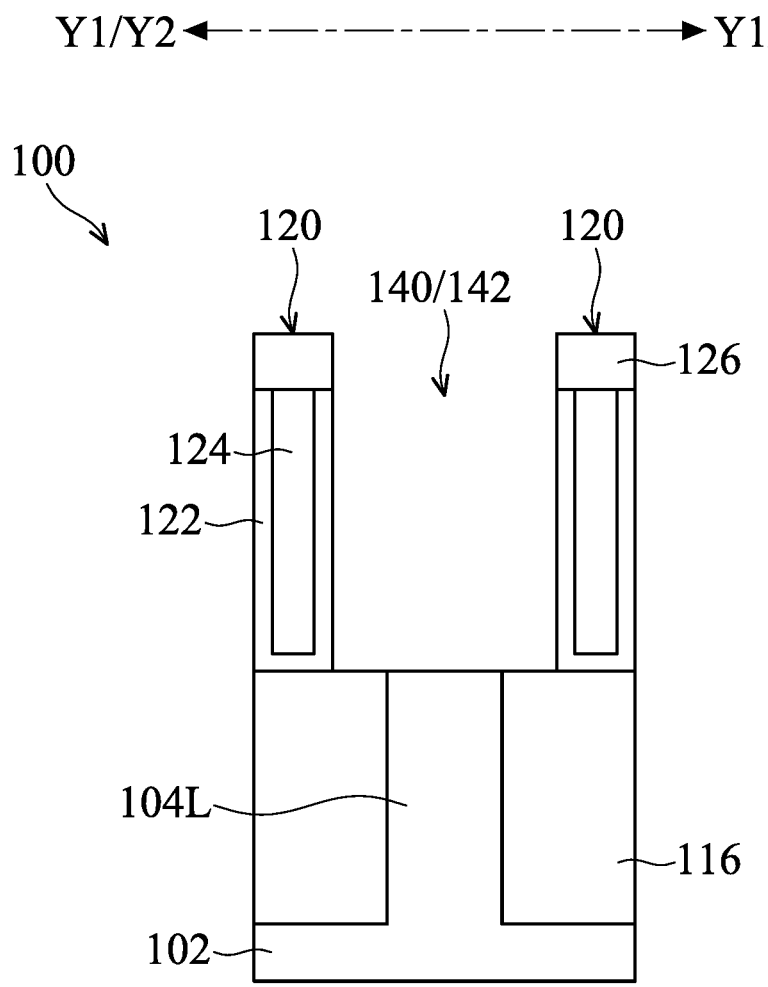
Figures 1, 2F:
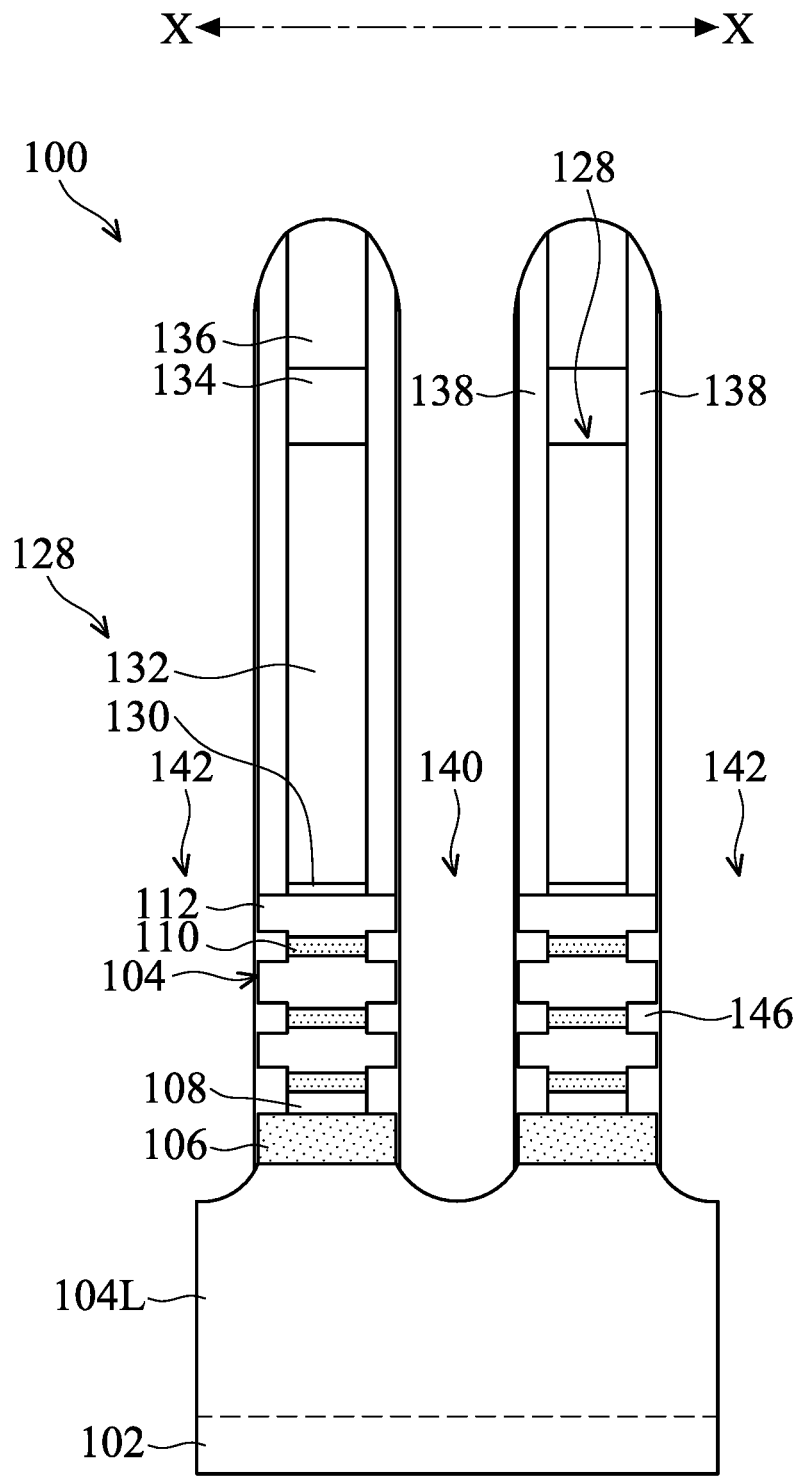
Figures 2, 2F:
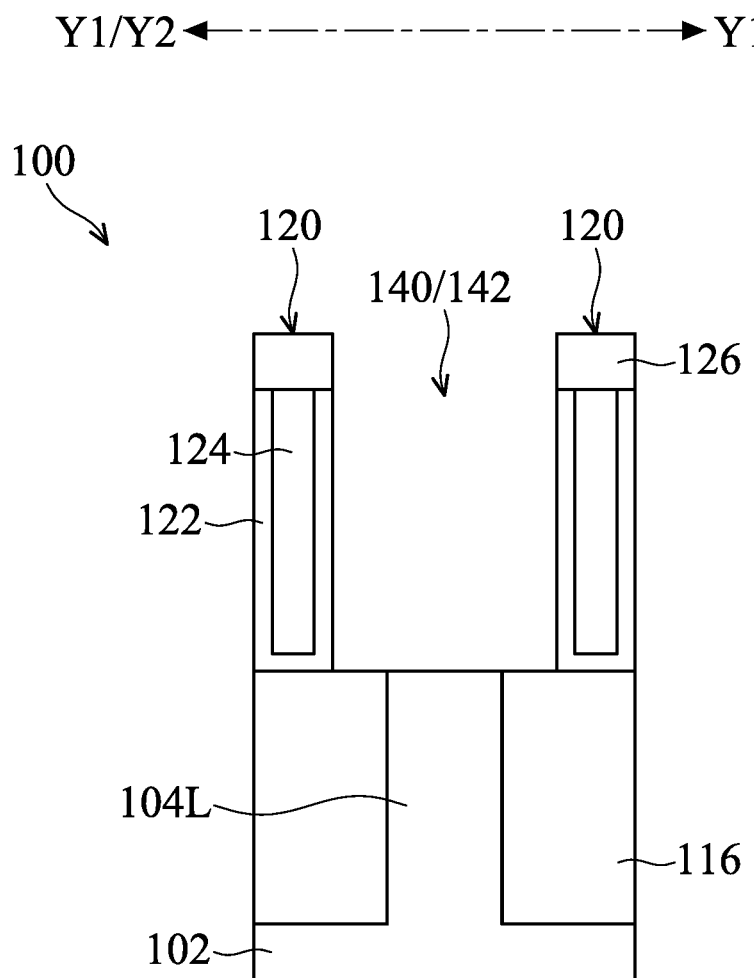
Figures 1, 2G:
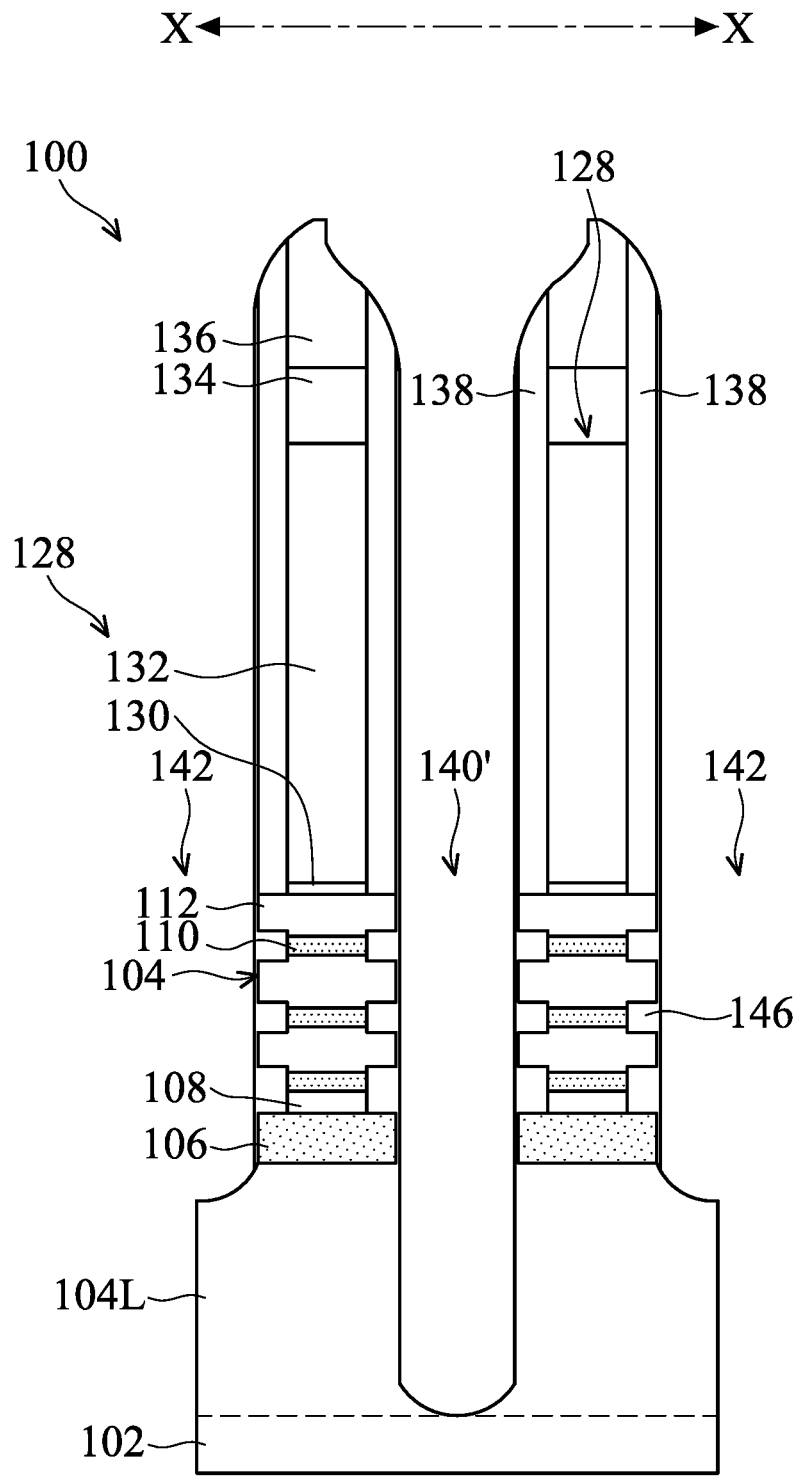
Figures 2, 2G:
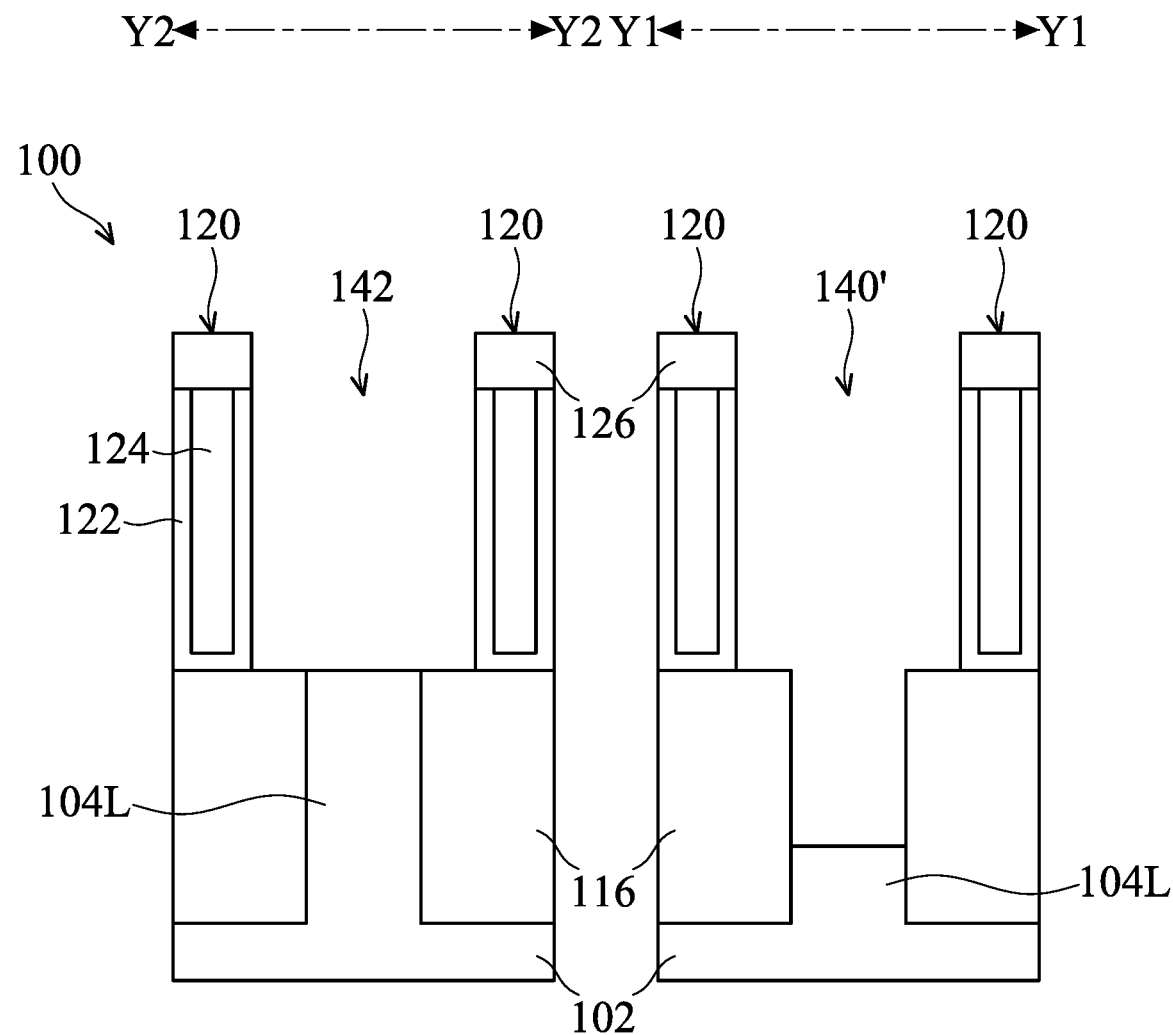
Figures 1, 2H:
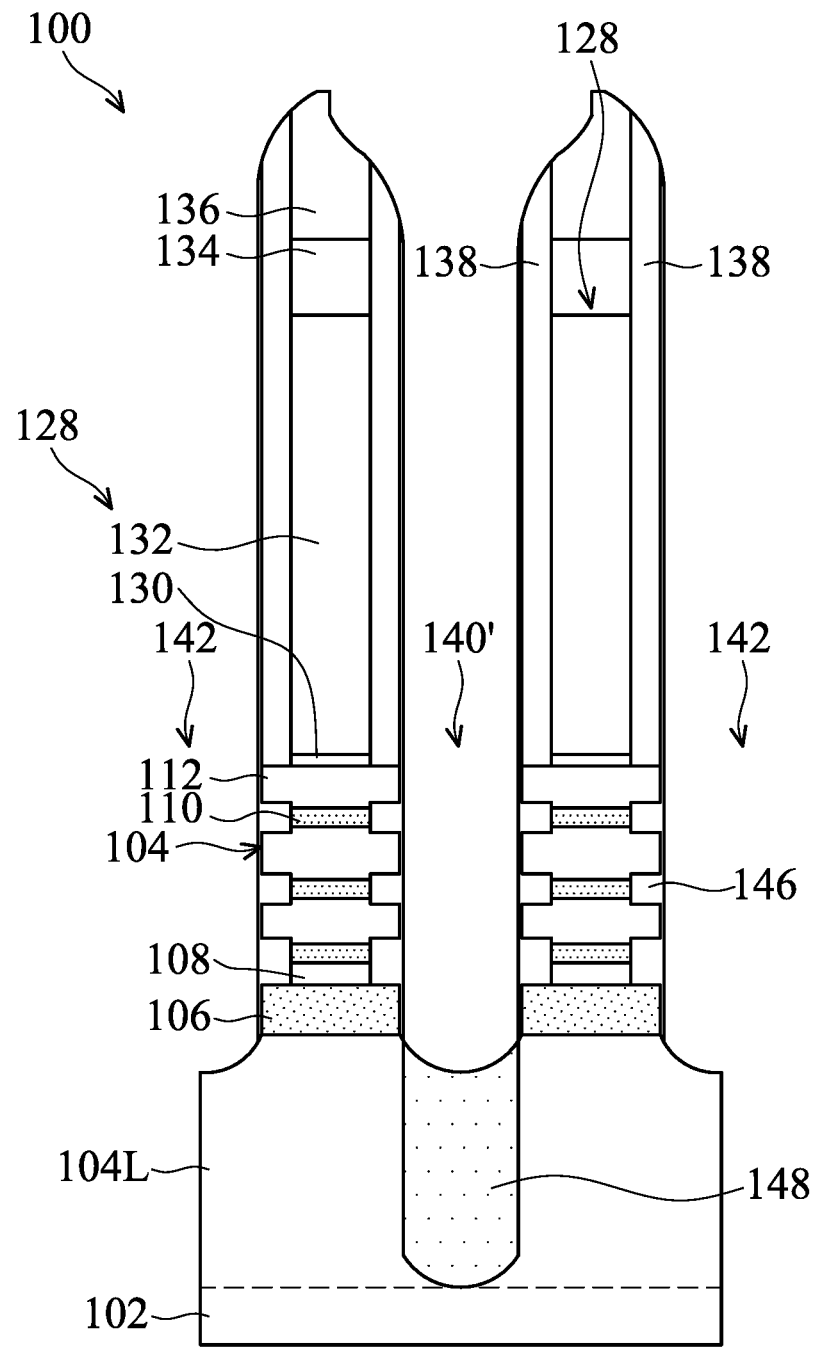
Figures 2, 2H:
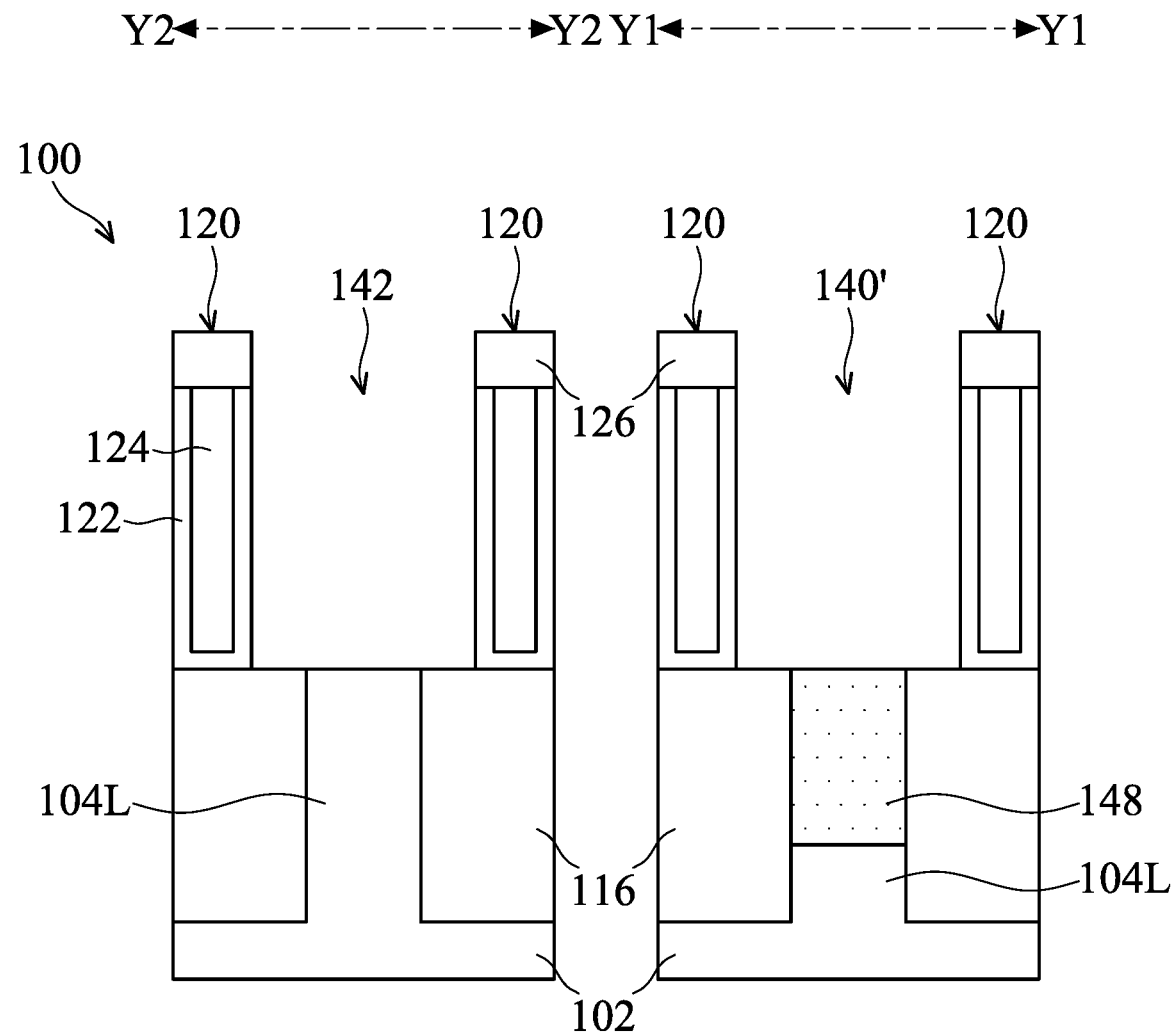
Figures 1, 2I:
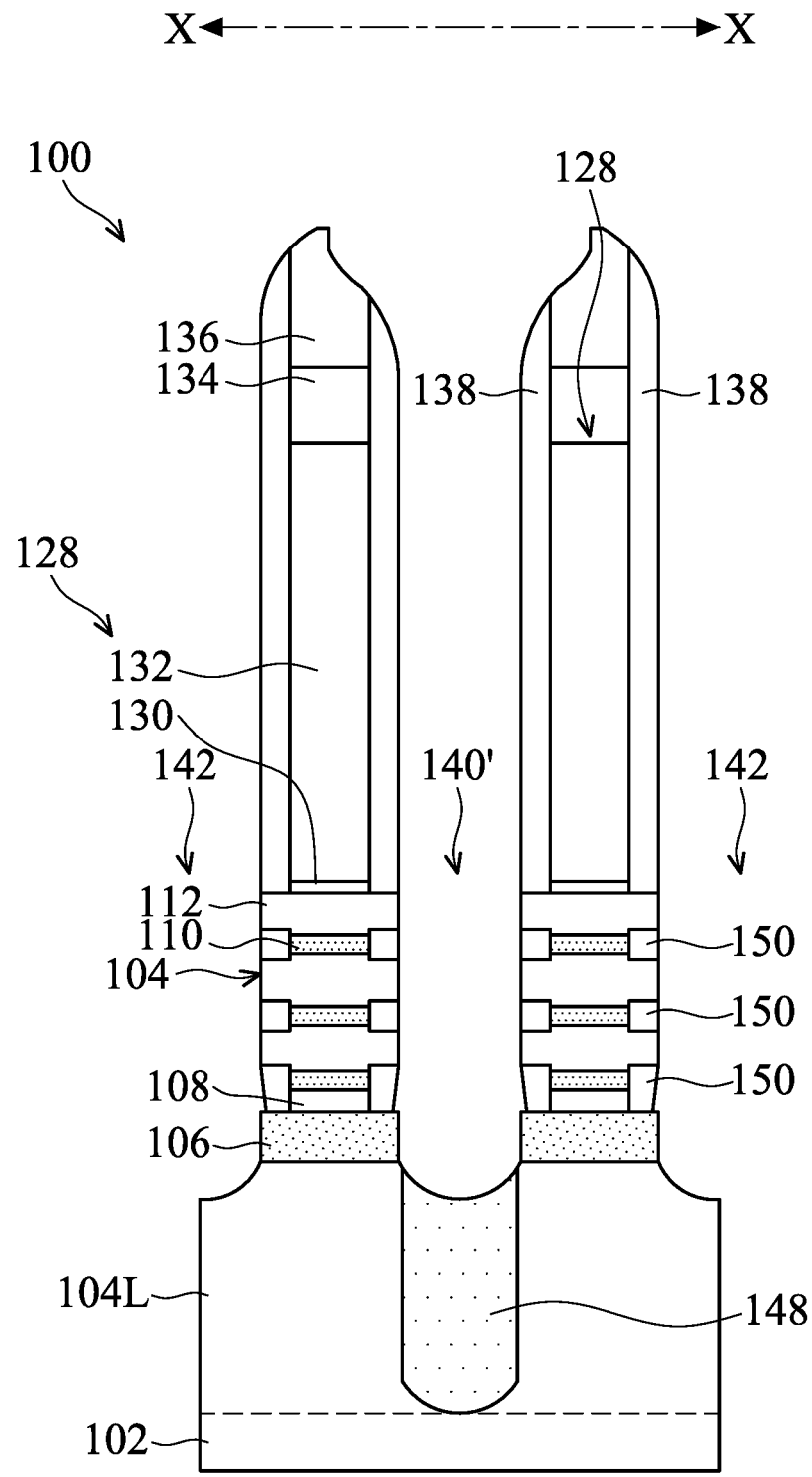
Figures 2, 2I:
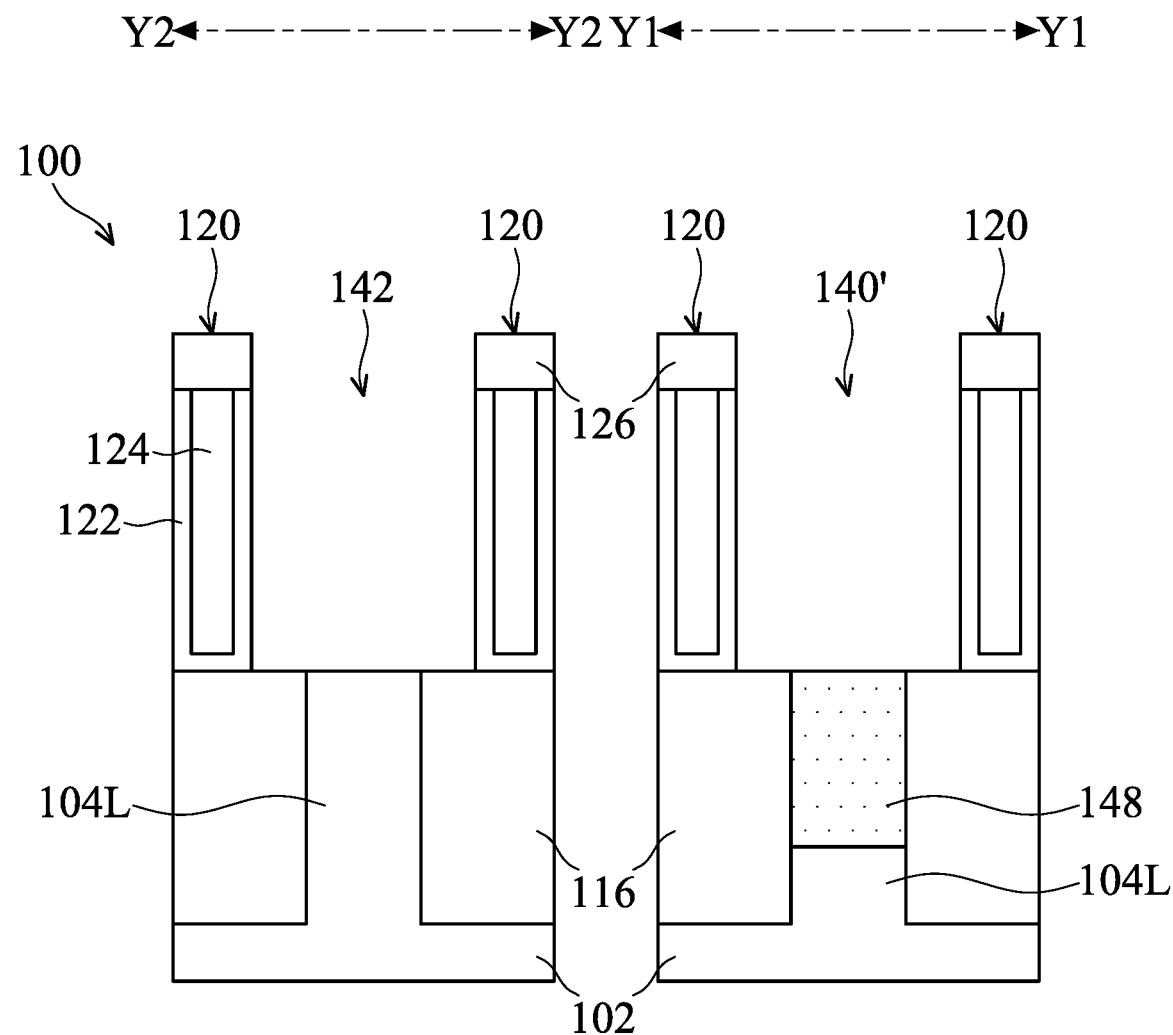
Figures 1, 2J:
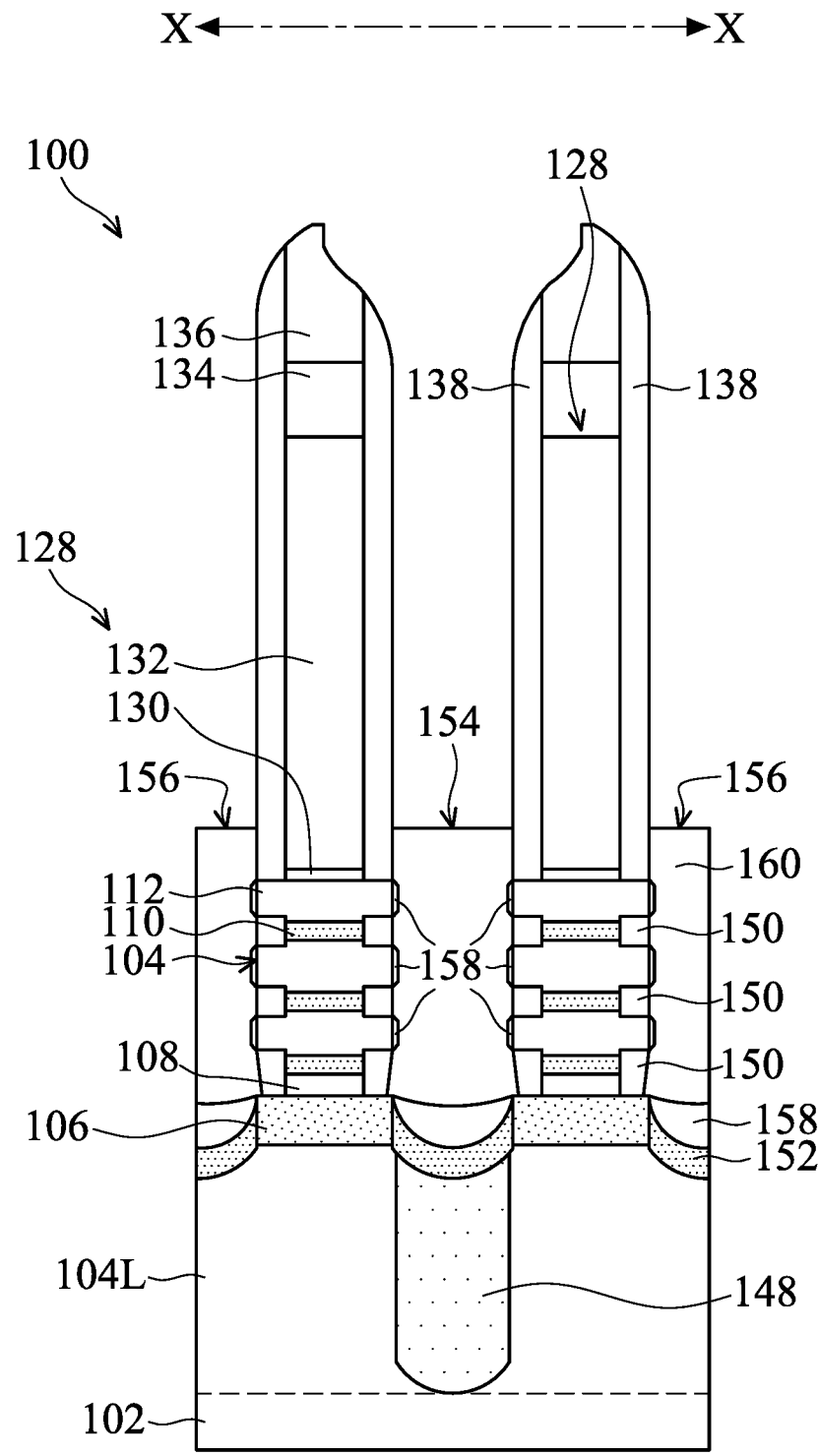
Figures 2, 2J:
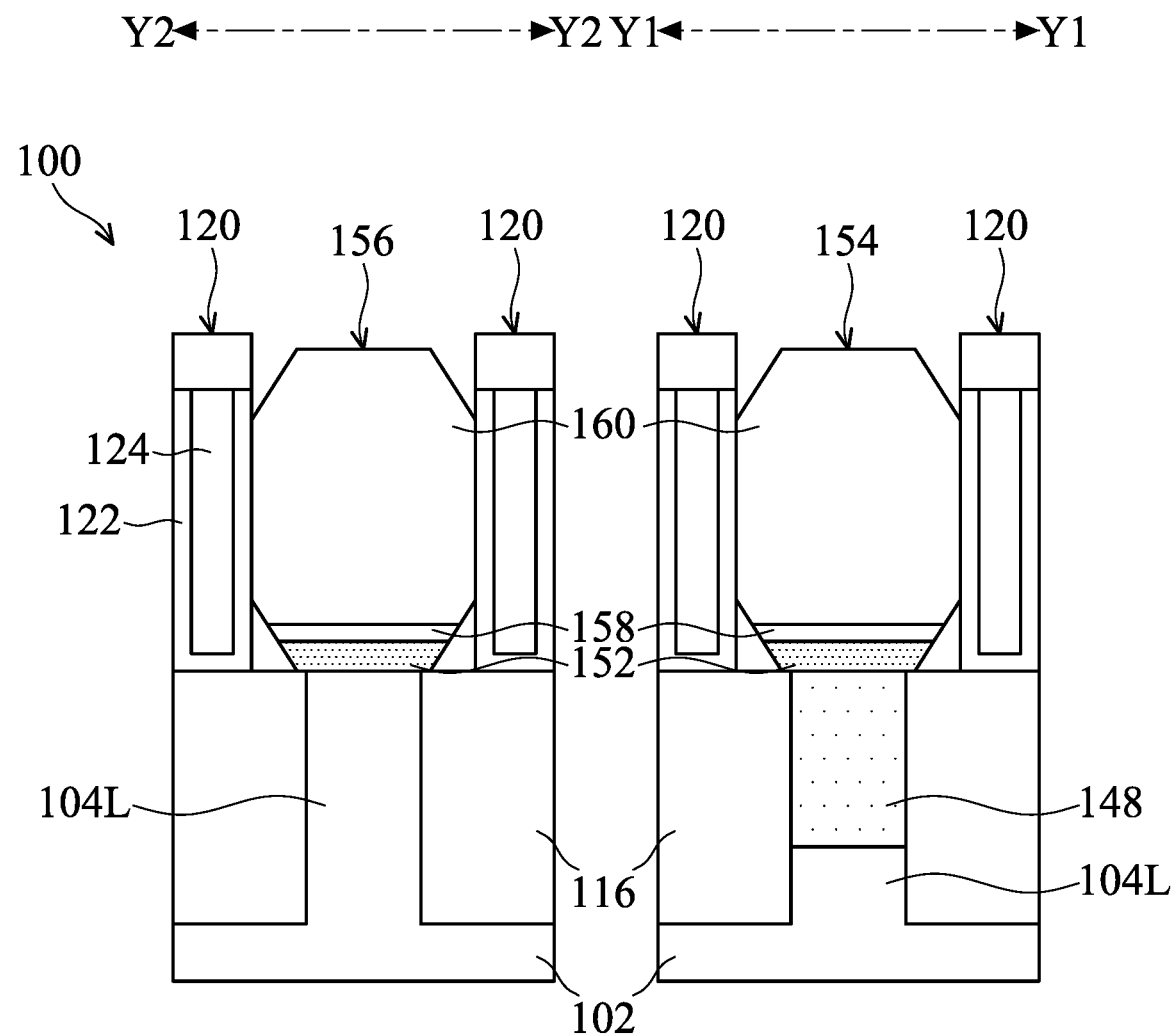
Figures 1, 2K:
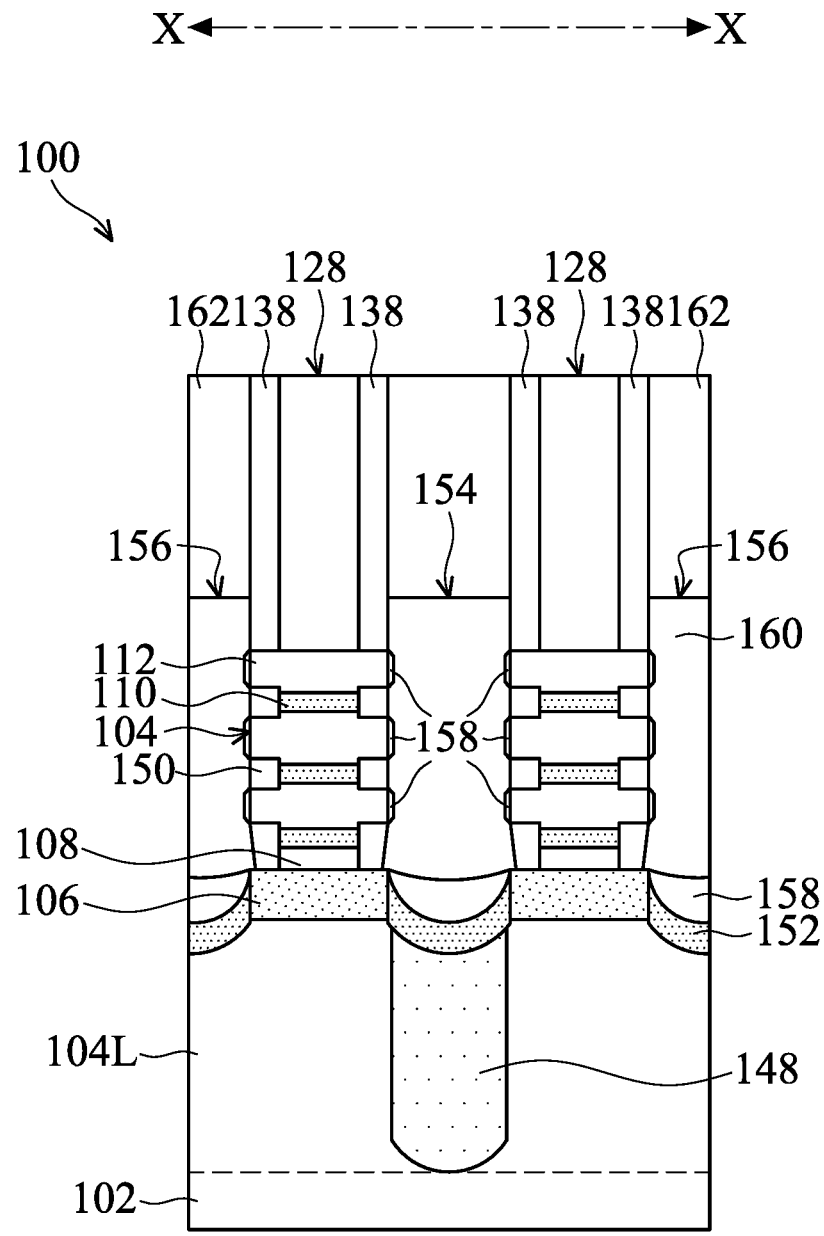
Figures 2, 2K:
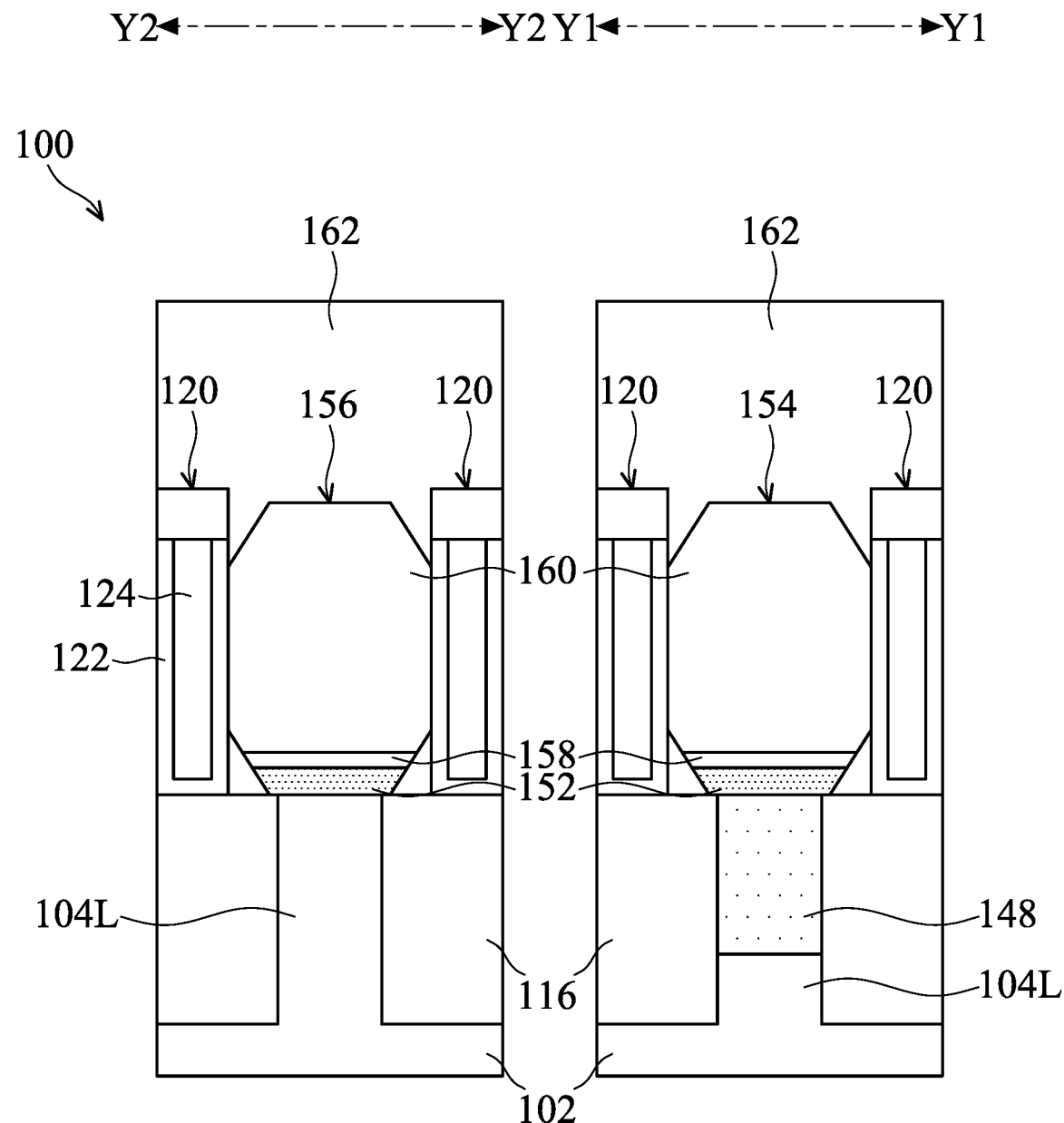
Figures 1, 2L:
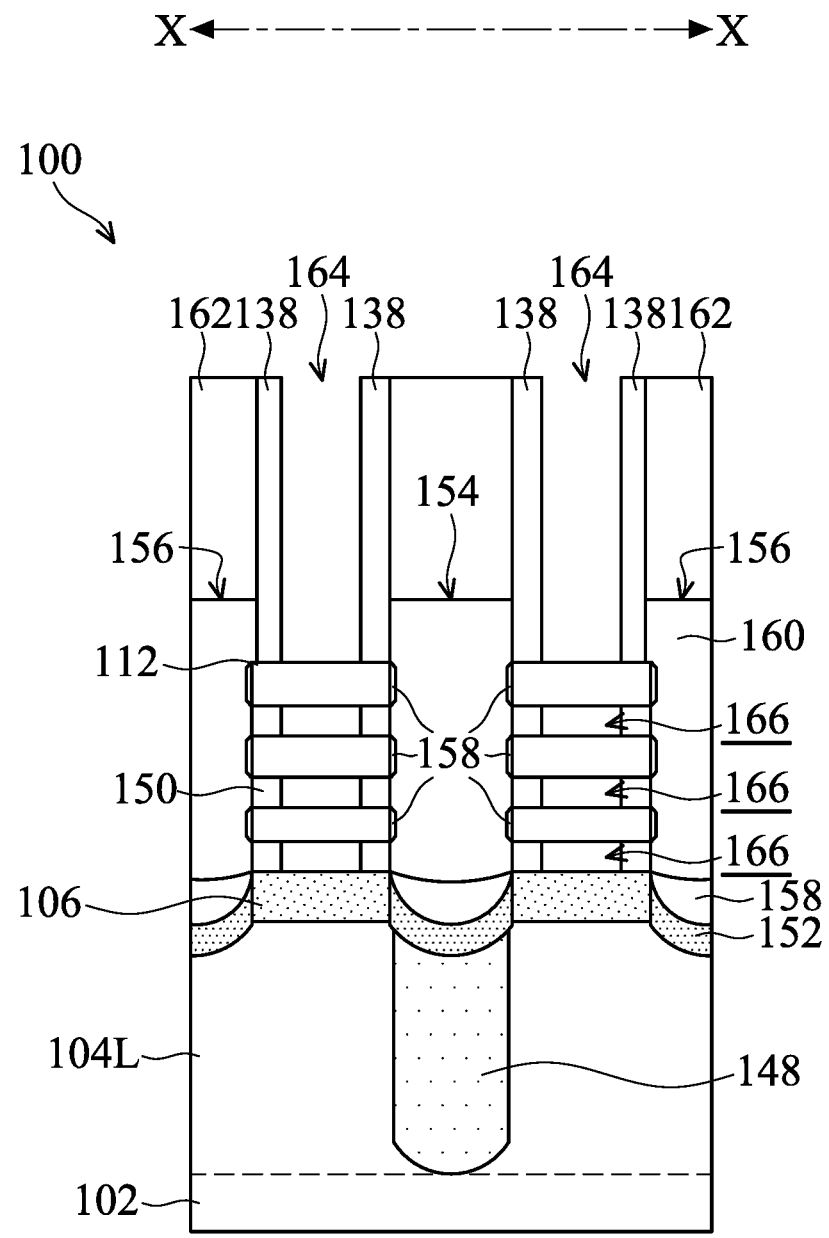
Figures 2, 2L:
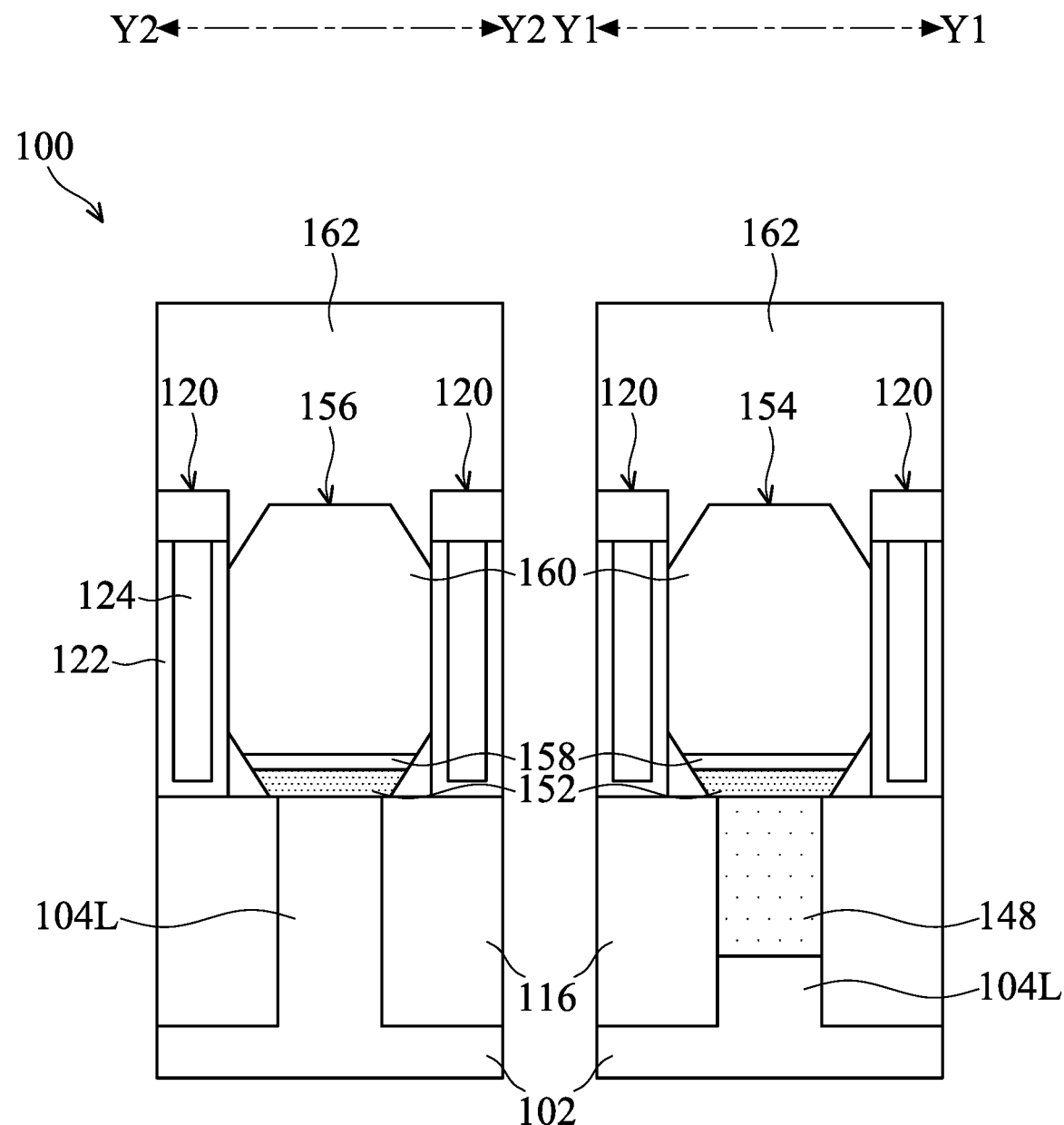
Figures 1, 2M:
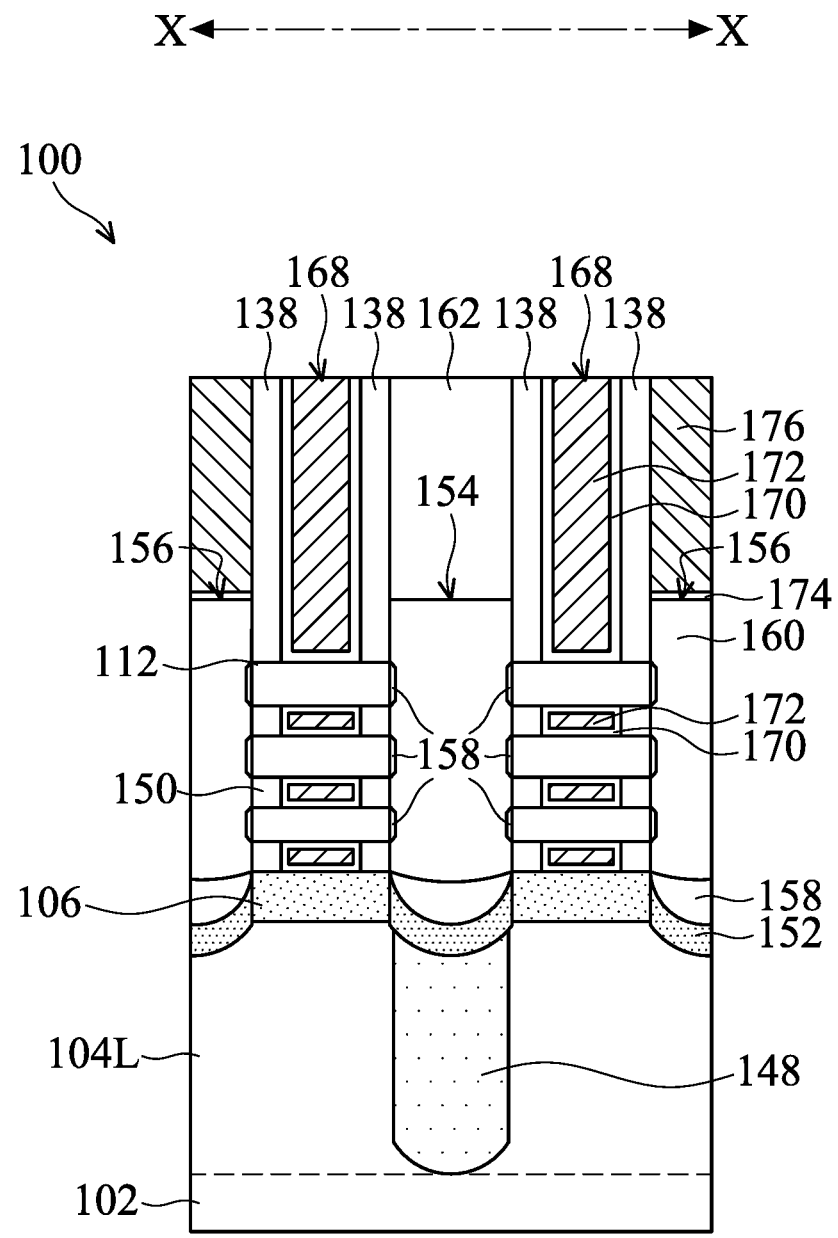
Figures 2, 2M:
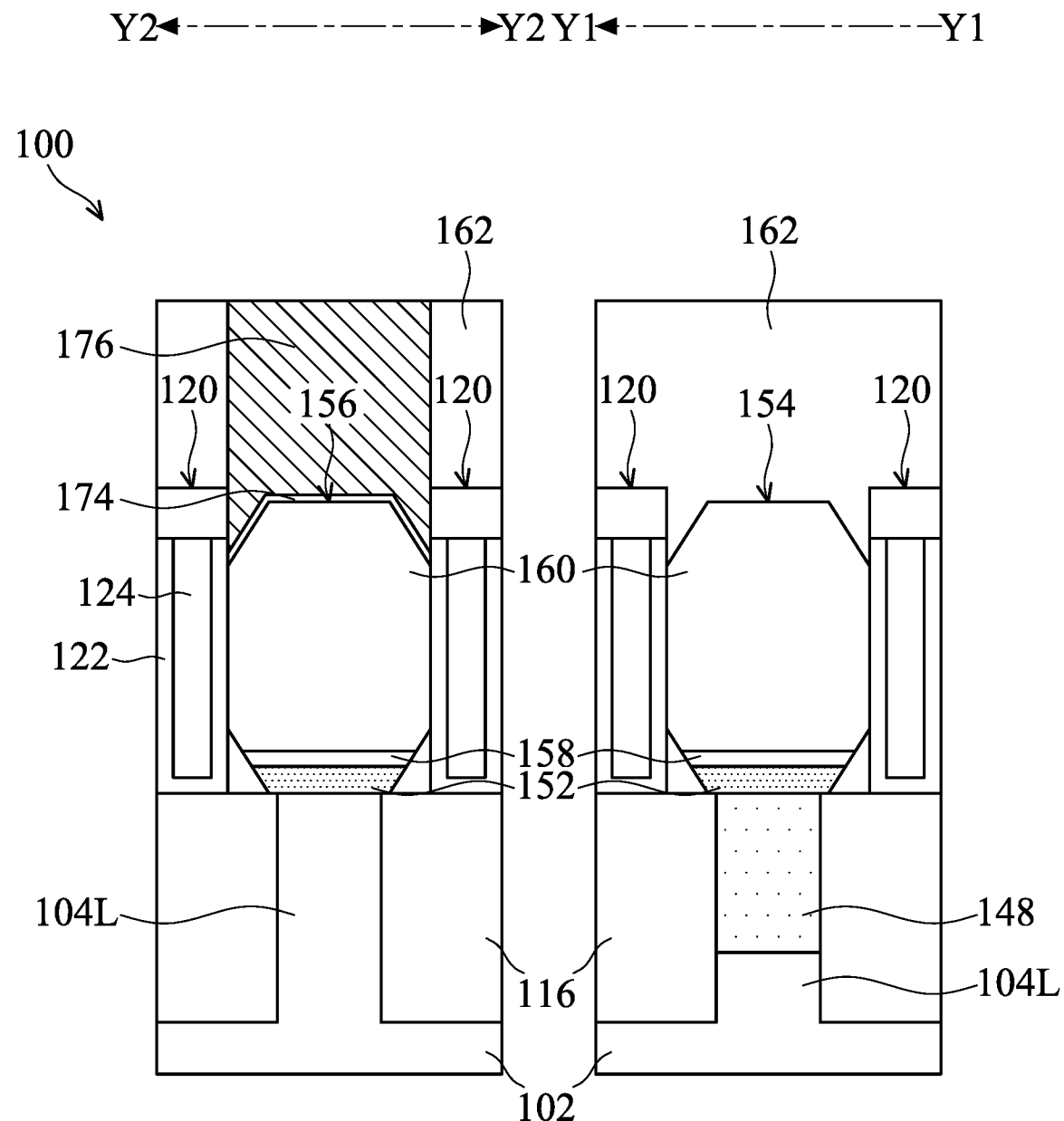

FIGS. 2A-1 through 2V-2 are cross-sectional views illustrating the formation of a semiconductor structure at various intermediate stages, in which FIGS. 2A-1 through 2M-1. FIGS. 2N-2U and FIG. 2V-1 are cross-sectional views corresponding to line X-X shown in FIG. 1 and FIGS. 2A-2 through 2M-2 and FIG. 2V-2 are cross-sectional views corresponding to line(s) Y1-Y1 and/or Y2-Y2 shown in FIG. 1, in accordance with some embodiments.

FIGS. 2A-1 and 2A-2 are cross-sectional views of a semiconductor structure 100 after the formation of fin structures 104 and an isolation structure 116, in accordance with some embodiments.

A semiconductor structure 100 including a substrate 102 and a fin structure 104 is received or provided, as shown in FIGS. 2A-1 and 2A-2, in accordance with some embodiments. In some embodiments, the frontside (of the substrate 102) of the semiconductor structure 100 faces upwardly and the backside (of the substrate 102) of the semiconductor structure 100 faces downwardly.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the fin structure 104 includes forming an epitaxial stack over the substrate 102 using an epitaxial growth process, in accordance with some embodiments. The epitaxial stack includes in order, a first protection layer 106, a second protection layer 108, and alternating first semiconductor layers 110 and second semiconductor layers 112, in accordance with some embodiments. The epitaxial growth process may be molecular beam epitaxy (MBE), metal organic chemical vapor deposition (MOCVD), or vapor phase epitaxy (VPE), or another suitable technique In some embodiments, the first protection layer 106 is made of semiconductor material with a different etching selectivity than the substrate 102 and the second protection layer 108. The protection layers 106 and 108 are configured to protect subsequently formed source/drain feature from being damaged during a subsequent substrate removal process.

In some embodiments, the first protection layer 106 and the first semiconductor layers 110 are made of a first semiconductor material. In some embodiments, the first semiconductor material for the first protection layer 106 and the first semiconductor layers 110 is silicon germanium (SiGe). In some embodiments, germanium concentration in the first protection layer 106 is lower than germanium concentration in the first semiconductor layers 110. For example, the percentage of germanium in the first protection layer 106 may be in a range from about 10 atomic % to about 25 atomic %. The percentage of germanium in the first semiconductor layer 110 may be in a range from about 30 atomic % to about 45 atomic %.

In some embodiments, the second protection layer 108 and the second semiconductor layers 112 are made of a second semiconductor material. The second semiconductor material may have a different lattice constant than the first semiconductor material. In some embodiments, the first semiconductor material has a different oxidation rate and/or etching selectivity than the second semiconductor material. In some embodiments, the second semiconductor material for the second protection layer 108 and the second semiconductor layers 112 is silicon (Si).

As explained in detail below, the first semiconductor layers 110 will be removed, and the second semiconductor layers 112 form nanostructures (e.g., nanowire or nanosheet structures) that laterally extend between source/drain features and serve as the channel layers for the resulting semiconductor device such as gate-all-around transistors, in accordance with some embodiments. As the term is used herein, "nanostructures" refers to semiconductor layers that have cylindrical shape, bar shaped and/or sheet shape. Gate stack (not shown) will be formed across and wrap around the nanostructures and interpose source/drain features, in accordance with some embodiments.

In some embodiments, the thickness of the first protection layer 106 is in a range from about 5 nm to about 8 nm. In some embodiments, the thickness of the second protection layer 108 is in a range from about 3 nm to about 4 nm. In some embodiments, the first protection layer 106 is thicker than the second protection layer 108.

In some embodiments, the thickness of each of the first semiconductor layers 110 is in a range from about 5 nm to about 20 nm. In some embodiments, the thickness of each of the second semiconductor layers 112 is in a range from about 5 nm to about 20 nm. In some embodiments, the second semiconductor layers 112 are thicker than the second protection layer 108.

The epitaxial stack including the first protection layer 106, the second protection layer 108, and the first semiconductor layers 110 and the second semiconductor layers 112 are then patterned into the fin structure 104, in accordance with some embodiments. In some embodiments, the patterning process includes forming a patterned hard mask layer 114 over the epitaxial stack. The hard mask layer 114 may include a pad oxide layer (made of such as a silicon oxide) and a nitride layer (made of such as a silicon nitride) over the pad oxide layer.

An etching process is then performed to remove portions of the epitaxial stack and underlying substrate 102 uncovered by the patterned hard mask layer 114, thereby forming trenches and the fin structure 104 protruding from between the trenches, in accordance with some embodiments. The etching process may be an anisotropic etching process, e.g., dry plasma etching.

The portion of the substrate 102 protruding from between the trenches forms a lower fin element 104L of the fin structure 104, in accordance with some embodiments. A remainder of the epitaxial stack (including the first protection layer 106, the second protection layer 108, and the first semiconductor layers 110 and the second semiconductor layers 112) forms the upper fin element of the fin structure 104 over the lower fin element 104L, in accordance with some embodiments.

In some embodiments, the fin structure 104 extends in the X direction. That is, the fin structure 104 has a longitudinal axis parallel to the X direction, in accordance with some embodiments. FIG. 2A-2 shows one fin structure 104 for illustrative purpose and is not intended to be limiting. The number of the fin structure 104 may be dependent on the semiconductor device design demand and/or performance consideration.

An isolation structure 116 is formed to surround the lower fin element 104L of the fin structure 104, as shown in FIG. 2A-2, in accordance with some embodiments. The formation of the isolation structure 116 includes forming an insulating material to overfill the trenches, in accordance with some embodiments. The isolation structure 116 is configured to electrically isolate active regions (e.g., the fin structure 104) of the semiconductor structure 100 and is also referred to as shallow trench isolation (STI) feature, in accordance with some embodiments.

In some embodiments, the insulating material is made of silicon oxide, silicon nitride, silicon oxynitride (SiON), another suitable insulating material, multilayers thereof, and/or a combination thereof. In some embodiments, the insulating material is deposited using includes CVD (such as low-pressure CVD (LPCVD), plasma-enhanced CVD (PECVD), high density plasma CVD (HDP-CVD), high aspect ratio process (HARP), or flowable CVD (FCVD)), atomic layer deposition (ALD), another suitable technique, and/or a combination.

A planarization process is performed on the insulating material to remove a portion of the insulating material above the patterned hard mask layer 114 until the patterned hard mask layer 114 is exposed, in accordance with some embodiments. The planarization may be chemical mechanical polishing (CMP). The insulating material is then recessed by an etching process (such as dry plasma etching and/or wet chemical etching) until the upper fin element of the fin structure 104 is exposed, in accordance with some embodiments. The recessed insulating material forms the isolation structure 116.

FIGS. 2B-1 and 2B-2 are cross-sectional views of a semiconductor structure 100 after the formation of dielectric fin structures 120, in accordance with some embodiments. Dielectric fin structures 120 are formed over the isolation structure 116, as shown in FIG. 2B-2, in accordance with some embodiments. The fin structure 104 is located between and spaced apart from the dielectric fin structures 120, in accordance with some embodiments.

In some embodiments, the dielectric fin structures 120 extend in the X direction. That is, the dielectric fin structures 120 have longitudinal axes parallel to the X direction, in accordance with some embodiments. The dielectric fin structures 120 are configured to confine subsequently formed source/drain features, thereby reducing the parasitic capacitance of the resulting semiconductor device, in accordance with some embodiments.

The dielectric fin structures 120 include a conformal layer 122, a fill layer 124 nested within the conformal layer 122, and a capping layer over the conformal layer 122 and the fill layer 124. The formation of the dielectric fin structures 120 includes first forming sacrificial layers 118 on opposite sides of the fin structure 104, in accordance with some embodiments. The sacrificial layers 118 may be made of a semiconductor material with a different etching selectivity than the second semiconductor layer 112. For example, the sacrificial layers 118 are made of silicon germanium. The sacrificial layers 118 may be formed by depositing a semiconductor material for the sacrificial layers 118 and follower by an anisotropic etching process.

The conformal layer 122 is conformally formed along the semiconductor structure 100 and the fill layer 124 is then formed to fill the remainder of the trench between adjacent fin structures 104, in accordance with some embodiments. An etching back process is performed to recess the conformal layer 122 and the fill layer 124, thereby forming a recess, in accordance with some embodiments. The capping layer 126 is formed over the conformal layer 122 and the fill layer 124 to fill the recess, in accordance with some embodiments.

In some embodiments, the conformal layer 122 is made of a dielectric material with a dielectric constant less than about 7, such as SiN SiCN, SiOC, SiOCN, or a combination thereof. In some embodiments, the fill layer 124 is made of a dielectric material such as silicon oxide. In some embodiments, the capping layer 126 is made of a dielectric material with a dielectric constant less than about 7, such as $Al_2O_3$, $HfO_2$, $ZrO_2$, HfAlO, HfSiO, or a combination thereof, or a combination thereof.

After the dielectric fin structures 120 is formed, the patterned hard mask layer 114 and the portions of sacrificial layers 118 over the upper surface of the fin structure 104 are removed using an etching process, in accordance with some embodiments.

FIGS. 2C-1 and 2C-2 are cross-sectional views of a semiconductor structure 100 after the formation of dummy gate structures 128 and gate spacer layers 138, in accordance with some embodiments.

Dummy gate structures 128 are formed over the semiconductor structure 100, as shown in FIG. 2C-1, in accordance with some embodiments. The dummy gate structures 128 extend across and wrap the channel regions of the fin structure 104, in accordance with some embodiments. In some embodiments, the dummy gate structures 128 extend in Y direction. That is, the dummy gate structures 128 have a longitudinal axis parallel to Y direction, in accordance with some embodiments.

The dummy gate structure 128 includes a dummy gate dielectric layer 130 and a dummy gate electrode layer 132 formed over the dummy gate dielectric layer 130, as shown in FIGS. 2C-1, in accordance with some embodiments. In some embodiments, the dummy gate dielectric layer 130 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is deposited using ALD, CVD, thermal oxidation, physical vapor deposition (PVD), another suitable technique, and/or a combination thereof.

In some embodiments, the dummy gate electrode layer 132 is made of a conductive material such as a semiconductor material such as polysilicon, poly-silicon germanium, and/or a combination thereof. In some embodiments, the dummy gate electrode layer 132 is deposited using CVD, another suitable technique, and/or a combination thereof.

In some embodiments, the formation of the dummy gate structure 128 includes conformally depositing a dielectric material for the dummy gate dielectric layer 130 over the semiconductor structure 100, depositing a conductive material for the dummy gate electrode layer 132 over the dielectric material, planarizing the conductive material, and patterning the conductive material and dielectric material into the dummy gate structures 128.

The patterning process includes forming a patterned hard mask layer including a nitride layer 134 (e.g., silicon nitride) and an oxide layer 136 (e.g., silicon oxide) over the conductive material to cover the channel region of the fin structure 104, in accordance with some embodiments. The conductive material and dielectric material, uncovered by the patterned hard mask layer, are etched away to expose the source/drain regions of the fin structure 104, in accordance with some embodiments.

Gate spacer layers 138 are formed along and cover opposite sidewalls of the dummy gate structures 128, as shown in FIG. 2C-1, in accordance with some embodiments. The gate spacer layers 138 are configured to offset the subsequently formed source/drain features and separate the source/drain features from the gate structure.

In some embodiments, the gate spacer layers 138 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 138 includes conformally depositing a dielectric material for the gate spacer layers 138 over the semiconductor structure 100 followed by an anisotropic etching process such as dry plasma etching. In some embodiments, the etching process is performed to remove horizontal portions of the dielectric material, while leaving vertical portions of the dielectric material on sidewalls of the dummy gate structure 126 to act as the gate spacer layers 138.

FIGS. 2D-1 and 2D-2 are cross-sectional views of a semiconductor structure 100 after the formation of source/drain recesses 140 and 142, in accordance with some embodiments.

The source/drain regions of the fin structure 104 are recessed, thereby forming a first source/drain recess 140 (e.g., in the first source/drain region SD1 shown in FIG. 1) and a second source/drain recess 142 (e.g., in the second source/drain region SD2 shown in FIG. 1), as shown in FIGS. 2D-1 and 2D-2, in accordance with some embodiments. In some embodiments, the first source/drain recess 140 and the second source/drain recess 142 are formed on the opposite sides of the dummy gate structure 128.

The source/drain recesses 140 and 142 pass through the upper fin element of the fin structure 104, in accordance with some embodiments. In specific, the source/drain recesses 140 and 142 pass through the alternating first and second semiconductor layer 110 and 112, then through the second protection layer 108, and then the first protection layer 106, in accordance with some embodiments. The etching process may be anisotropic etching process, e.g., dry plasma etching, and uses the dummy gate structures 128 along with the gate spacer layers 138 as etching masks. In addition, the sacrificial layers 118 are also removed in the etching process.

FIGS. 2E-1 and 2E-2 are cross-sectional views of a semiconductor structure 100 after the formation of notches 144, in accordance with some embodiments.

An etching process is performed on the semiconductor structure 100 to laterally recess, from the source/drain recesses 140 and 142, the upper fin element of the fin structure 104, in accordance with some embodiments. In some embodiments, in the etching process, the first semiconductor layers 110 have a greater etching rate (or etching amount) than the second semiconductor layers 112, thereby forming notches 144 between adjacent second semiconductor layers 112, as shown in FIG. 2E-1.

In some embodiments, the first protection layer 106 contains a lower germanium concentration than the first semiconductor layers 110, and thus the first protection layer 106 is not recessed or slightly recessed. As such, a notch 144 is also formed between the bottommost second semiconductor layer 112 and the first protection layer 106, in accordance with some embodiments. In some embodiments, the second protection layer 108 is thin, and thus the second protection layer 108 is also laterally recessed. In some embodiments, the etching process is an isotropic etching such as dry chemical etching, remote plasma etching, wet chemical etching, another suitable technique, and/or a combination thereof.

FIGS. 2F-1 and 2F-2 are cross-sectional views of a semiconductor structure 100 after the formation of a dielectric material 146, in accordance with some embodiments.

A dielectric material 146 is conformally formed over the semiconductor structure 100 and overfills the notches 144, as shown in FIG. 2F-1, in accordance with some embodiments. In some embodiments, the dielectric material 146 are made of a dielectric material, such as silicon oxycarbide (SiOC), silicon oxide carbonitride (SiOCN), silicon carbon nitride (SiCN), and/or a combination thereof, in accordance with some embodiments. In some embodiments, the deposition process includes ALD, CVD (such as PECVD or LPCVD), another suitable technique, and/or a combination thereof.

A pull-back process is performed on the dielectric material 146 such that portions of the dielectric material 146 formed on exposed surface of the lower fin element 104 are removed, in accordance with some embodiments. The pull-back process may be an anisotropic etching process such as dry plasma etching. After the etching back process, the dielectric material 146 still fill the notches 144 and covers the sidewalls of the upper fin element (including the protection layers 106 and 108 and the semiconductor layers 110 and 112), as shown in FIG. 2F-1, in accordance with some embodiments.

FIGS. 2G-1 and 2G-2 are cross-sectional views of a semiconductor structure 100 after the enlargement of the first source/drain recess 140, in accordance with some embodiments.

An etching process is performed on the semiconductor structure 100 to vertically enlarge the first source/drain recess 140, in accordance with some embodiments. Before the etching process, a mask element (not shown) may be formed to cover the second source/drain recess 142 and expose the first source/drain recess 140. The etching process extends the first source/drain recess 140 into the lower fin element 104L (between the isolation structure 116), in accordance with some embodiments. The enlarged first source/drain recess 140 is denoted as a first source/drain recess 140'. In some embodiments, the etching process includes a plasma dry etching, dry chemical etching, and/or wet etching.

FIGS. 2H-1 and 2H-2 are cross-sectional views of a semiconductor structure 100 after the formation of a sacrificial contact 148, in accordance with some embodiments.

A sacrificial contact 148 is formed in the source/drain recess 140' to fill a lower portion of the source/drain recess 140' using epitaxial growth processes, as shown in FIGS. 2H-1 and 2H-2, in accordance with some embodiments. The epitaxial growth process may be MBE. MOCVD, or VPE, another suitable technique, or a combination thereof. In some embodiments, the height of the sacrificial contact 148 is in a range from about 30 nm to about 50 nm.

In some embodiments, the sacrificial contact 148 is formed to have an upper surface substantially level with the bottom surface of the second source/drain recess 142. In some embodiments, the sacrificial contact 148 does not protrude above the bottom surface of the first protection layer 106, in accordance with some embodiments. In some embodiments, a distance between the sacrificial contact 148 and the bottommost first semiconductor layer 112 is in a range from about 15 nm to about 50 nm. If the sacrificial contact 148 is too close to the bottommost first semiconductor layer 112, the parasitic capacitance of the resulting semiconductor device may increase.

In some embodiments, the sacrificial contact 148 is made of a semiconductor material with a different etching electivity than the substrate 102. For example, the sacrificial contact 148 is made of silicon germanium. In some embodiments, the sacrificial contact 148 is grown on the exposed semiconductor surface of the lower fin element 104L of the fin structure 104, in accordance with some embodiments. The dielectric material 146 may prevent the semiconductor material of the sacrificial contact 148 grown on the upper fin element of the fin structure 104. In some embodiments, the sacrificial contact 148 is formed to have a concave upper surface. After the sacrificial contact 148 is formed, the mask element (not shown) covering the second source/drain recess 142 may be removed.

FIGS. 2I-1 and 2I-2 are cross-sectional views of a semiconductor structure 100 after the formation of inner spacer layers 150, in accordance with some embodiments.

A pull-back process is performed on the dielectric material 146 such that portions of the dielectric material 146 formed the sidewalls of the second semiconductor layers 112 and the first protection layer 106 are removed, as shown in FIG. 2I-1, in accordance with some embodiments. The first protection layer 106 and the second semiconductor layers 112 are exposed from the source/drain recesses 140' and 142, in accordance with some embodiments. In some embodiments, the pull-back process includes an isotropic etching process such as dry chemical etching and/or wet etching.

After the etching process, the dielectric material 146 forms a plurality of inner spacer layers 150, as shown in FIG. 2I-1. The inner spacer layers 150 interpose subsequently formed source/drain features and gate stacks and are configured to reduce the parasitic capacitance between the metal gate stack and the source/drain features (i.e. Cgs and Cgd) and configured as an etching stop layer in a subsequently channel releasing process, in accordance with some embodiments.

FIGS. 2J-1 and 2J-2 are cross-sectional views of a semiconductor structure 100 after the formation of etching stop layers 152 and source/drain features 154 and 156, in accordance with some embodiments.

Etching stop layers 152 are formed over the sacrificial contact 148 in the first source/drain recess 140' and over the lower fin element 104L in the second source/drain recess 142 using an epitaxial growth process, as shown in FIGS. 2J-1 and 2J-2, in accordance with some embodiments. The epitaxial growth process may be MBE, MOCVD, or VPE, another suitable technique, or a combination thereof.

The etching stop layers 152 are configured to protect subsequently formed source/drain feature from being damaged during a subsequent substrate removal process. In some embodiments, the etching stop layers 152 are made of a semiconductor material with a different etching electivity than the substrate 102. For example, the etching stop layers 152 are made of silicon germanium. In some embodiments, the etching stop layers 152 are grown from the exposed semiconductor surfaces of the sacrificial contact 148 and the lower fin elements 104L.

The semiconductor material of the etching stop layers 152 may be also grown on the exposed semiconductor surfaces of the second semiconductor layers 112 of the fin structure 104. An etching back process may be then performed to remove the semiconductor material of the etching stop layers 152 grown on the second semiconductor layers 112, thereby exposing the second semiconductor layers 112 again. In some embodiments, the etching stop layers 152 is formed to have a convex bottom surface interfaced and mated with the concave upper surface of the sacrificial contact 148 and a concave upper surface.

A first source/drain feature 154 is formed over the etching stop layers 152 in the first source/drain recess 140' (e.g., in the first source/drain region SD1 as shown in FIG. 1) and a second source/drain feature 156 is formed over the etching stop layers 152 in the second source/drain recess 142 (e.g., in the second source/drain region SD2 as shown in FIG. 1), as shown in FIGS. 2J-1 and 2J-2, in accordance with some embodiments. The source/drain features 154 and 156 are formed on opposite sides of the dummy gate structure 128, in accordance with some embodiments. In some embodiments, the first source/drain features 154 is configured as the source terminal of a transistor and the second source/drain features 156 is configured as the drain terminal of the transistor.

The source/drain features 154 and 156 each include a buffer layer 158 and a bulk layer 160 formed over the buffer layer 158, in accordance with some embodiments. The buffer layers 158 are selectively grown on the semiconductor surfaces provided by the second semiconductor layers 112 of the fin structure 104 and the protection layer 152 using one or more epitaxial growth processes. In some embodiments, the buffer layer 158 is formed to have a convex bottom surface interfaced and mated with the concave upper surface of the etching stop layer 152 and a concave upper surface. The epitaxial growth processes may be MBE, MOCVD, or VPE, another suitable technique, or a combination thereof.

The bulk layers 160 are then grown on the buffer layers 158 and fill the source/drain recesses 140' and 142 using one or more epitaxial growth processes, in accordance with some embodiments. In some embodiments, the bulk layer 158 is formed to have a convex bottom surface interfaced and mated with the concave upper surface of the buffer layer 148. The epitaxial growth processes may be MBE, MOCVD, or VPE, another suitable technique, or a combination thereof.

In some embodiments, the growth of the source/drain features 142 are confined by the dielectric fin structures 120, as shown in FIG. 2J-2. The source/drain features 154 and 156 are formed to have surfaces that conform to and are interfaced with sidewalls of the conformal layer 122 of the dielectric fin structures 120, in accordance with some embodiments. The lateral growth of the source/drain feature 154 and 156 are confined by dielectric fin structures 120, which may reduce the parasitic capacitance of the resulting semiconductor device.

In some embodiments, the source/drain features 154 and 156 are made of any suitable semiconductor material for n-type semiconductor devices or p-type semiconductor devices. In some embodiments wherein the fin structure 104 is to be formed as an N-type GAA FET, the source/drain features 154 and 156 are made of semiconductor material such as SiP, SiAs, SiCP, SiC, Si, GaAs, another suitable semiconductor material, or a combination thereof. In some embodiments, the source/drain features 154 and 156 are doped with the n-type dopant during the epitaxial growth process. For example, the n-type dopant may be phosphorous (P) or arsenic (As). For example, the source/drain features 154 and 156 may be the epitaxially grown Si doped with phosphorous to form silicon:phosphor (Si:P) source/drain features and/or arsenic to form silicon:arsenic (Si:As) source/drain feature.

In some embodiments wherein the fin structure 104 is to be formed as a P-type GAA FET, the source/drain features 154 and 156 are made of semiconductor material such as SiGe. Si, GaAs, another suitable semiconductor material, or a combination thereof. In some embodiments, the source/drain features 154 and 156 are doped with the p-type dopant during the epitaxial growth process. For example, the p-type dopant may be boron (B) or $BF_2$. For example, the source/drain features 154 and 156 may be the epitaxially grown SiGe doped with boron (B) to form silicon germanium:boron (SiGe:B) source/drain feature.

In some embodiments, the dopant in the buffer layer 158 of the source/drain features 154 and 156 has a concentration in a range from about $1 \times 10^{19}$ cm$^{-3}$ to about $3 \times 10^{21}$ cm$^{-3}$. In some embodiments, the dopant in the bulk layer 160 of the source/drain features 154 and 156 has a concentration in a range from about $1 \cdot 10^{19}$ cm$^{-3}$ to about $9 \times 10^{21}$ cm$^{-3}$. In some embodiments, the buffer layer 158 is doped with the same conductivity-type dopant as that doped in the bulk layer 160. In some embodiments, the dopant concentration in the bulk layer 160 is greater than the dopant concentration in the buffer layer 158.

FIGS. 2K-1 and 2K-2 are cross-sectional views of a semiconductor structure 100 after the formation of an interlayer dielectric (ILD) layer 162, in accordance with some embodiments.

An interlayer dielectric layer 162 is formed over the semiconductor structure 100, as shown in FIGS. 2K-1 and 2K-2, in accordance with some embodiments. The interlayer dielectric layer 162 fills the space between dummy gate structures 128 and covers the source/drain features 154 and 156 and the dielectric fin structure 120, in accordance with some embodiments.

In some embodiments, the interlayer dielectric layer 162 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 162 is a multilayer structure including a nitride liner as a contact etching stop layer (CESL) and an oxide bulk layer over the nitride liner. In some embodiments, a dielectric material for the interlayer dielectric layer 162 is deposited using such as (such as LPCVD, PECVD, HDP-CVD, HARP, or FCVD), ALD, another suitable technique, and/or a combination.

Afterward, the dielectric material for the interlayer dielectric layer 162 above the dummy gate electrode layers 132 is removed using such as CMP until the dummy gate electrode layers 132 are exposed. In some embodiments, the patterned hard mask layer including the nitride layer 134 and the oxide layer 136 is also removed. In some embodiments, the upper surface of the interlayer dielectric layer 162 is substantially coplanar with the upper surfaces of the dummy gate electrode layers 132.

FIGS. 2L-1 and 2L-2 are cross-sectional views of a semiconductor structure 100 after the removal of the dummy gate structures 128 and the first semiconductor layers 110 of the fin structure 104, in accordance with some embodiments.

A channel releasing process is performed on the semiconductor structure 100, in accordance with some embodiments. The dummy gate structures 128 are first removed using an etching process to form gate trenches 164, as shown in FIG. 2L-1, in accordance with some embodiments. The gate trenches 164 expose the channel regions of the fin structure 104, in accordance with some embodiments. In some embodiments, the gate trenches 164 expose the inner sidewalls of the gate spacer layers 138 facing the channel regions, in accordance with some embodiments.

The channel releasing process also includes removing the first semiconductor layers 110 of the fin structure 104 using an etching process, thereby forming gaps 166, as shown in FIG. 2L-1, in accordance with some embodiments. The inner spacer 150 may be used as etching stop layers during the etching process, thereby protecting source/drain features 154 and 156 from being damaged. Because the second protection layer 108 is thin, the second protection layer 108 is also removed during the etching process. The gaps 166 are formed between the neighboring second semiconductor layers 112 and between the lowermost second semiconductor layers 112 and the first protection layer 106, in accordance with some embodiments. In some embodiments, the gaps 166 expose the inner sidewalls of the inner spacer layers 150 facing the channel regions, in accordance with some embodiments.

After the etching process, the four main surfaces of the second semiconductor layers 112 of the fin structure 104 are exposed, in accordance with some embodiments. The exposed second semiconductor layers 112 of the fin structure 104 form nanostructures that function as channel layers of the resulting semiconductor devices (e.g., gate-all-around FETs), in accordance with some embodiments.

FIGS. 2M-1 and 2M-2 are cross-sectional views of a semiconductor structure 100 after the formation of final gate stacks 168 and a contact plug 176, in accordance with some embodiments.

A gate dielectric layer 170 is formed on and wraps around the exposed surfaces of the nanostructures 112, as shown in FIG. 2M-1, in accordance with some embodiments. The gate dielectric layer 170 is also formed along and covers the inner sidewalls of the gate spacer layers 138 facing the channel region, in accordance with some embodiments. The gate dielectric layer 170 is also formed along and covers the inner sidewalls of the inner spacer layers 150 facing the channel region, in accordance with some embodiments. The gate dielectric layer 170 is also formed on the first protection layer 106, in accordance with some embodiments.

The gate dielectric layer 170 may include an interfacial layer and a high-k dielectric layer formed over the interfacial layer. The interfacial layer may be made of a chemically formed silicon oxide by one or more cleaning processes. In some embodiments, the high-k dielectric layer is made of a dielectric material with high dielectric constant (k value), for example, greater than 3.9. In some embodiments, the high-k dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HTiO, (Ba, Sr)$TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

A metal gate electrode layer 172 is formed over the gate dielectric layer 170 and fills remainders of the gate trench 164 and the gaps 166, as shown in FIG. 2M-1, in accordance with some embodiments. The metal gate electrode layer 172 wraps the nanostructures 112, in accordance with some embodiments. In some embodiments, the metal gate electrode layer 172 is made of more than one conductive material, such as a metal, metal alloy, conductive metal oxide and/or metal nitride, another suitable conductive material, and/or a combination thereof. For example, the metal gate electrode layer 172 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 172 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 172 may be formed using ALD, PVD, CVD, e-beam evaporation, or another suitable process. The metal gate electrode layer 172 may be formed separately for n-channel FETs and p-channel FETs, which may use different work function materials.

A planarization process such as CMP may be performed on the semiconductor structure 100 to remove the materials of the gate dielectric layer 170 and the metal gate electrode layer 172 formed above the upper surface of the interlayer dielectric layer 162, in accordance with some embodiments. After the planarization process, the upper surface of the metal gate electrode layer 172 and the upper surface of the interlayer dielectric layer 162 are substantially coplanar, in accordance with some embodiments.

The gate dielectric layer 170 and the metal gate electrode layer 172 combine to form a final gate stack 168, in accordance with some embodiments. In some embodiments, the final gate stack 168 extends in Y direction. That is, the final gate stack 168 has longitudinal axes parallel to Y direction, in accordance with some embodiments. The final gate stack 168 wraps around a middle portion of each of the nanostructures 112 and interposes between the first source/drain feature 154 and the second source/drain feature 156, in accordance with some embodiments.

The final gate stack 168 combines with the first source/drain feature 154 (e.g., a source terminal) and the second source/drain feature 156 (e.g., the drain terminal) to form a GAA FET, in accordance with some embodiments. The final gate stacks 168 may engage the channel region of the nanostructures 112, such that current can flow between the first source/drain feature 154 and the second source/drain feature 156 during operation.

A contact plug 176 is formed over the second source/drain feature 156, as shown in FIGS. 2M-1 and 2M-2, in accordance with some embodiments. The contact plug 176 passes through the interlayer dielectric layer 162 and lands on the second source/drain feature 156, in accordance with some embodiments. The contact plug 176 is electrically connected to the second source/drain feature 156, in accordance with some embodiments.

In some embodiments, the formation of the contact plug 176 includes forming a contact opening (not shown) through the interlayer dielectric layer 162 using a patterning process including photolithograph and etching processes. In some embodiments, the contact opening exposes the bulk layer 160 of the second source/drain feature 156.

A silicide layer 174 is formed on the bulk layer 160 of the second source/drain feature 156 in the contact opening, as shown in FIGS. 2M-1 and 2M-2, in accordance with some embodiments. In some embodiments, the silicide layer 174 is formed using depositing a metal layer over the semiconductor structure 100 and performing one or more anneal processes. The metal layer may be titanium (Ta), nickel (Ni), cobalt (Co), another suitable metal, or combinations thereof. A portion of the semiconductor materials of the bulk layer 160 contacting the metal layer reacts with the metal layer and are transformed into metal silicide such as titanium silicide (TiSi), nickel silicide (NiSi), cobalt silicide (CoSi), another suitable metal, or combinations thereof. Afterward, a portion of the metal layer unreacted with the semiconductor material may be removed using such as wet etching.

In some embodiments, the formation of the contact plug 176 also includes depositing a conductive material on the silicide layer 174 to fill the contact opening. The contact plug 176 may have a multi-layer structure including, for example, liner layers, seed layers, adhesion (glue) layers, barrier layers, fill layers, and the like. The conductive material for the contact plug 162 is made of one or more conductive materials such as cobalt (Co), tungsten (W), ruthenium (Ru), nickel (Ni), titanium (Ti), tantalum (Ta), cupper (Cu), aluminum (Al), molybdenum (Mo), TiN, TaN, another suitable material, or a combination thereof. The deposition process may be CVD, PVD, e-beam evaporation, ALD, electroplating (ECP), electroless deposition (ELD), another suitable method, or a combination thereof.

In some embodiments, a planarization process such as CMP is performed on the conductive material until the upper surface of the interlayer dielectric layer 164 is exposed. After the planarization process, the upper surfaces of the contact plug 176, the interlayer dielectric layer 162 and the metal gate electrode layers 172 are substantially coplanar, in accordance with some embodiments.

The semiconductor structure 100 may undergo further CMOS processes to form various features over the frontside of the semiconductor structure 100, such as a multilayer interconnect structure (e.g., including a contact plug to gate, vias, metal lines, inter metal dielectric layers, passivation layers, etc.). In some embodiments, some metal lines of the frontside interconnect structure are configured as routing tracks for signal transmitting. In some embodiments, the second source/drain feature 156 (e.g. the drain terminal) is electrically connected to the metals line of the frontside interconnect structure through the contact plug 176.

Figure 2N:
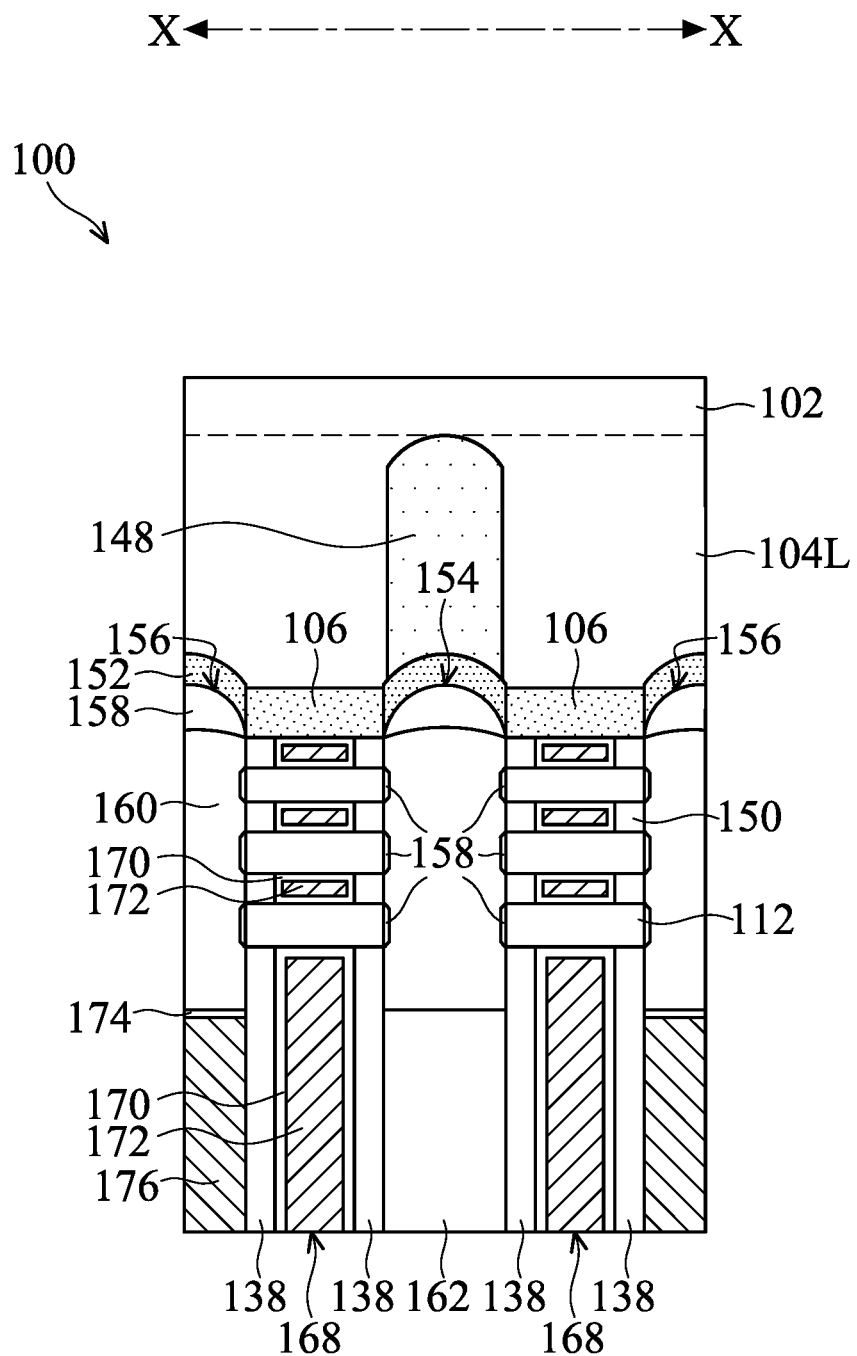

FIGS. 2N through 2U, 2V-1 and 2V-2 illustrate the formation of a contact plug to the first source/drain feature 154 from the backside of the semiconductor structure 100, in accordance with some embodiments. FIG. 2N is a cross-sectional view of a semiconductor structure 100 after turning upside down, in accordance with some embodiments.

A carrier substrate (not shown) is attached to the frontside of the semiconductor structure 100 and then the semiconductor structure 100 is turned upside down, in accordance with some embodiments. The backside (of the substrate 102) of the semiconductor structure 100 faces upwardly and the frontside (of the substrate 102) of the semiconductor structure 100 faces downwardly, as shown in FIG. 2N, in accordance with some embodiments.

Figure 2O:
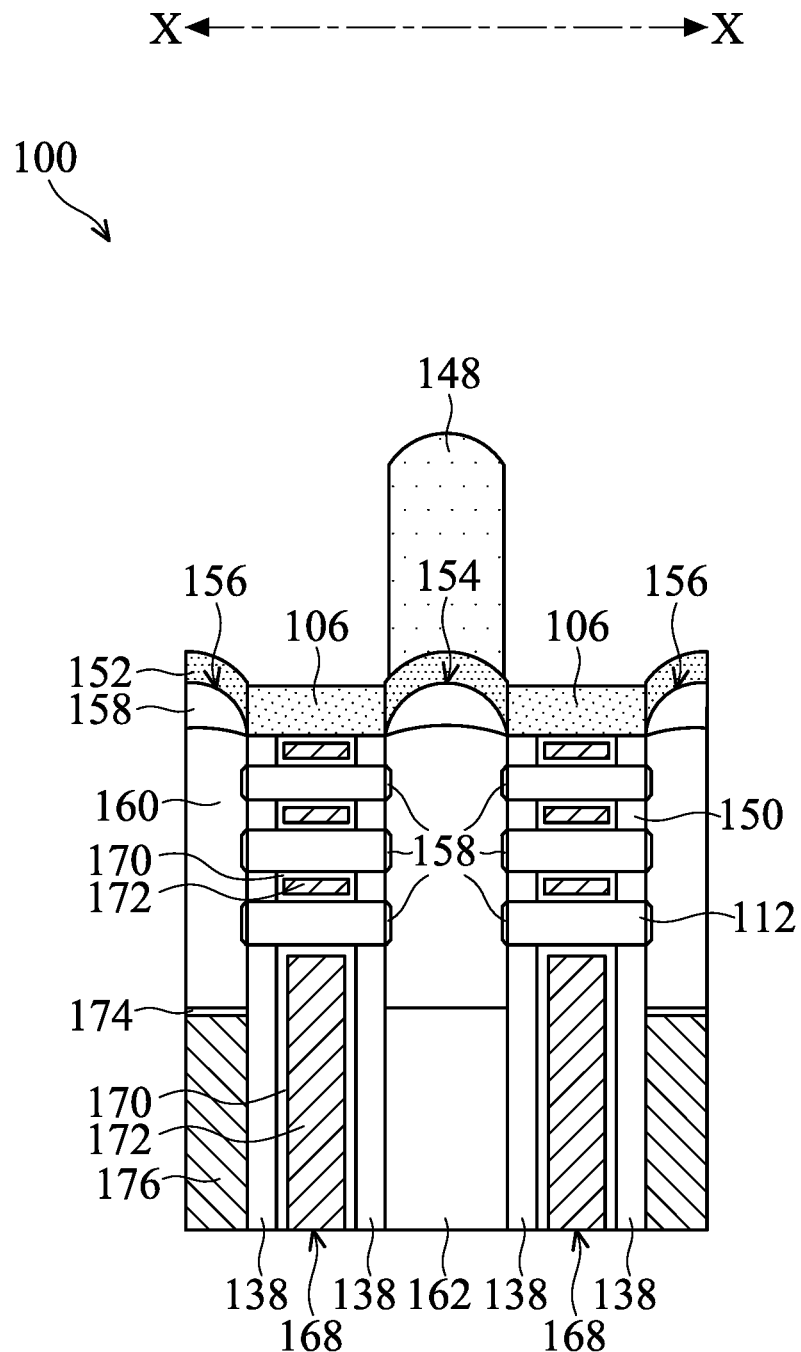

FIG. 2O is a cross-sectional view of a semiconductor structure 100 after the removal of the substrate 102 and the lower fin element 104L, in accordance with some embodiments.

The substrate 102 and the lower fin element 104L are removed, as shown in FIG. 2O, in accordance with some embodiments. The removal process may include a planarization process to remove the substrate 102 until the sacrificial layer 148 is exposed. After the planarization process, the isolation structure 116 (not shown in FIG. 2O) may be also exposed. The planarization process may be as a CMP process, mechanical grinding process, a dry polishing process, one or more other applicable processes, or a combination thereof. An etching process is then performed to remove the lower fin element 104L until the etching stop layer 152 and the first protection layer 106 are exposed, in accordance with some embodiments. The etching process may be an isotropic etching process, e.g., wet etching or dry chemical etching.

In some embodiments, the etching stop layer 152 having a different etching selectivity different than the substrate 102 protects the second source/drain feature 156 from being damaged during the etching process. In some embodiments, the first protection layer 106 having a different etching selectivity than the substrate 102 protects the corners of the first source/drain feature 154 and the second source/drain feature 156 from being damaged during the etching process, especially protects the upper portion of the first source/drain feature 154 on which a contact plug is to be formed.

In some instances in which the substrate is made of Si and the first source/drain feature is made of SiP and/or SiAs, without being protected by the protective layer, the first source/drain feature may suffer a great loss due to the difference in the etch selectivity between the first source/drain feature and the substrate is too small. In addition, the loss of the first source/drain feature may result in a subsequently formed contact plug to the first source/drain feature to be too close to the nanostructure 112, thereby increasing the parasitic capacitance of the resulting semiconductor device.

Figure 2P:
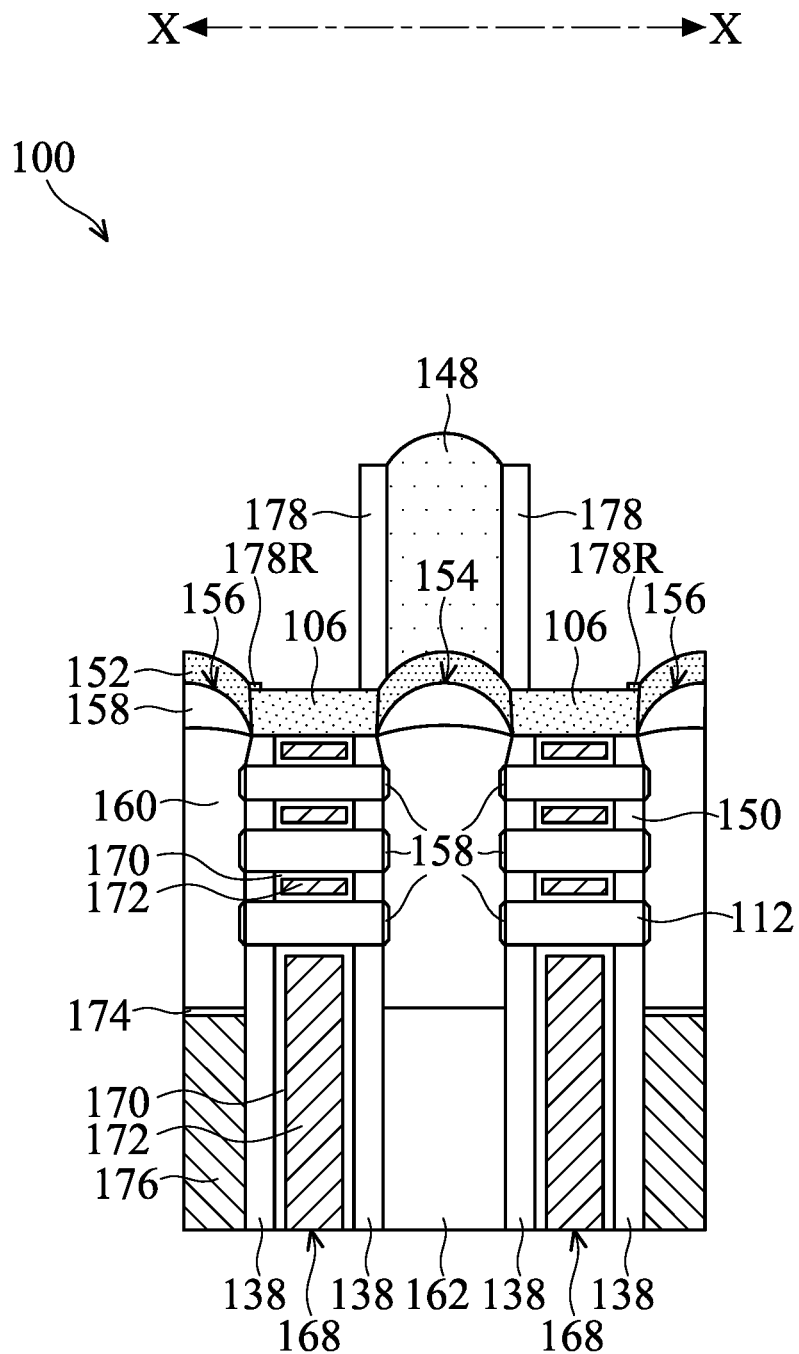

FIG. 2P is a cross-sectional view of a semiconductor structure 100 after the formation of spacer layers 178, in accordance with some embodiments.

Spacer layers 178 are formed on the opposite sides of the sacrificial layer 148, as shown in FIG. 2P, in accordance with some embodiments. In some embodiments, the spacer layers 178 are made of a dielectric material, such as $Al_2O_3$, $HfO_2$, $ZrO_2$, HfAlO, HfSiO, silicon nitride (SiN), silicon oxynitride (SiON), silicon oxide ($SiO_2$), and/or a combination thereof.

In some embodiments, the formation of the spacer layers 178 includes conformally depositing a dielectric material for the spacer layers 178 over the semiconductor structure 100 followed by an anisotropic etching process such as dry plasma etching. In some embodiments, the etching process is performed to remove horizontal portions of the dielectric material for the spacer layers 178, while leaving vertical portions of the dielectric material on sidewalls of the sacrificial layer 148 to act as the spacer layers 178.

Furthermore, a portion the dielectric material proximate to the second source/drain feature 156 may also remain on the boundary of the first protection layer 106 and the etching stop layer 152 and is denoted as a dielectric feature 178R, in accordance with some embodiments.

Figure 2Q:
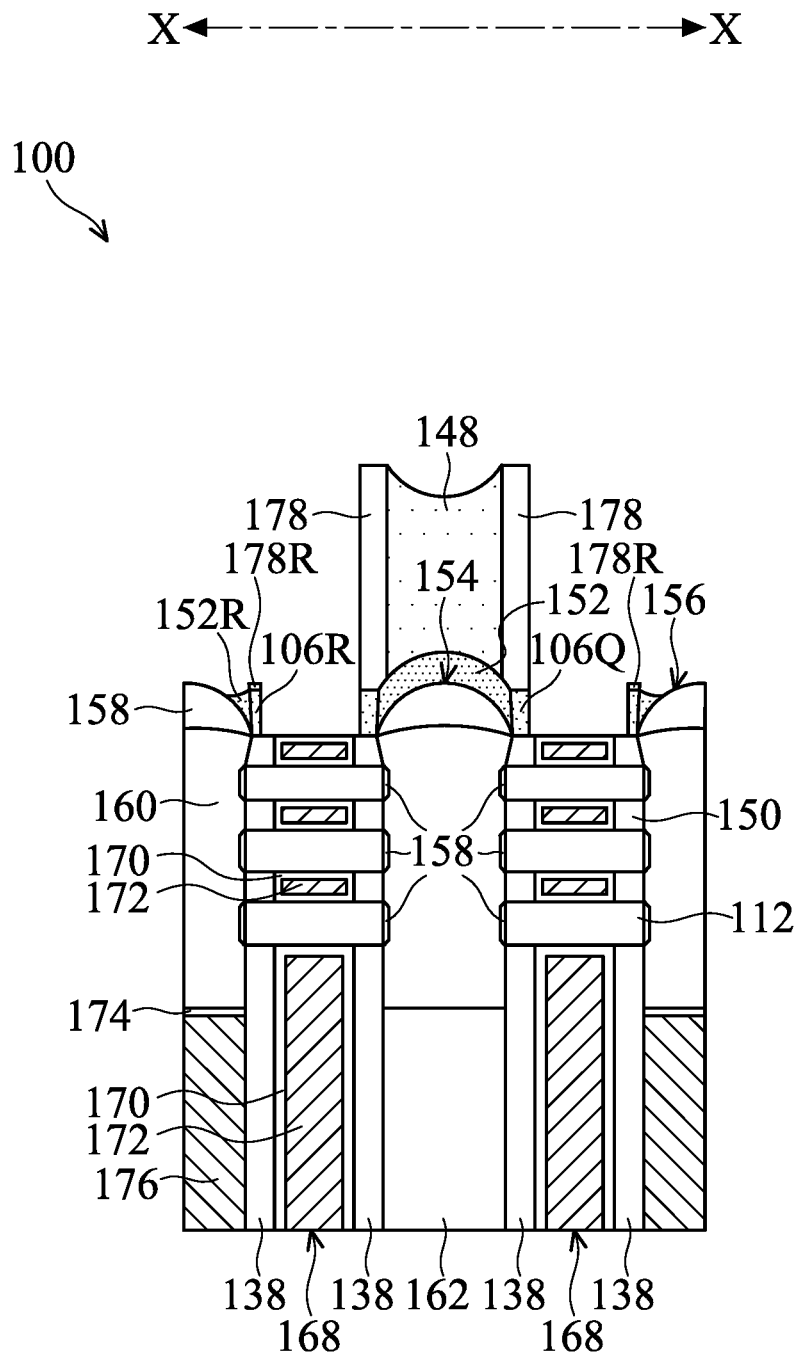

FIG. 2Q is a cross-sectional view of a semiconductor structure 100 after an etching process, in accordance with some embodiments.

An etching process is performed on the semiconductor structure 100 to remove the first protection layer 106 and the etching stop layer 152, in accordance with some embodiments. The etching process is performed until the gate dielectric layer 170 of the final gate stack 168 and the buffer layer 158 of the second source/drain feature 156 are exposed, as shown in FIG. 2Q, in accordance with some embodiments. The etching process may be an anisotropic etching process, e.g., dry plasma etching.

In some embodiments, a portion of the first protection layer 106 uncovered by the spacer layers 178 is removed during the etching process. In some embodiments, a portion of the first protection layer 106 covered by the spacer layers 178 remains over the inner spacer layer 150 and is referred to as a protection feature 106Q. The protection feature 106Q may protect the first source/drain feature 106Q from being damage during following processes.

In some embodiments, a portion of the first protection layer 106 covered by the dielectric feature 178R remains over the inner spacer layer 150 and is referred to as a protection feature 106R. In some embodiments, a portion of the etching stop layer 152 sandwiched between the protection feature 106R and the buffer layer 158 of the second source/drain feature 156 remains and is referred to as an etching stop feature 152R.

Figure 2R:
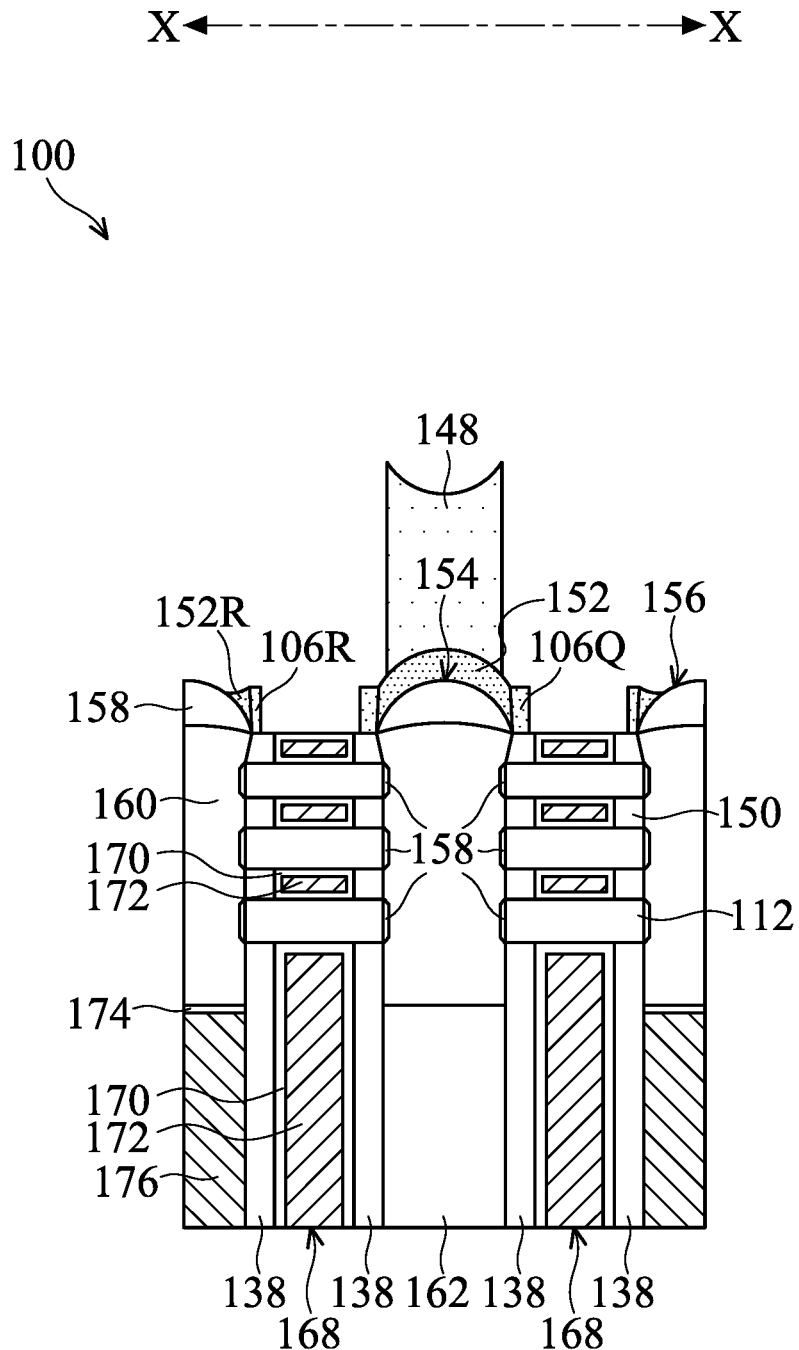

FIG. 2R is a cross-sectional view of a semiconductor structure 100 after the removal of the spacer layer 178 and the dielectric feature 178R in accordance with some embodiments.

An etching process is performed on the semiconductor structure 100 to remove the spacer layer 178 and the dielectric feature 178R, as shown in FIG. 2Q, in accordance with some embodiments. The etching process may be an anisotropic etching process, such as dry plasma etching and/or an isotropic etching process such as wet etching or dry chemical etching.

Figure 2S:
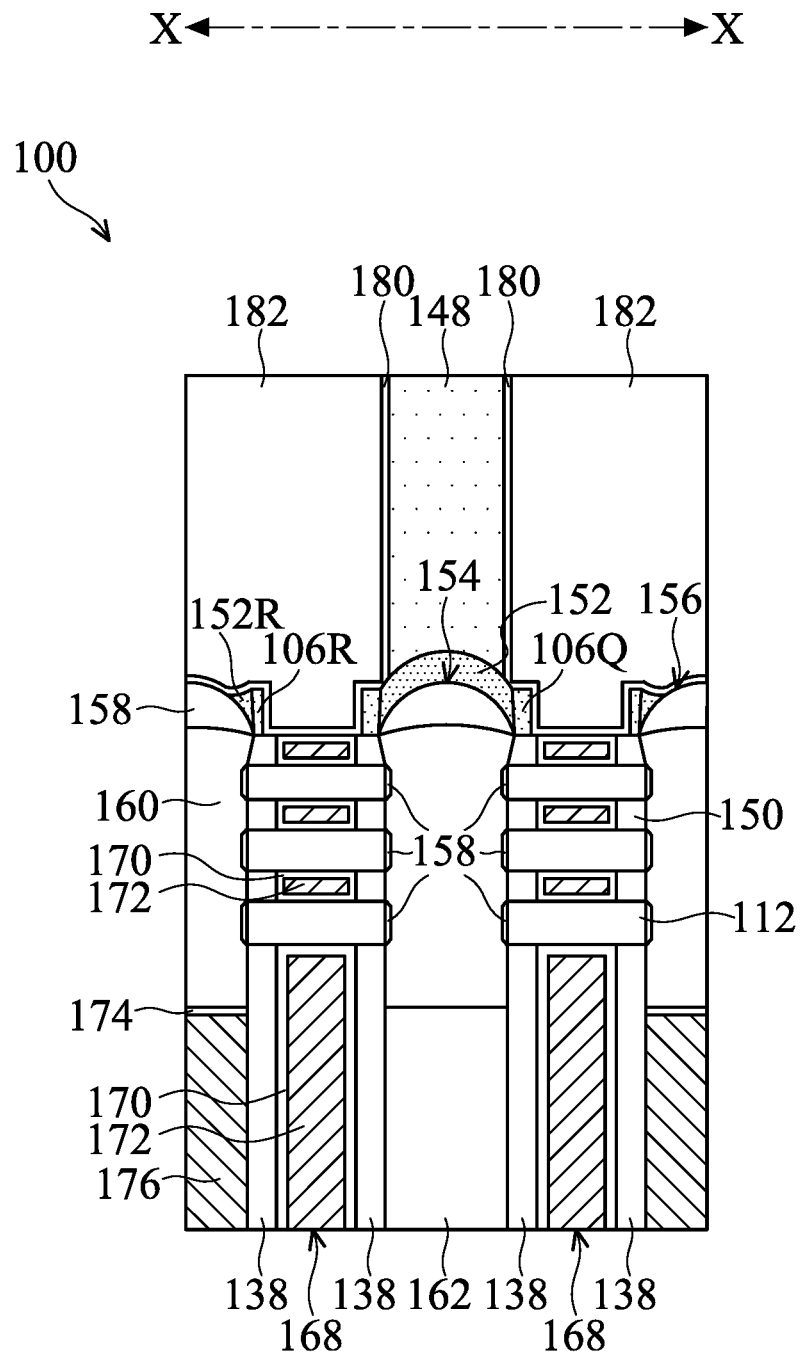

FIG. 2S is a cross-sectional view of a semiconductor structure 100 after the formation of a dielectric lining layer 180 and an insulating layer 182, in accordance with some embodiments.

A dielectric lining layer 180 is conformally formed over the semiconductor structure 100, as shown in FIG. 2S, in accordance with some embodiments. The dielectric lining layer 180 covers and extends along exposed surfaces of the buffer layer 158, the etching stop feature 152R, the protection feature 106R, the gate dielectric layer 170, the protection feature 106Q, and the sacrificial contact 148, in accordance with some embodiments. In addition, the dielectric lining layer 180 is formed along the isolation structure 116 (not shown in FIG. 2S).

In some embodiments, the dielectric lining layer 180 is made of a dielectric material such as silicon nitride (SiN), silicon oxynitride (SiON), silicon oxide ($SiO_2$), $Al_2O_3$, $HfO_2$, $ZrO_2$, HfAlO, HfSiO, and/or a combination thereof. In some embodiments, the dielectric lining layer 180 is deposited using ALD, CVD (such as PECVD or LPCVD), another suitable technique, and/or a combination thereof.

An insulating layer 182 is formed over the dielectric lining layer 180 to surround the sacrificial contact 148, as shown in FIG. 2S, in accordance with some embodiments. The insulating layer 182 fills the space between the isolation structure 116 (not shown in FIG. 2S), in accordance with some embodiments.

In some embodiments, the insulating layer 182 is made of a dielectric material, such as silicon oxide-based material such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, a dielectric material for the insulating layer 182 is deposited using such as CVD (such as FCVD, PECVD, HDP-CVD, or HARP), ALD, another suitable technique, and/or a combination.

Afterward, the dielectric materials for the dielectric lining layer 180 and the insulating layer 182 above the sacrificial contact 148 are removed using such as CMP until the upper surface of the sacrificial contact 148 is exposed. In some embodiments, the upper surface of the insulating layer 182 and the sacrificial contact 148 are substantially coplanar.

Figure 2T:
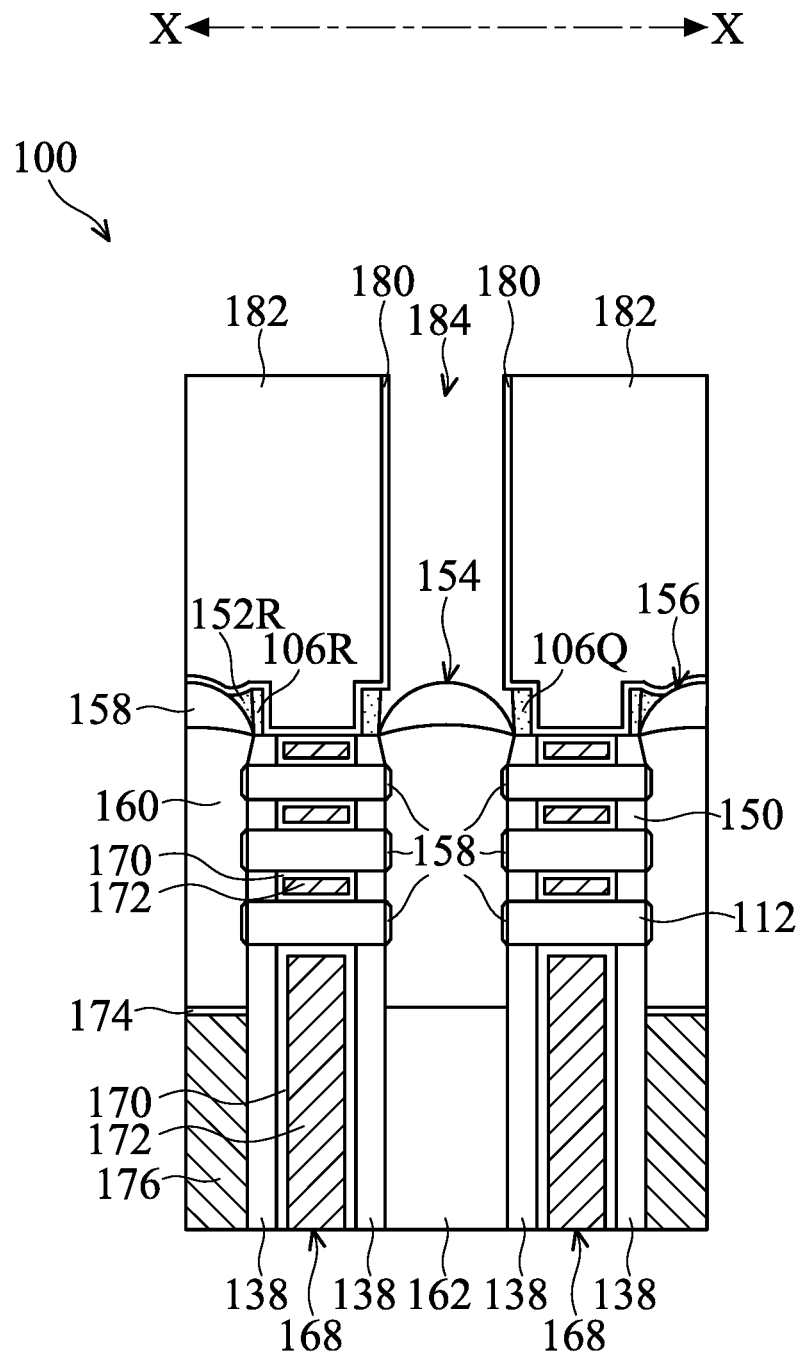

FIG. 2T is a cross-sectional view of a semiconductor structure 100 after the removal of the sacrificial contact 148 and the protection layer 152, in accordance with some embodiments.

The sacrificial contact 148 and the underlying protection layer 152 are etched away thereby forming a contact opening 184 within the insulating layer 182, as shown in FIG. 2T, in accordance with some embodiments. The contact opening 184 exposes the buffer layer 158 of the first source/drain feature 154, in accordance with some embodiments. The etching process may be an anisotropic etching process such as dry plasma etching and/or an isotropic etching process such as wet etching or dry chemical etching. In some embodiments, the protection feature 106Q covered by the insulating layer 182 is not removed in the etching process.

Figure 2U:
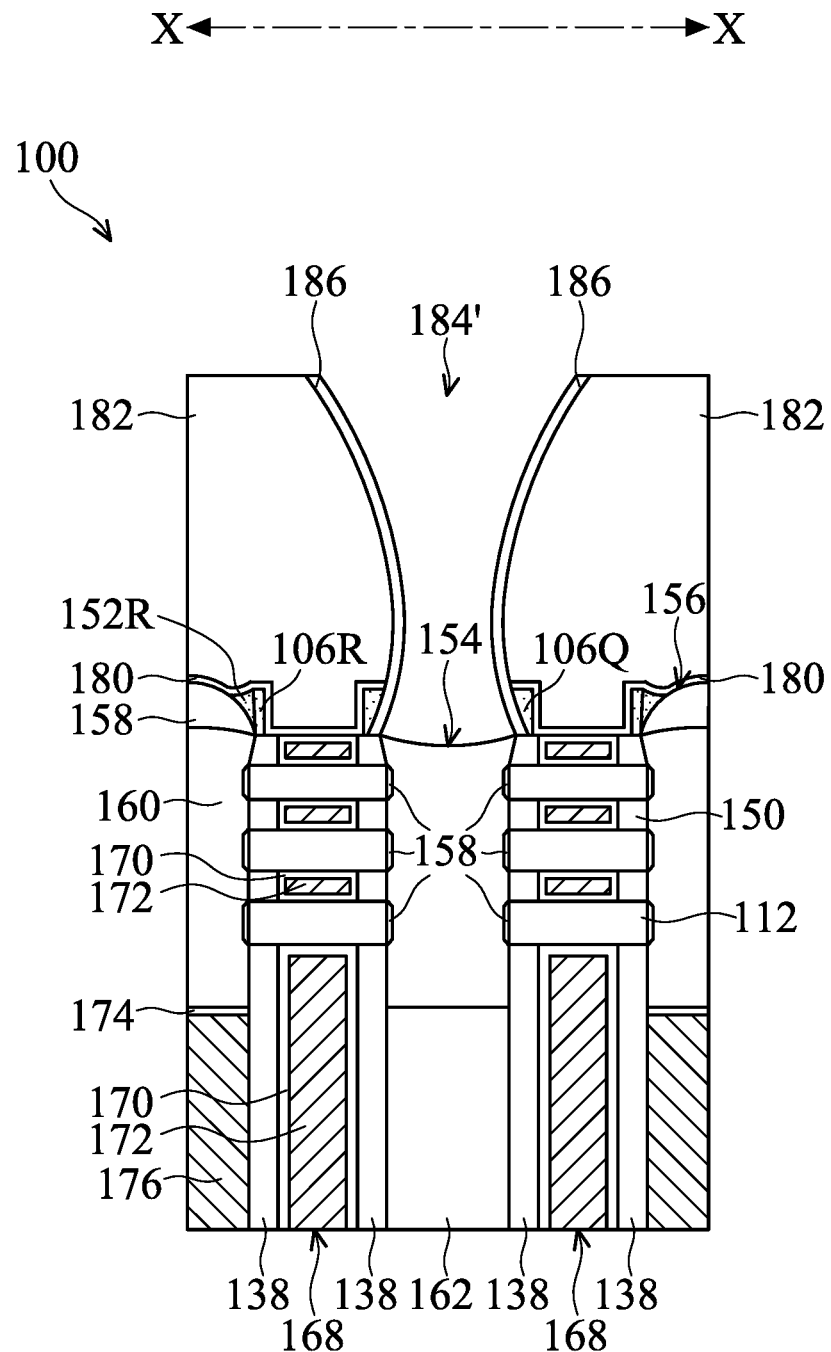

FIG. 2U is a cross-sectional view of a semiconductor structure 100 after the removal of the buffer layer 158 of the first source/drain feature 154, a corner-rounding process and the formation of a dielectric lining layer 186, in accordance with some embodiments.

The buffer layer 158 of the first source/drain feature 154 is removed using an etching process until the bulk layer 160 of the first source/drain feature 154 is exposed, as shown in FIG. 2U, in accordance with some embodiments. A corner-rounding process is then performed on the semiconductor structure 100 to laterally enlarge the contact opening 184, in accordance with some embodiments. The enlarged contact opening 184 is denoted as 184'.

The corner-rounding process may include an etching process, which removes a portion of the dielectric lining layer 180 exposed from the contact opening 184 and a portion of the insulating layer 182 proximate to the contact opening 184, in accordance with some embodiments. The upper portion of the contact opening 184' has a width increasing toward the top of the contact opening 184', which may be helpful in filling a conductive material into the contact opening 184'.

Because the bulk layer 158 has a convex upper surface (after turning upside down), the process window for forming the contact opening 184' may be enlarged such that the bottom surface of the contact opening 184' may not be too close to the nanostructure 112. If the bottom surface of the contact opening 184' is too close to the nanostructure 112, the parasitic capacitance of the resulting semiconductor device may increase.

A dielectric lining layer 186 is conformally formed along the sidewalls of the contact opening 184', as shown in FIG. 2U, in accordance with some embodiments. In some embodiments, the dielectric lining layer 186 is made of a dielectric material such as silicon nitride (SiN), silicon oxynitride (SiON), silicon oxide ($SiO_2$), $Al_2O_3$, $HfO_2$, $ZrO_2$, HfAlO, HfSiO, and/or a combination thereof. In some embodiments, a dielectric material for the dielectric lining layer 186 is deposited over the semiconductor structure 100 followed by an anisotropic etching process. The deposition process may be ALD, CVD (such as PECVD or LPCVD), another suitable technique, and/or a combination thereof.

Figures 1, 2V:
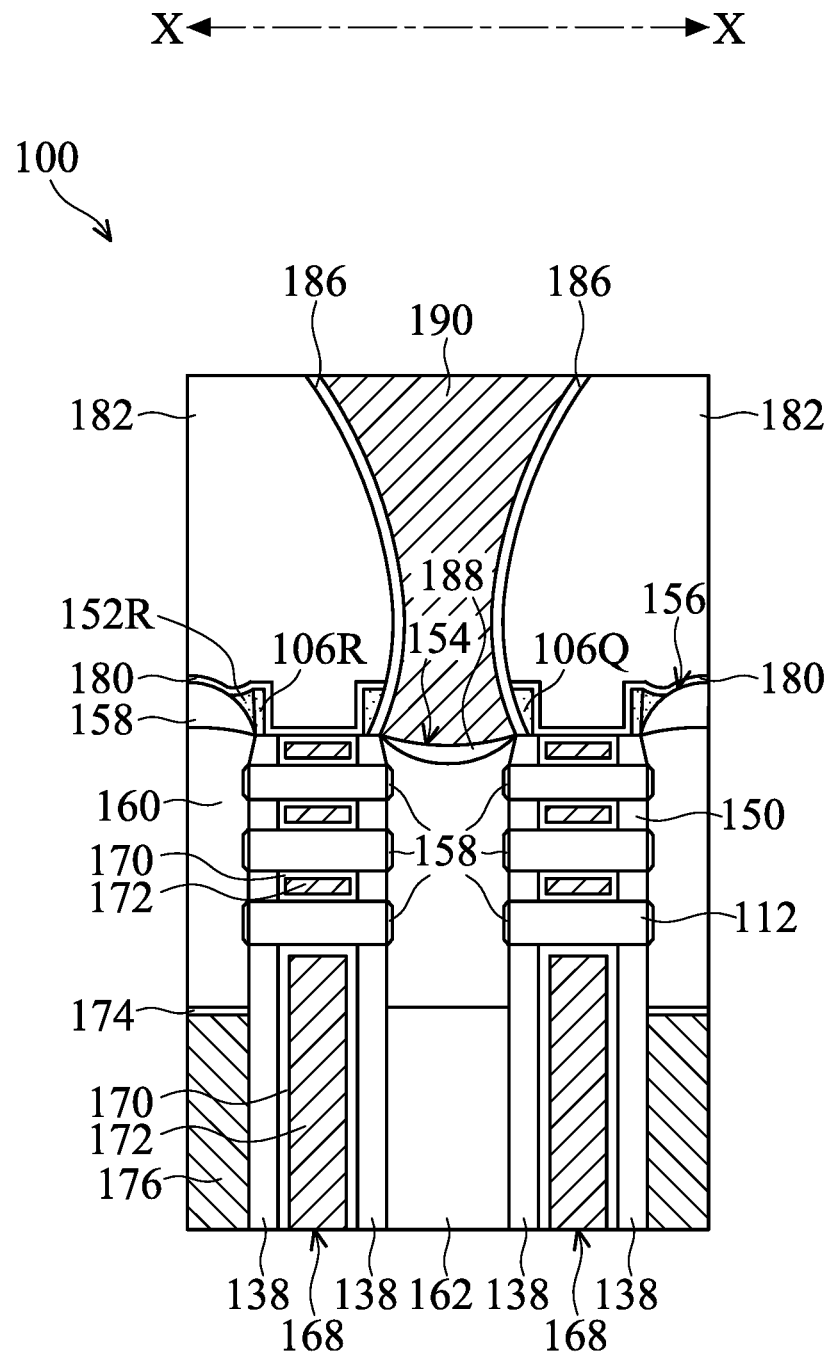
Figures 2, 2V:
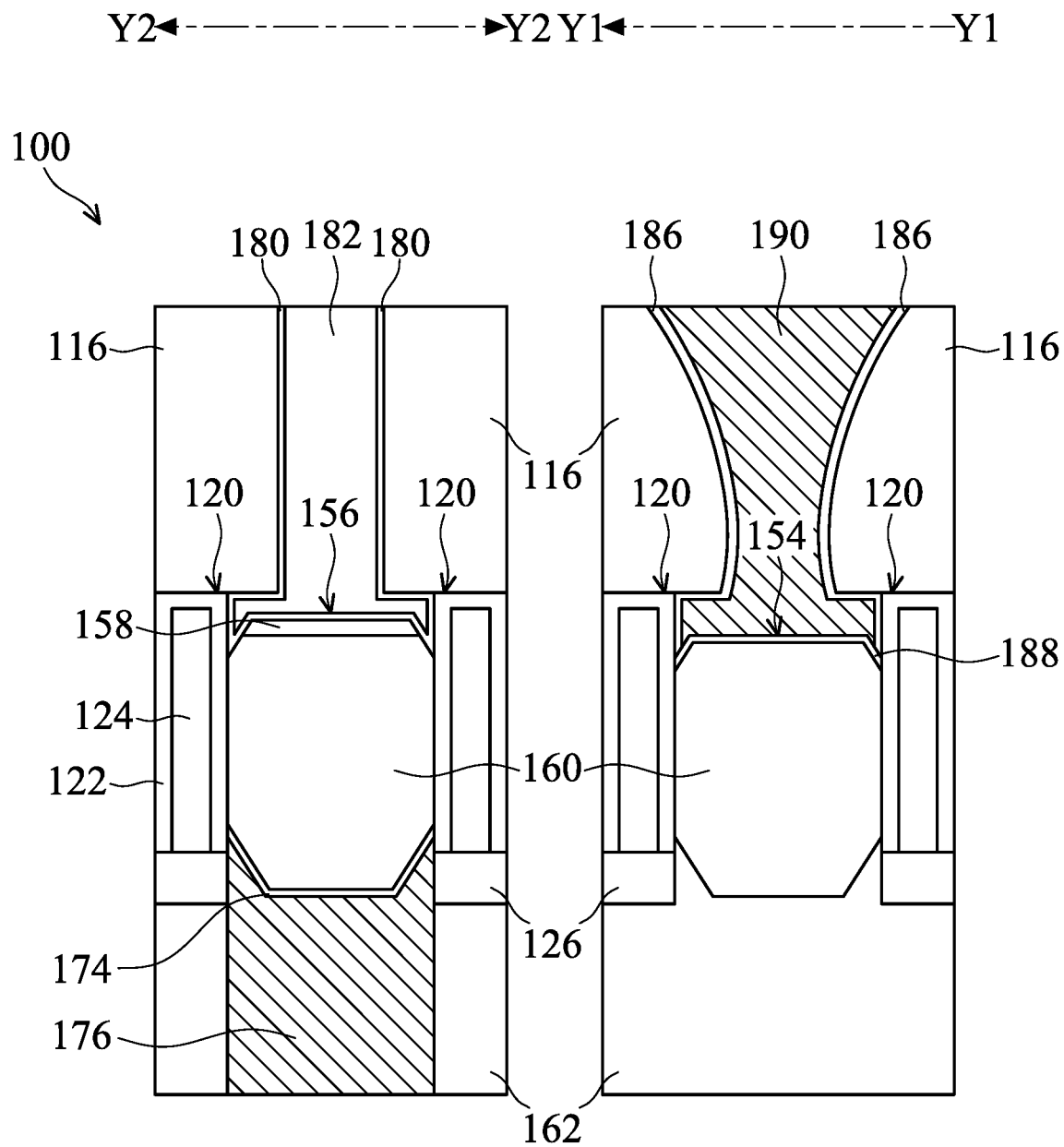

FIGS. 2V-1 and 2V-2 are cross-sectionals view of a semiconductor structure 100 after the formation of a silicide layer 188 and a contact plug 190, in accordance with some embodiments.

A silicide layer 188 is formed on the bulk layer 160 of the first source/drain feature 154 in the contact opening 184', as shown in FIGS. 2V-1 and 2V-2, in accordance with some embodiments.

In some embodiments, the silicide layer 188 is formed by depositing a metal layer over the semiconductor structure 100 and performing one or more anneal processes. The metal layer may be titanium (Ta), nickel (Ni), cobalt (Co), another suitable metal, or combinations thereof. A portion of the semiconductor materials of the bulk layer 160 contacting the metal layer reacts with the metal layer and are transformed into metal silicide such as titanium silicide (TiSi), nickel silicide (NiSi), cobalt silicide (CoSi), another suitable metal, or combinations thereof. Afterward, a portion of the metal layer unreacted with the semiconductor material may be removed using such as wet etching.

A contact plug 190 is formed over the silicide layer 188 in the contact opening 184', as shown in FIGS. 2V-1 and 2V-2, in accordance with some embodiments. As such, the sacrificial contact 148 is replaced with the contact plug 190, in accordance with some embodiments. The contact plug 190 passes through the insulating layer 182 and lands on the first source/drain feature 154, in accordance with some embodiments. The contact plug 190 is electrically connected to the first source/drain feature 154, in accordance with some embodiments.

In some embodiments, the formation of the contact plug 190 includes depositing a conductive material on the silicide layer 188 to fill the contact opening 184'. The contact plug 190 may have a multi-layer structure including, for example, liner layers, seed layers, adhesion (glue) layers, barrier layers, fill layers, and the like. The conductive material for the contact plug 190 is made of one or more conductive materials such as cobalt (Co), nickel (Ni), tungsten (W), titanium (Ti), tantalum (Ta), cupper (Cu), aluminum (Al), ruthenium (Ru), molybdenum (Mo), TiN, TaN, another suitable material, or a combination thereof. The deposition process may be CVD, PVD, e-beam evaporation, ALD, ECP, ELD, another suitable method, or a combination thereof.

In some embodiments, a planarization process such as CMP is performed on the conductive material until the upper surface of the insulating layer 182 is exposed. After the planarization process, the upper surfaces of the contact plug 190, the insulating layer 182 and the isolation structure 116 are substantially coplanar, in accordance with some embodiments.

In some embodiments, the semiconductor structure 100 includes the plurality of nanostructures 112 vertically stacked and separated from another and the final gate stack 168 wrapping around the plurality of nanostructures 112. In some embodiments, the semiconductor structure 100 also includes and the first source/drain feature 154 adjoining a first side of the plurality of nanostructures 112 and the second source/drain feature 156 adjoining a second side of the plurality of nanostructures 112. In some embodiments, the semiconductor structure 100 also includes the contact plug 190 in the insulating layer 168 and landing on the first source/drain feature 154 and the contact plug 176 below the second source/drain feature 156.

The semiconductor structure 100 also includes the protection feature 106Q vertically sandwiched between the insulating layer 182 and the inner spacer layer 150 and laterally sandwiched between the insulating layer 182 and the contact plug 190. The semiconductor structure 100 also includes the etching stop feature 152R vertically sandwiched between the insulating layer 182 and the bulk layer 160 of the second source/drain feature 156 and laterally sandwiched between the buffer layer 158 of the second source/drain feature 156 and the protection feature 106R.

The semiconductor structure 100 may undergo further CMOS processes to form various features over the backside of the semiconductor structure 100, such as a multilayer interconnect structure (e.g., including metal lines, inter metal dielectric layers, passivation layers, etc.). In some embodiments, some metal lines of the backside interconnect structure are configured as power rails (also referred to as backside power rail). In some embodiments, the first source/drain feature 154 (e.g. the source terminal) is electrically connected to the power rails of the backside interconnect structure through the contact plug 190.

Because the power rails are disposed at the backside of the semiconductor structure 100, more metal lines of the frontside interconnect structure may be provided for signal transmitting. As a result, the amount (or the density) of the routing tracks in a single metal layer (e.g., M0 layer) may be increased, which may be helpful in continuously scaling down the semiconductor device.

Furthermore, the power rails disposed at the backside of the semiconductor structure 100 may be formed to have a large dimension (e.g., critical dimension) than the power rails disposed at the frontside of the semiconductor structure 100. As a result, the resistance of the power rails may be reduced, which in turn improves the performance of the semiconductor device.

Furthermore, the first protection layer 106 protects the corners of the first source/drain feature 154 from being damaged during the etching process for removing the substrate 102. Therefore, the manufacturing yield and reliability of the semiconductor device are improved.

Figure 3A:
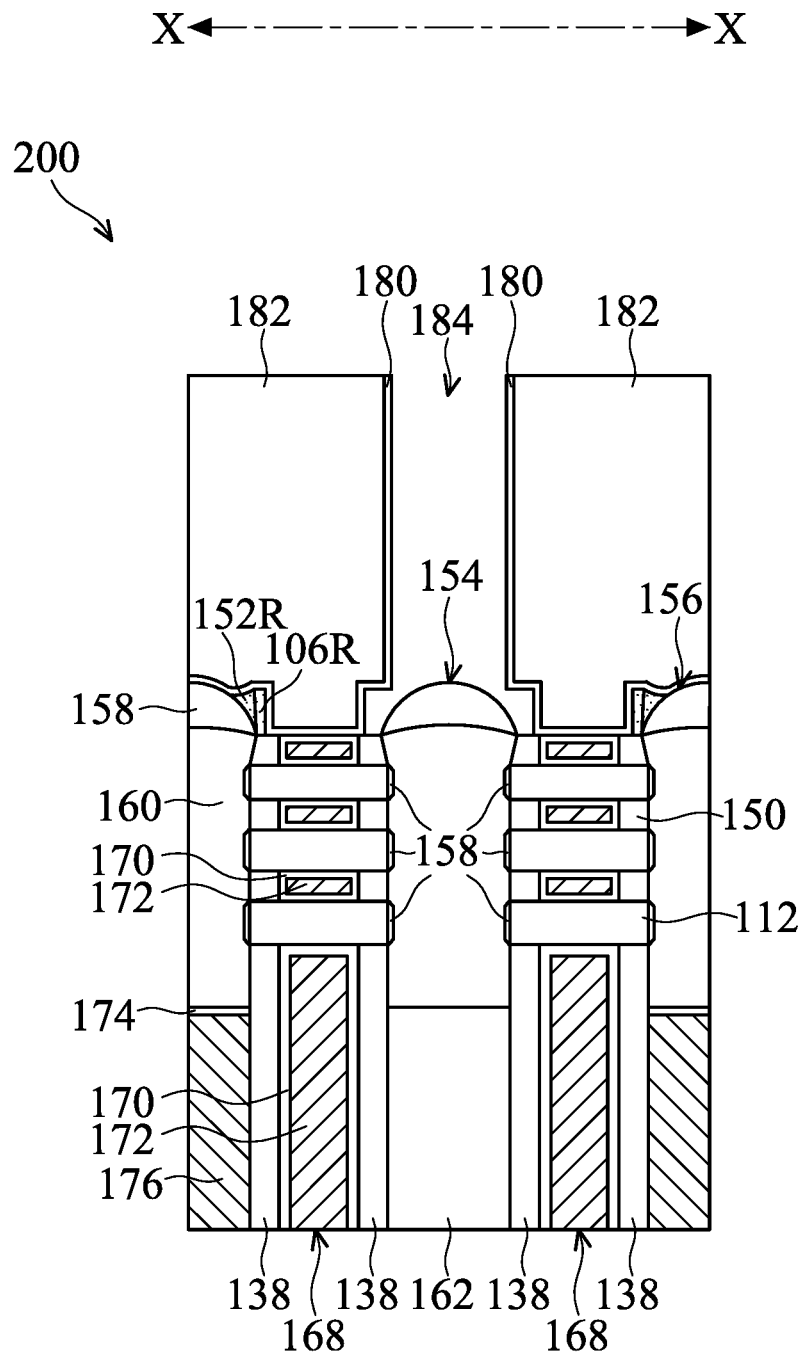
FIGS. 3A through 3C are cross-sectional views illustrating the formation of a semiconductor structure at various intermediate stages, in accordance with some embodiments of the disclosure.
Figure 3B:
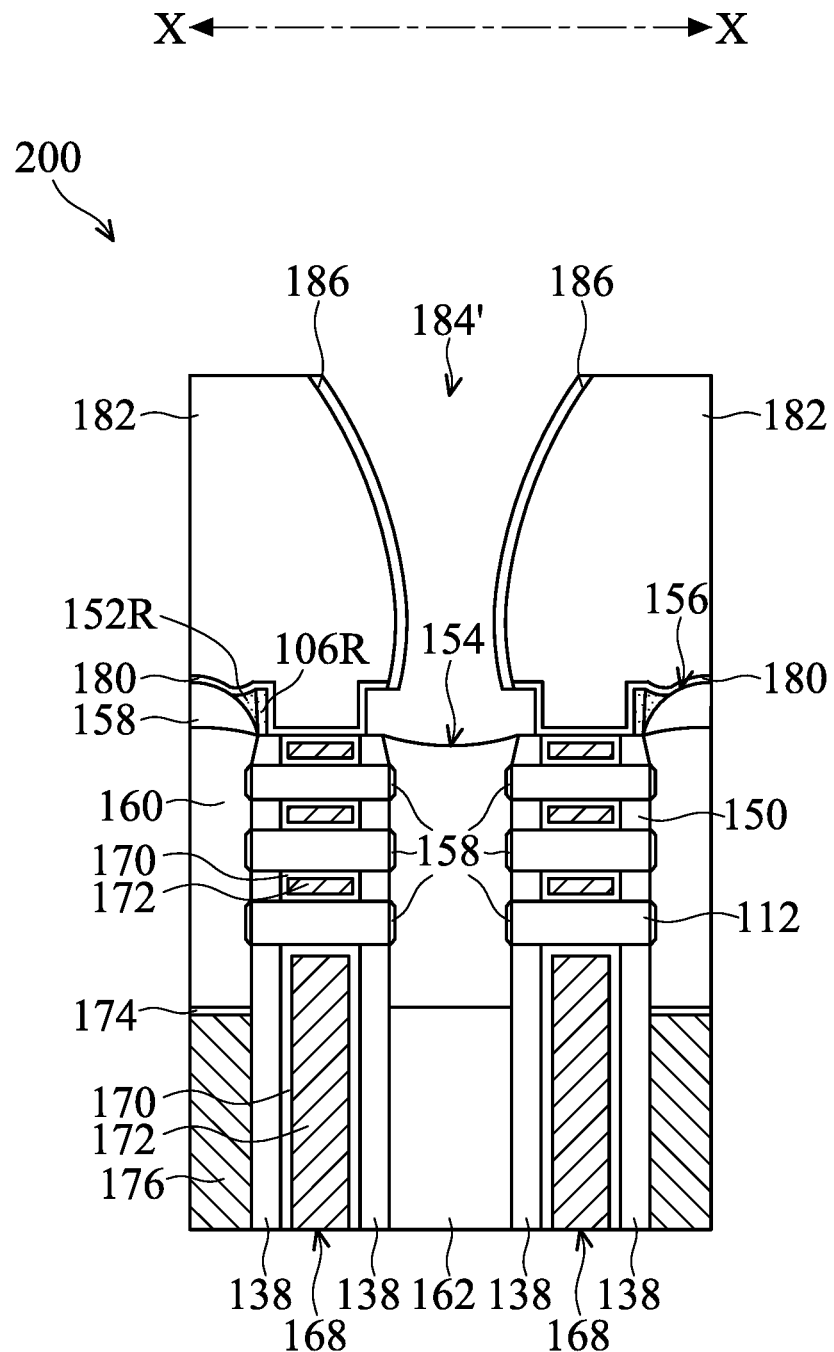
Figure 3C:
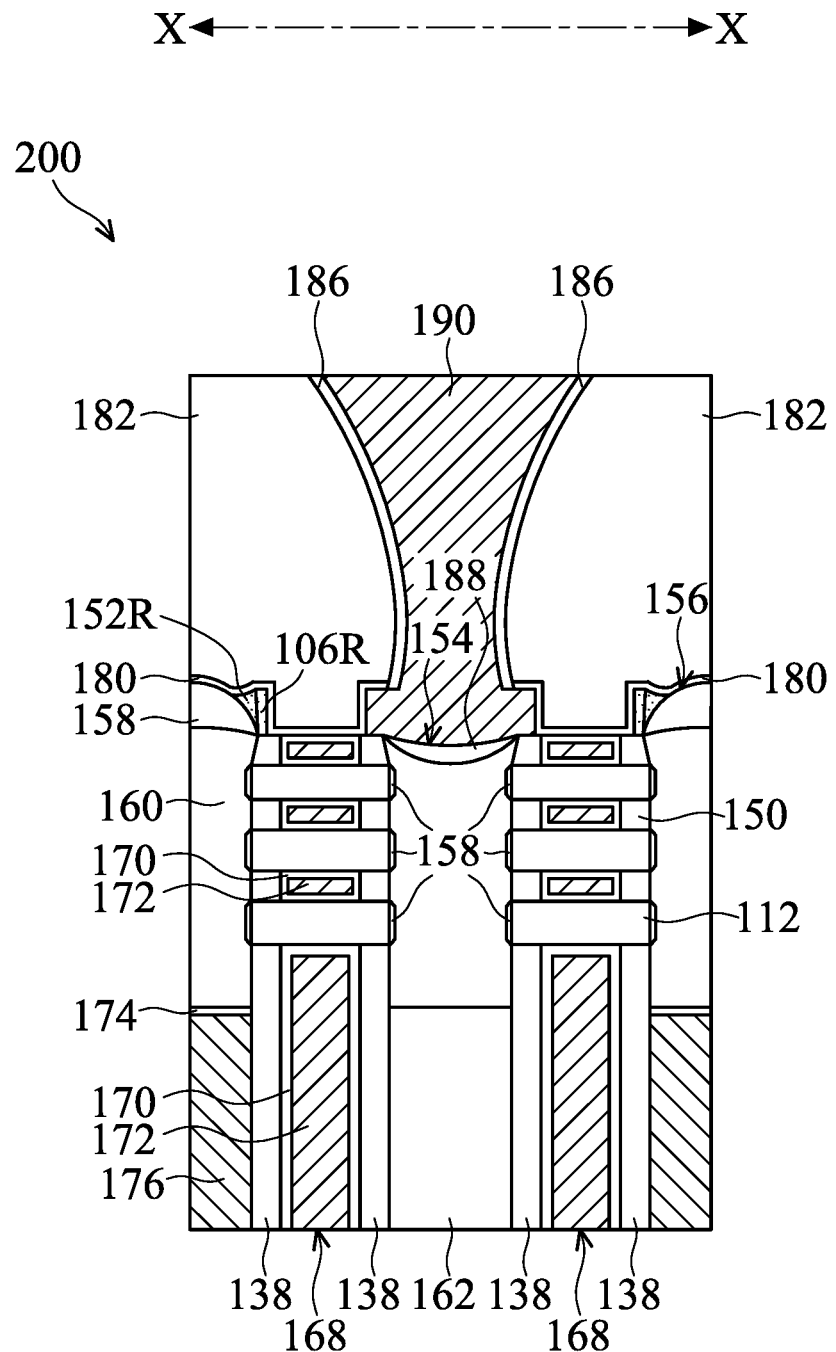

FIGS. 3A through 3C are cross-sectional views illustrating the formation of a semiconductor structure corresponding to line X-X shown in FIG. 1, in accordance with some embodiments. The embodiments of FIGS. 3A through 3C are similar to that shown in FIG. 2A-1 through 2V-2 except that the protection features 106Q are removed.

FIG. 3A illustrates a semiconductor structure 200 which has been subjected the steps described above respect to FIG. 2A-1 through 2T, in accordance with some embodiments. The sacrificial contact 148 and the underlying protection layer 152 are etched away, thereby forming a contact opening 184, as shown in FIG. 3A, in accordance with some embodiments. The protection features 106Q (FIG. 2T) are also removed in the etching process, in accordance with some embodiments. Portions of the inner spacer layers 150 are exposed from the contact opening 184, in accordance with some embodiments.

FIG. 3B is a cross-sectional view of a semiconductor structure 200 after the removal of the buffer layer 158 of the first source/drain feature 154, a corner-rounding process and the formation of a dielectric lining layer 186, in accordance with some embodiments.

The steps as described above with respect to FIG. 2U are performed on the semiconductor structure 200, in accordance with some embodiments. The buffer layer 158 of the first source/drain feature 154 is removed and a corner-rounding process is performed such that the contact opening 184 is enlarged to form contact opening 184', in accordance with some embodiments. A bottom portion the contact opening 184' has a greater width than the bulk layer 160 of the first source/drain feature 160, in accordance with some embodiments. A dielectric lining layer 186 is conformally formed along the sidewalls of the contact opening 184', in accordance with some embodiments.

FIG. 3C is a cross-sectional view of a semiconductor structure 200 after the formation of a silicide layer 188 and a contact plug 190, in accordance with some embodiments.

The steps as described above with respect to FIGS. 2V-1 and 2V-2 are performed on the semiconductor structure 200, in accordance with some embodiments. A silicide layer 188 is formed on the bulk layer 160 of the first source/drain feature 154 in the contact opening 184', as shown in FIG. 3C, in accordance with some embodiments. A contact plug 190 is formed over the silicide layer 188 in the contact opening 184', in accordance with some embodiments. The contact plug 190 passes through the insulating layer 182 and lands on the first source/drain feature 154, in accordance with some embodiments. A bottom portion the contact plug 190 has a greater width than the bulk layer 160 of the first source/drain feature 160 and covers portions of the inner spacer layers 150, in accordance with some embodiments. A multilayer interconnect structure (not shown) may be formed over the backside of the semiconductor structure 200. In some embodiments, the first source/drain feature 154 (e.g. the source terminal) is electrically connected to the power rails of the backside interconnect structure through the contact plug 190.

Figure 4A:
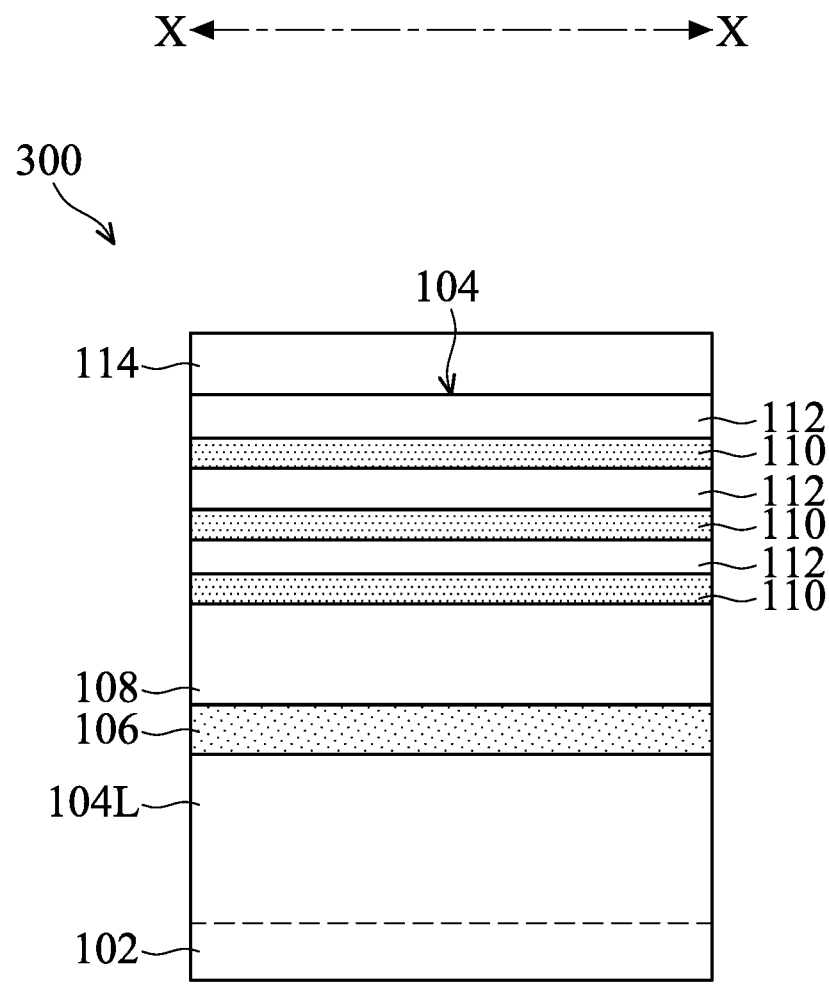
Figure 4B:
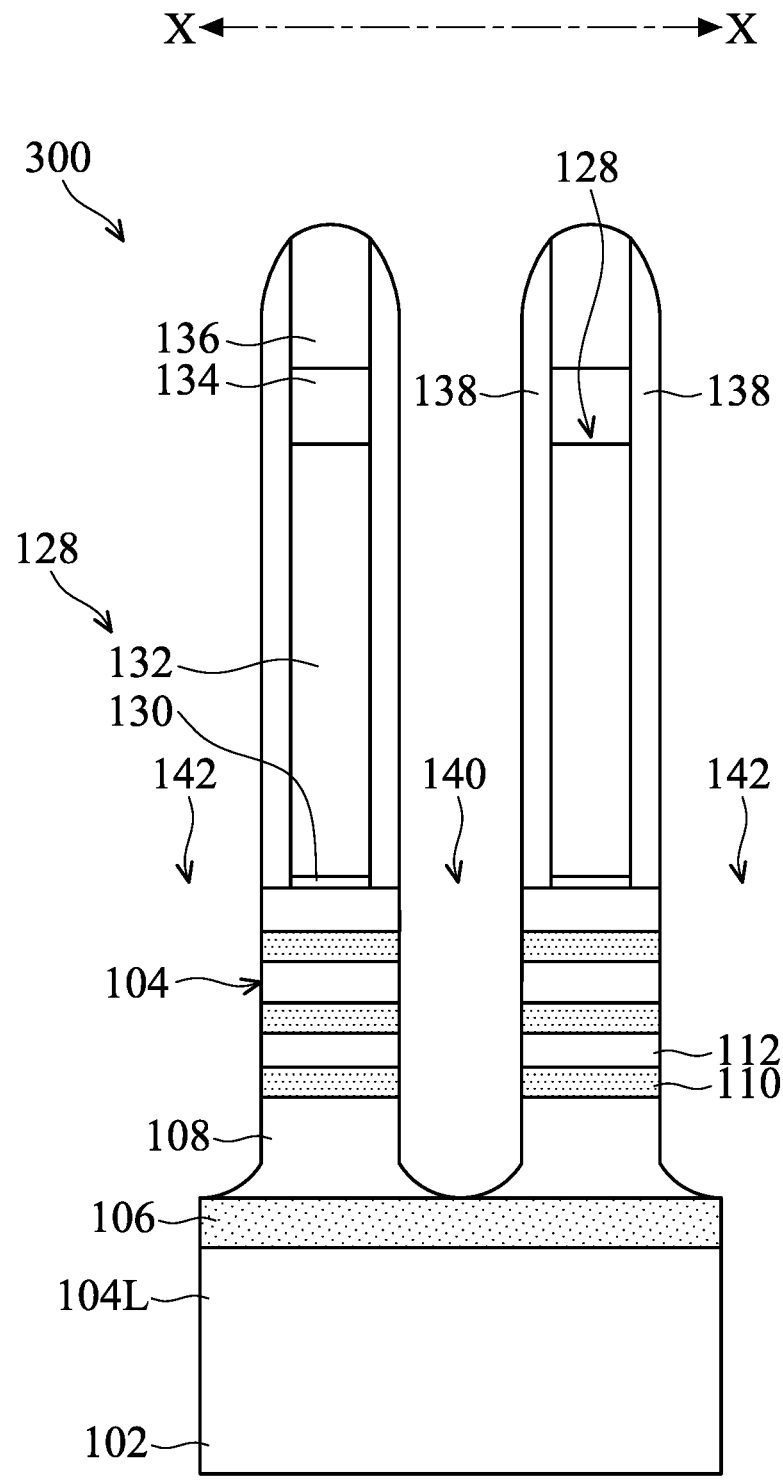
Figure 4C:
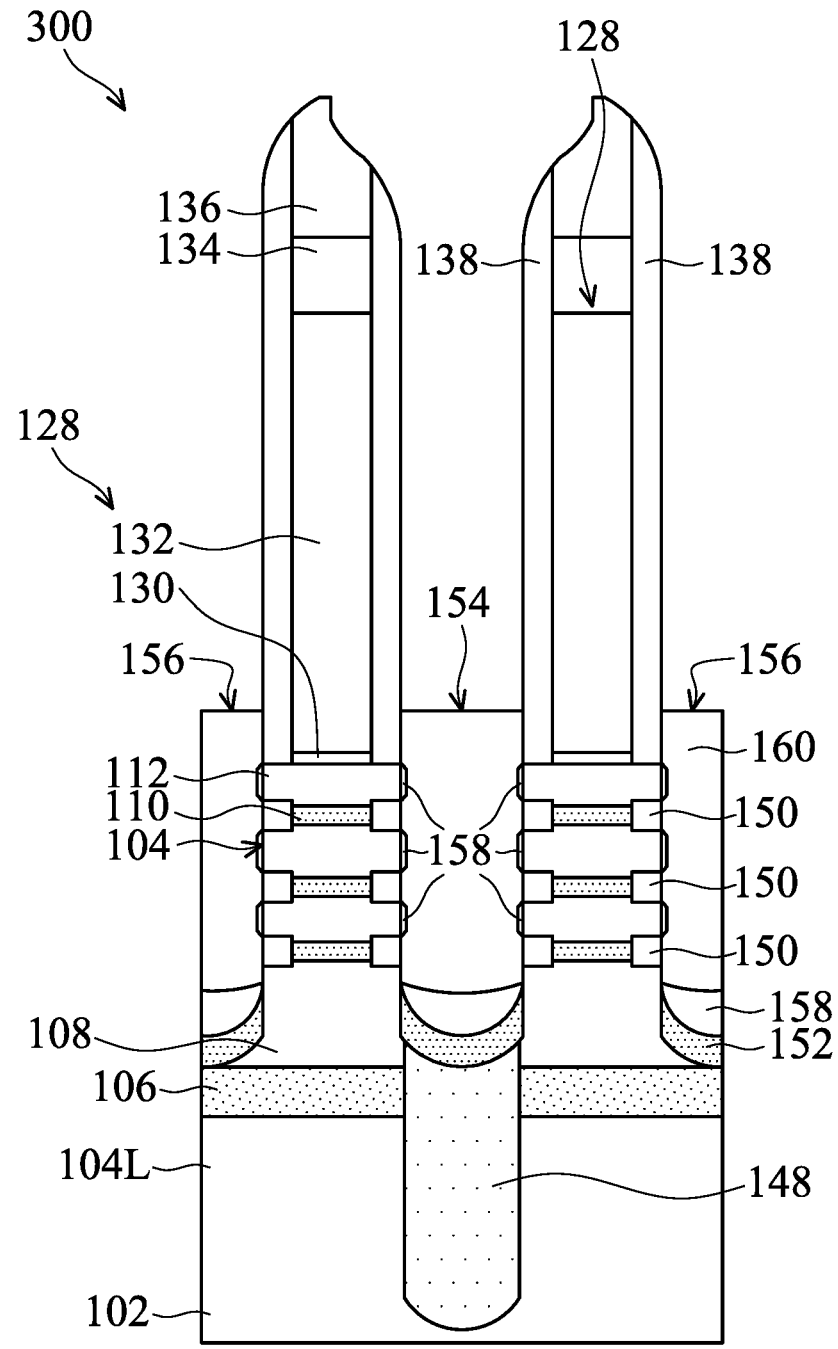
Figure 4D:
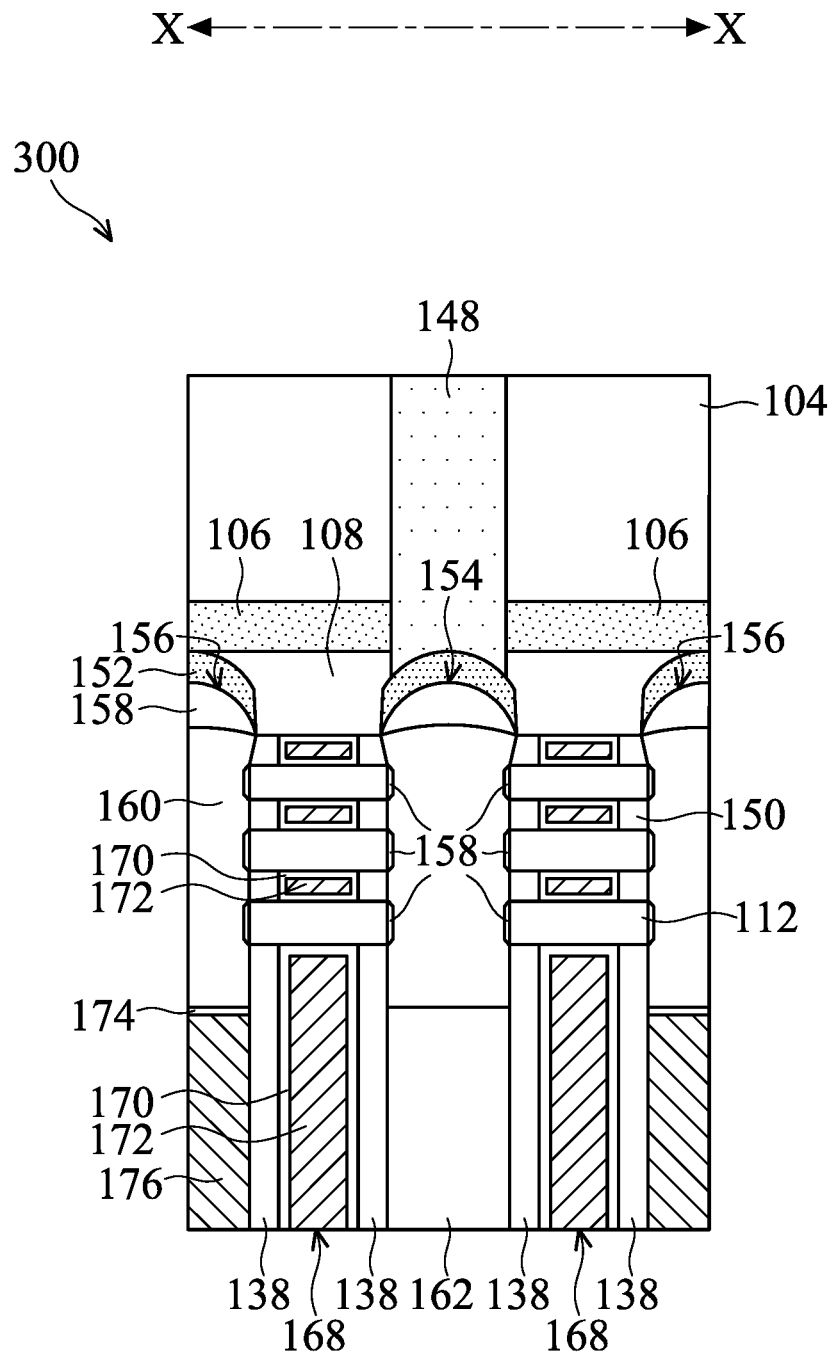
Figure 4E:
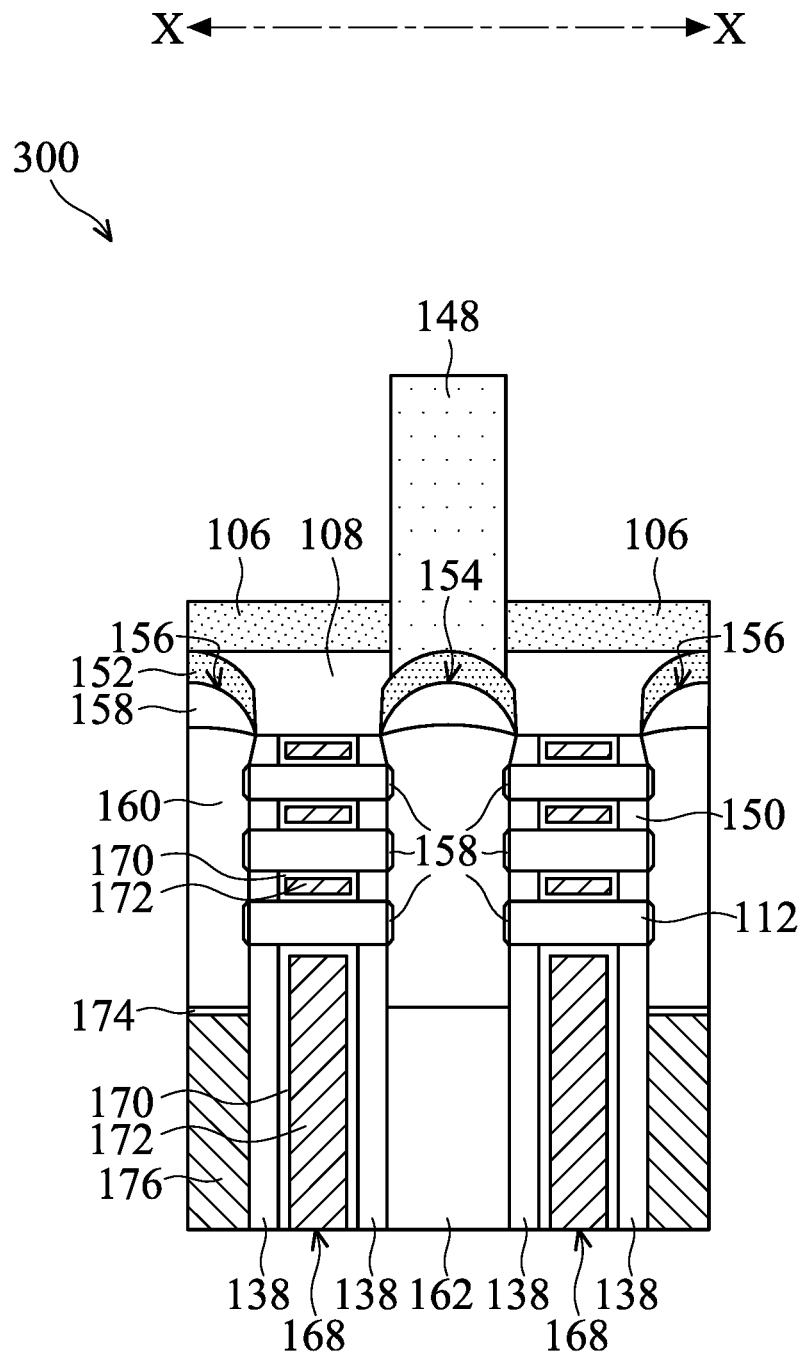
Figure 4F:
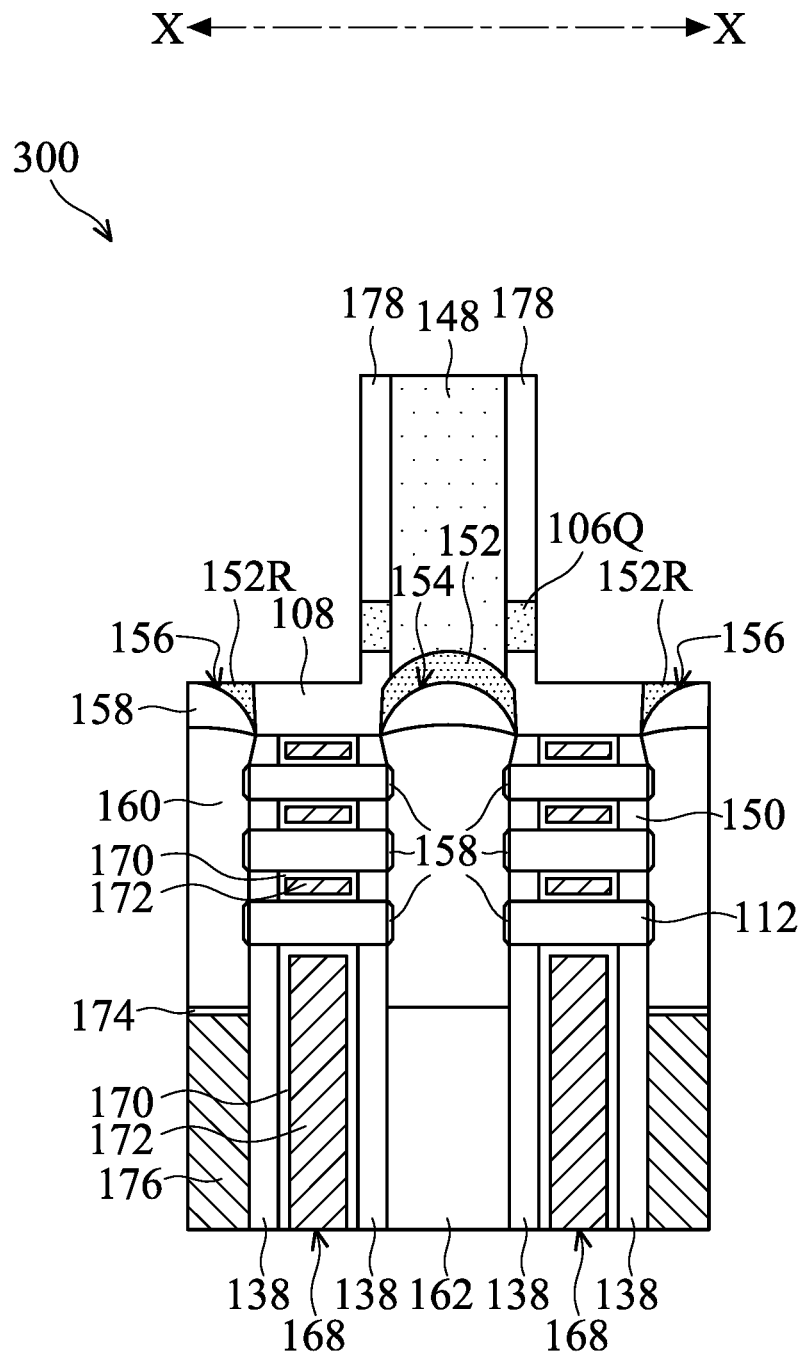
Figure 4G:
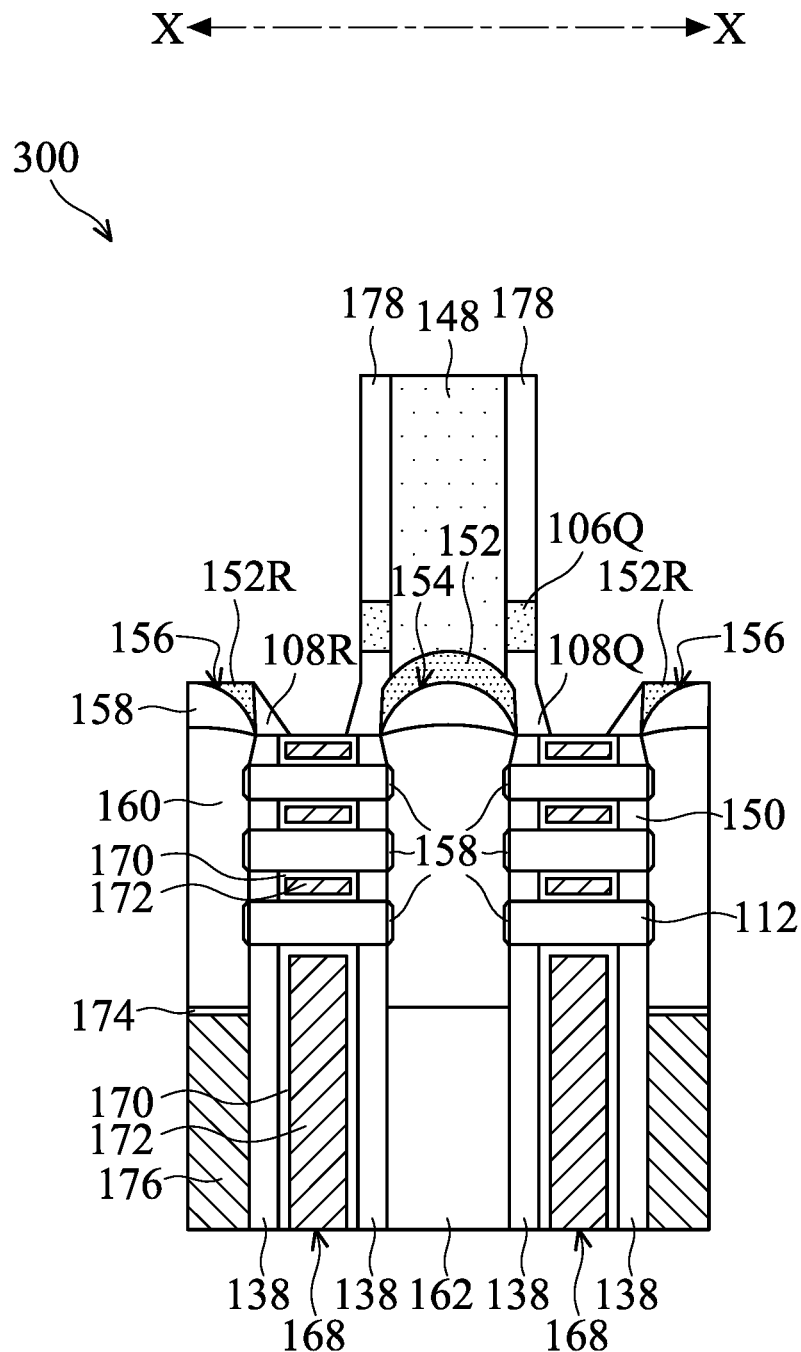
Figure 4H:
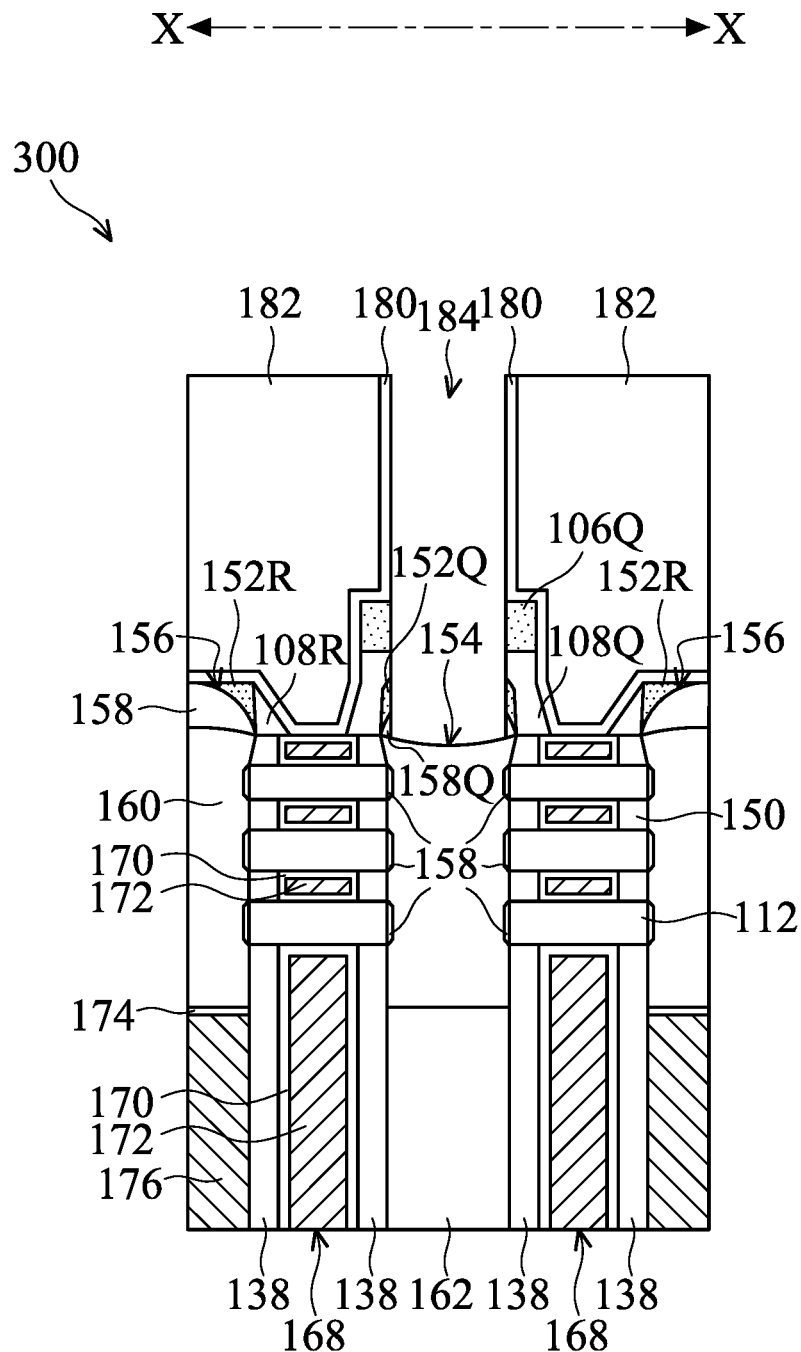
Figure 4I:
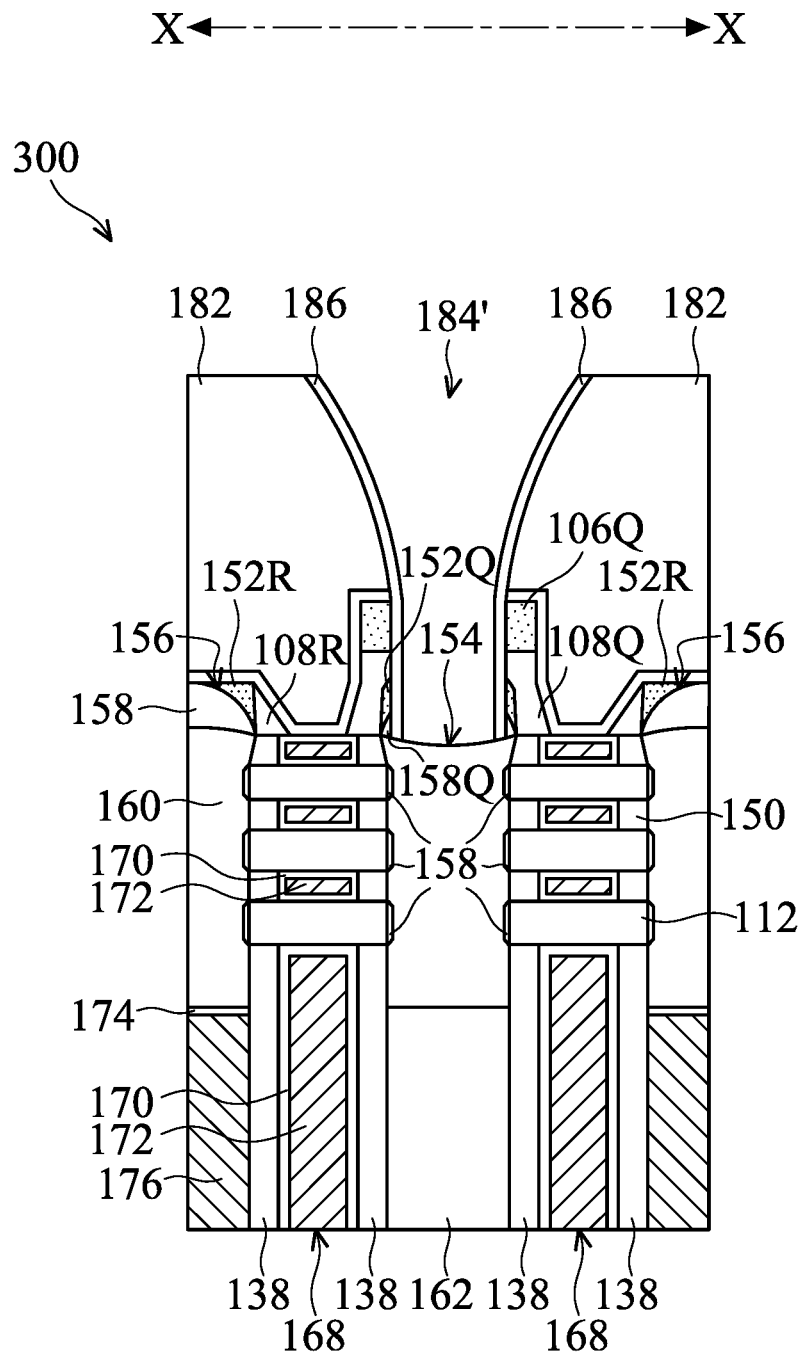
Figures 1, 4J:
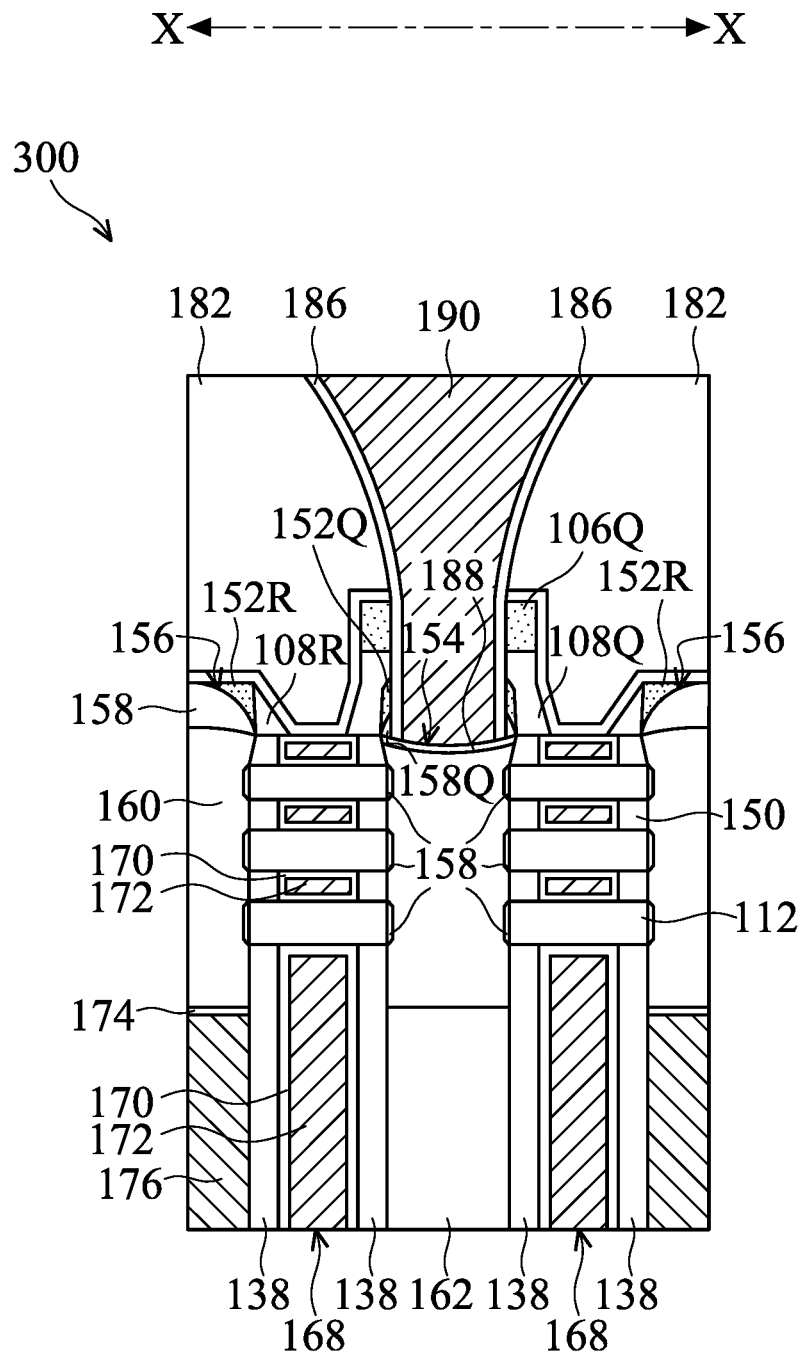
Figures 2, 4J:
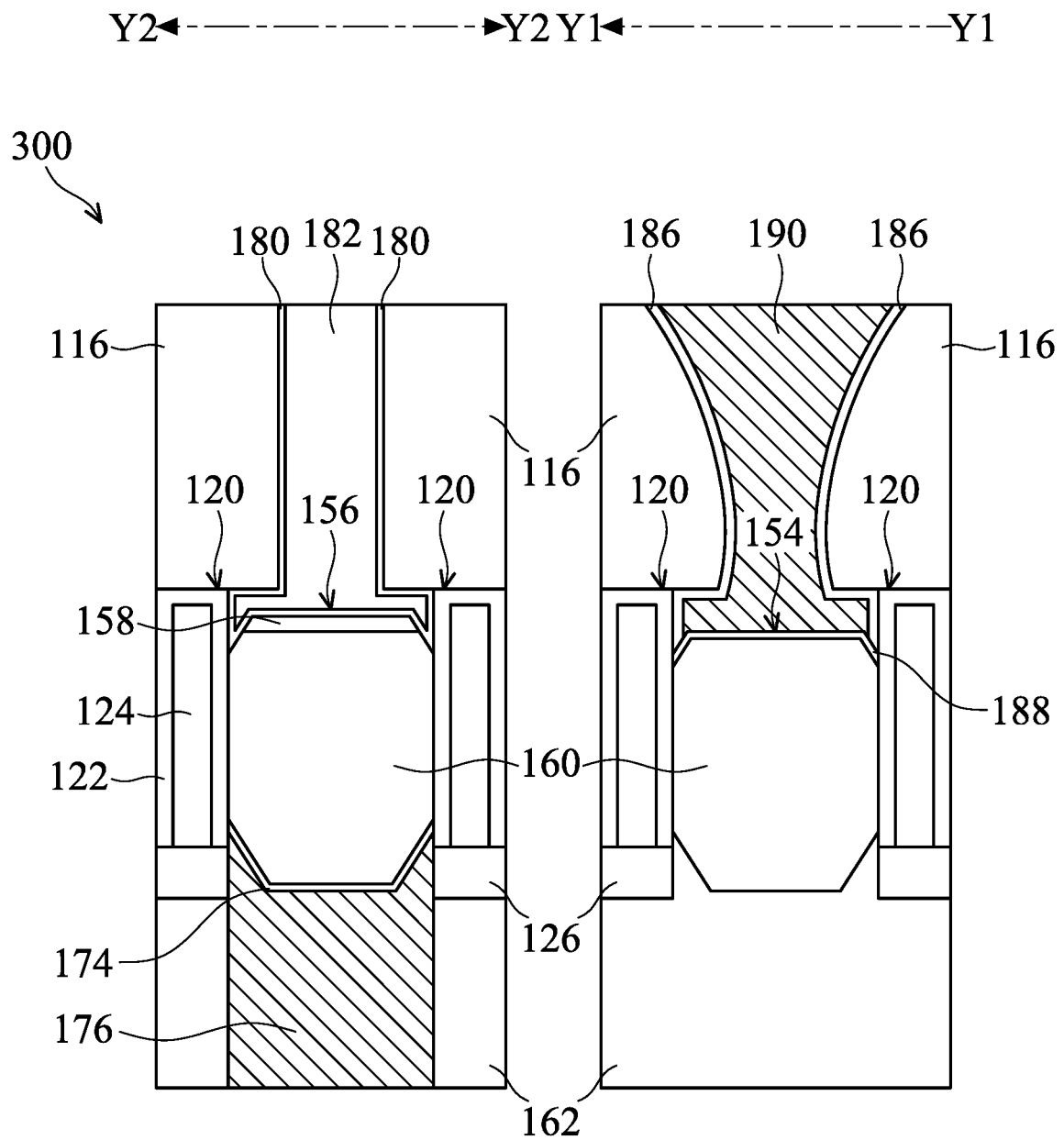

FIGS. 4A through 4I and FIGS. 4J-1 and 4J-2 are cross-sectional views illustrating the formation of a semiconductor structure at various intermediate stages, in which FIGS. 4A through 4I and FIG. 4J-1 are cross-sectional views corresponding to line X-X shown in FIG. 1 and FIG. 4J-2 is a cross-sectional view corresponding to lines Y1-Y1 and/or Y2-Y2 shown in FIG. 1, in accordance with some embodiments. The embodiments of FIGS. 4A through 4J-2 are similar to that shown in FIG. 2A-1 through 2V-2 except that a second protection layer 108 is thick and source/drain recesses 140 and 142 do not extend into the first protection layer 106.

A semiconductor structure 300 including a substrate 102 and a fin structure 104 is received or provided, as shown in FIG. 4A, in accordance with some embodiments. The semiconductor structure 300 is similar to the semiconductor structure 100 of FIG. 2A-1 except the thickness of the second protection layer 108. In some embodiments, the thickness of the second protection layer 108 is in a range from about 15 nm to about 20 nm. In some embodiments, the second protection layer 108 is thicker than the first protection layer 106. The second protection layer 108 may be thinner than, equal to or thicker than the second semiconductor layers 112.

FIG. 4B is a cross-sectional view of a semiconductor structure 300 after the formation of source/drain recesses 140 and 142, in accordance with some embodiments.

The steps as described above with respect to FIGS. 2B-1 through 2D-2 are performed on the semiconductor structure 300, in accordance with some embodiments. The source/drain regions of the fin structure 104 are recessed, thereby forming a first source/drain recess 140 and a second source/drain recess 142, as shown in FIG. 4B, in accordance with some embodiments. The source/drain recesses 140 and 142 pass through the alternating first and second semiconductor layer 110 and 112 and then through the second protection layer 108, in accordance with some embodiments. The source/drain recesses 140 and 142 do not extend into the first protection layer 106, in accordance with some embodiments.

FIG. 4C is a cross-sectional view of a semiconductor structure 300 after the formation of etching stop layers 152 and source/drain features 154 and 156, in accordance with some embodiments.

The steps as described above with respect to FIGS. 2E-1 through 2J-2 are performed on the semiconductor structure 300, in accordance with some embodiments. The first source/drain recess 140 is vertically enlarged to form a source/drain recess 140' (FIG. 2G) and a sacrificial contact 148 is then formed in the first source/drain recess 140' to fill a lower portion of the source/drain recess 140', as shown in FIG. 4C, in accordance with some embodiments.

In some embodiments, the sacrificial contact 148 is formed to have an upper surface substantially level with the bottom surface of the second source/drain recess 142. In some embodiments, the sacrificial contact 148 protrudes above the upper surface of the first protection layer 106, in accordance with some embodiments.

A plurality of inner spacer layers 150 is formed in the notches 144 (FIG. 2E-1), in accordance with some embodiments. Etching stop layers 152 are formed in the first source/drain recess 140' and the second source/drain recess 142, in accordance with some embodiments. A first source/drain feature 154 is formed over the etching stop layers 152 in the first source/drain recess 140' and a second source/drain feature 156 is formed over the etching stop layers 152 in the second source/drain recess 142, in accordance with some embodiments.

FIG. 4D is a cross-sectional view of a semiconductor structure 300 after turning upside down, in accordance with some embodiments.

The steps as described above with respect to FIGS. 2K-1 through 2N are performed on the semiconductor structure 300, in accordance with some embodiments. An interlayer dielectric layer 162 is formed over the source/drain features 154 and 156, in accordance with some embodiments. A channel releasing process is performed to form gate trenches 164 (FIG. 2L-1) and form nanostructure 112 and gaps 166 (FIG. 2L-1), in accordance with some embodiments. In some embodiments, the second protection layer 108 remains after the channel releasing process.

Final gate structures 168 are formed to wrap around the nanostructure 112, in accordance with some embodiments. A contact plug 176 is formed through the interlayer dielectric layer 162 and lands on the second source/drain feature 156, in accordance with some embodiments. A multilayer interconnect structure (not shown) may be formed over the frontside of the semiconductor structure 300. In some embodiments, the second source/drain feature 156 (e.g. the drain terminal) is electrically connected to the metals line of the frontside interconnect structure through the contact plug 176. Afterward, the semiconductor structure 300 is turned upside down and the substrate 102 is then removed, in accordance with some embodiments.

FIG. 4E is a cross-sectional view of a semiconductor structure 300 after the removal of the lower fin element 104L, in accordance with some embodiments.

The steps as described above with respect to FIG. 2O are performed on the semiconductor structure 300, in accordance with some embodiments. An etching process may be performed to remove the lower fin element 104L until the first protection layer 106 is exposed, in accordance with some embodiments.

FIG. 4F is a cross-sectional view of a semiconductor structure 300 after the formation of spacer layers 178 and an etching process, in accordance with some embodiments.

The steps as described above with respect to FIG. 2P are performed on the semiconductor structure 300, in accordance with some embodiments. Spacer layers 178 are formed on the opposite sides of the sacrificial layer 148, as shown in FIG. 4F, in accordance with some embodiments. An etching process is then performed on the semiconductor structure 300 to remove the first protection layer 106, the second protection layer 108 and the etching stop layer 152, in accordance with some embodiments. The etching process may be an anisotropic etching process, e.g., dry plasma etching.

In some embodiments, portions of the first protection layer 106 and the second protection layer 108 uncovered by the spacer layers 178 are removed during the etching process. In some embodiments, a portion of the first protection layer 106 covered by the spacer layers 178 remains above the inner spacer layer 150 and is referred to as a protection feature 106Q. In some embodiments, a portion of the etching stop layer 152 sandwiched between the second protection layer 108 and the buffer layer 158 of the second source/drain feature 156 remains and is referred to as an etching stop feature 152R.

FIG. 4G is a cross-sectional view of a semiconductor structure 300 after an etching process, in accordance with some embodiments.

An etching process is performed on the semiconductor structure 300 to remove the second protection layer 108, in accordance with some embodiments. The etching process is performed until the gate dielectric layer 170 of the final gate stack 168 is exposed, as shown in FIG. 4G, in accordance with some embodiments.

The etching process may be an isotropic etching process, e.g., wet plasma etching. In some embodiments, (111) crystalline surface of the second protection layer 108 has slower etching rate than the etching rate of (100) crystalline surface and/or (110) crystalline surface of the second protection layer 108. As a result, some portions of the second protection layer 108 may remain after the etching process and the exposed surface of the second protection layer 108 may be (111) crystalline facets/surfaces.

In some embodiments, a portion of the second protection layer 108 covered by the spacer layers 178 remains above the inner spacer layer 150 and is referred to as a protection feature 108Q. The protection feature 108Q abuts and overlaps portion of the etching stop layer 152 and the buffer layer 158 of the second source/drain feature 156, in accordance with some embodiments. In some embodiments, a portion of the second protection layer 108 abutting the etching stop feature 152R remains above the inner spacer layer 150 and is referred to as a protection feature 108R.

FIG. 4H is a cross-sectional view of a semiconductor structure 300 after the removal of the sacrificial contact 148, the protection layer 152 and the buffer layer 158 of the first source/drain feature 154, in accordance with some embodiments.

The steps as described above with respect to FIGS. 2S and 2T are performed on the semiconductor structure 300, in accordance with some embodiments. A dielectric lining layer 180 is conformally formed over the semiconductor structure 300 and an insulating layer 182 is formed over the dielectric lining layer 180, as shown in FIG. 4H, in accordance with some embodiments. The sacrificial contact 148 and the underlying protection layer 152 are etched away to from a contact opening 184, in accordance with some embodiments. The buffer layer 158 of the first source/drain feature 154 is then removed, in accordance with some embodiments.

In some embodiments, portions of the etching stop layer 152 and the buffer layer 158 of the second source/drain feature 156 uncovered by the protection feature 108R are removed during the etching process. In some embodiments, a portion of the etching stop layer 152 and the buffer layer 158 of the second source/drain feature 156 covered by the protection feature 108R remain above the bulk layer 160 and are referred to as an etching stop feature 152Q and a buffer feature 158Q respectively.

FIG. 4I is a cross-sectional view of a semiconductor structure 300 after an corner-rounding process and the formation of a dielectric lining layer 186, in accordance with some embodiments.

The steps as described above with respect to FIG. 2U are performed on the semiconductor structure 300, in accordance with some embodiments. A corner-rounding process is performed on the semiconductor structure 300 such that the contact opening 184 is enlarged to form contact opening 184', as shown in FIG. 4I, in accordance with some embodiments. A dielectric lining layer 186 is conformally formed along the sidewalls of the contact opening 184, in accordance with some embodiments.

FIGS. 4J-1 and 4J-2 are cross-sectionals view of a semiconductor structure 300 after the formation of a silicide layer 188 and a contact plug 190, in accordance with some embodiments.

The steps as described above with respect to FIGS. 2V-1 and 2V-2 are performed on the semiconductor structure 300, in accordance with some embodiments. A silicide layer 188 is formed on the bulk layer 160 of the first source/drain feature 154 in the contact opening 184', as shown in FIGS. 4J-1 and 4J-2, in accordance with some embodiments. A contact plug 190 is formed over the silicide layer 188 in the contact opening 184', in accordance with some embodiments.

In some embodiments, the semiconductor structure 300 also includes the protection feature 108Q and the protection feature 106Q over the protection feature 108Q. The protection features 106Q and 108Q are vertically sandwiched between the insulating layer 182 and the inner spacer layer 150 and laterally sandwiched between the insulating layer 182 and the contact plug 190.

A multilayer interconnect structure (not shown) may be formed over the backside of the semiconductor structure 300. In some embodiments, the first source/drain feature 154 (e.g. the source terminal) is electrically connected to the power rails of the backside interconnect structure through the contact plug 190.

Figure 5A:
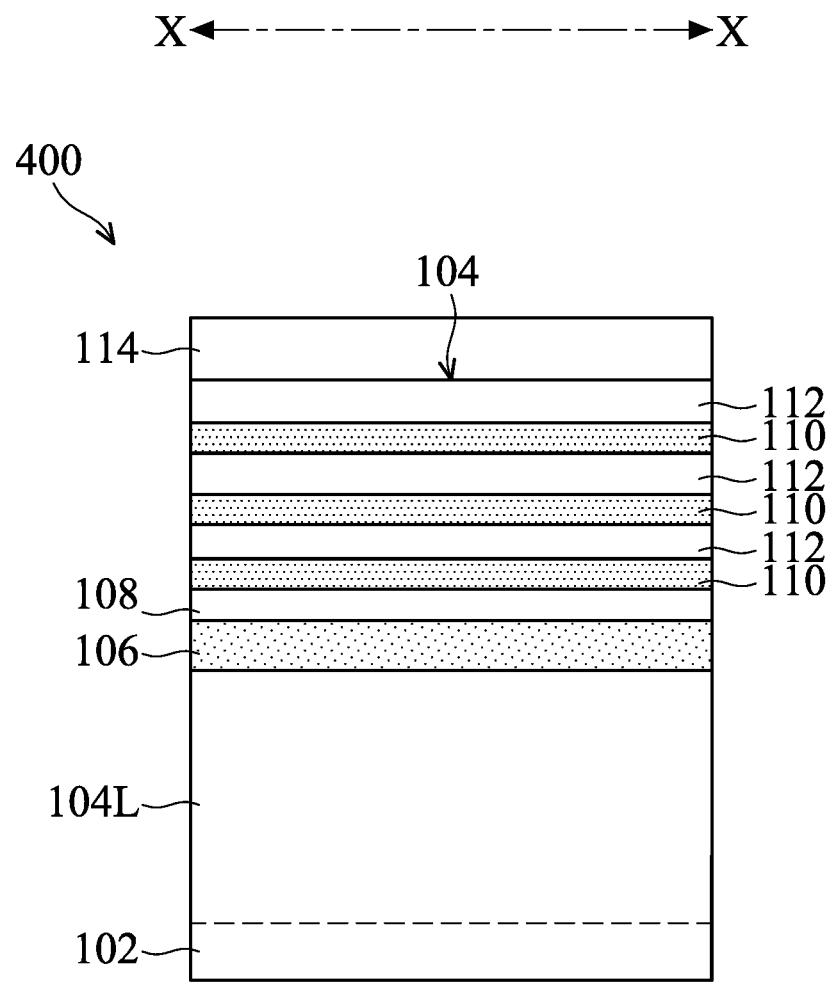
Figure 5B:
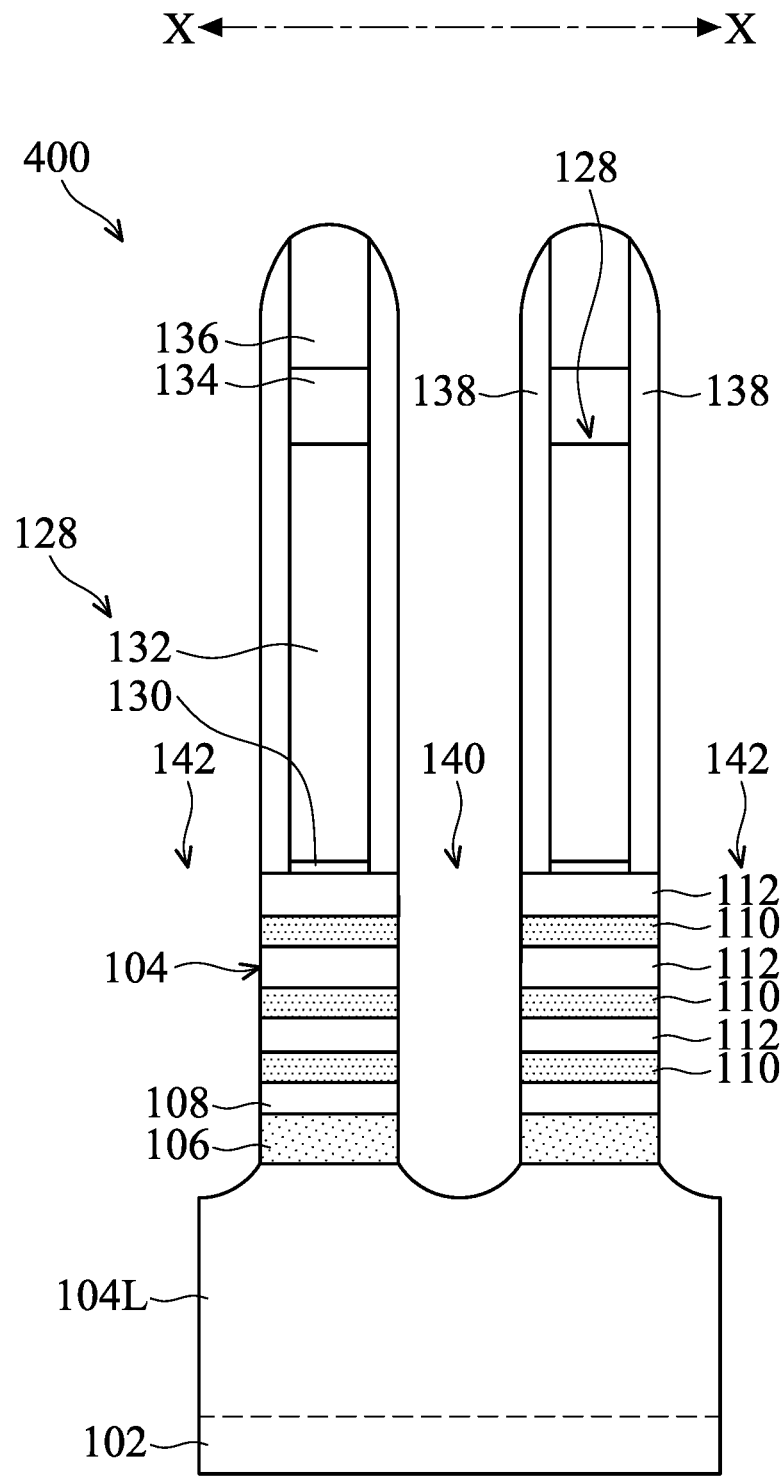
Figure 5C:
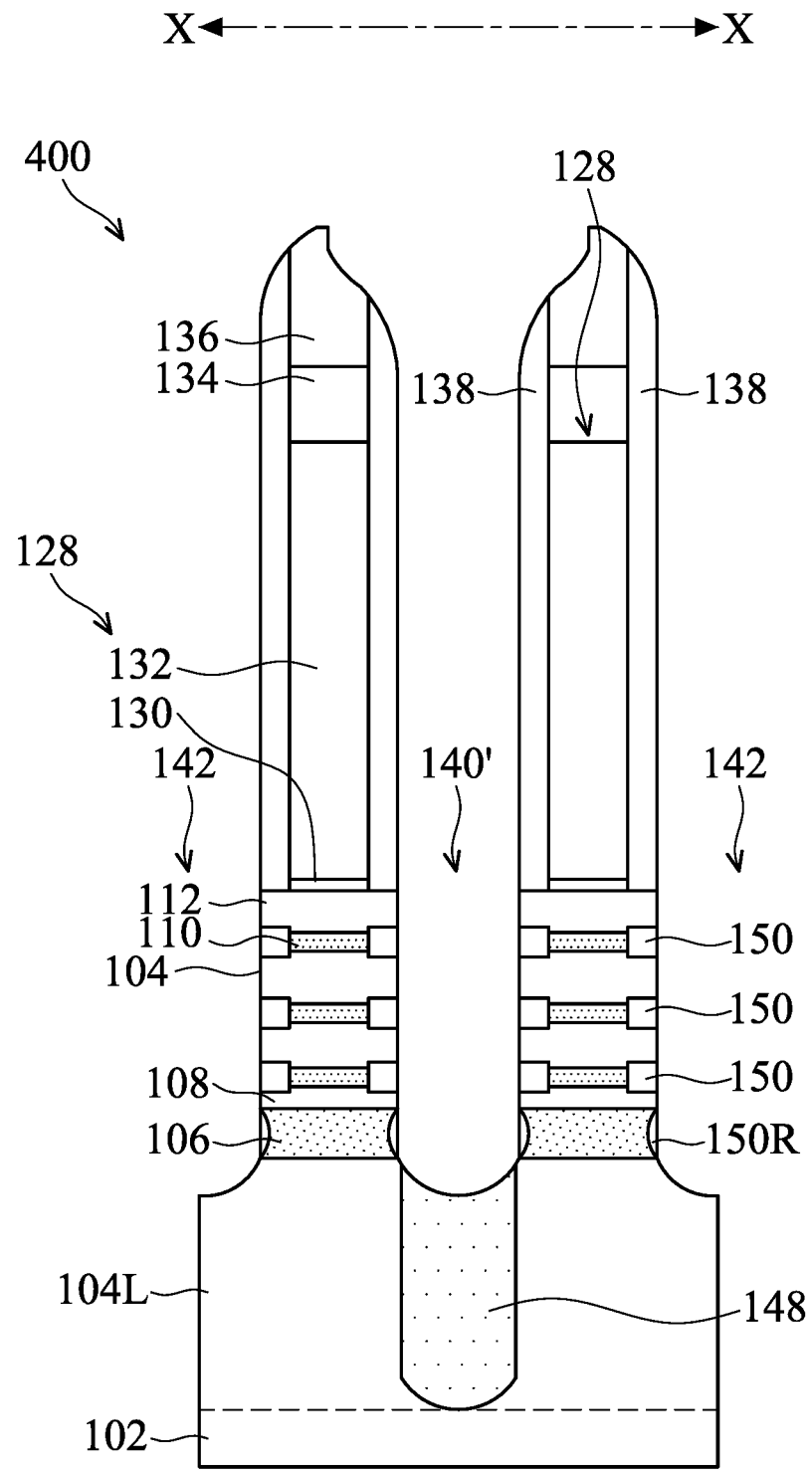
Figure 5D:
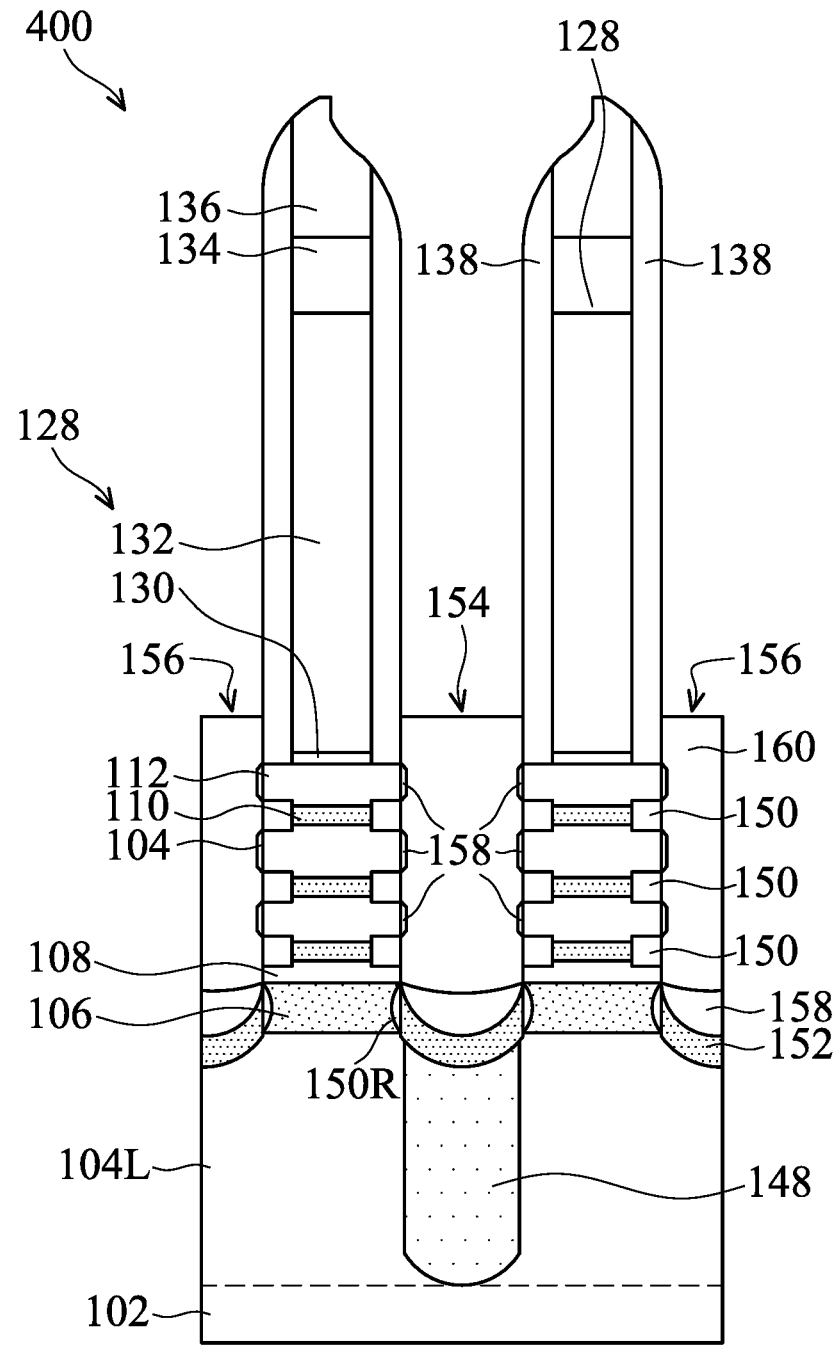
Figure 5E:
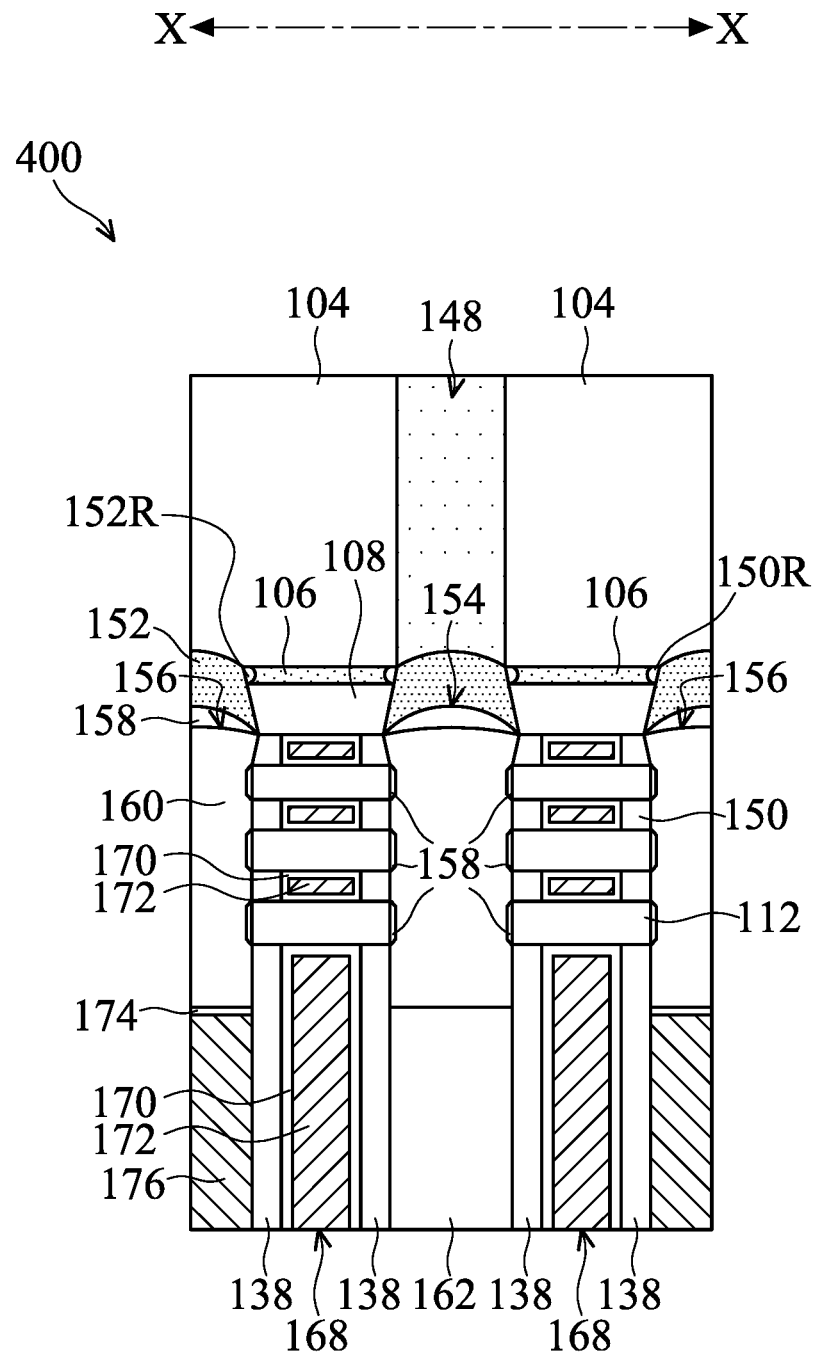
Figure 5F:
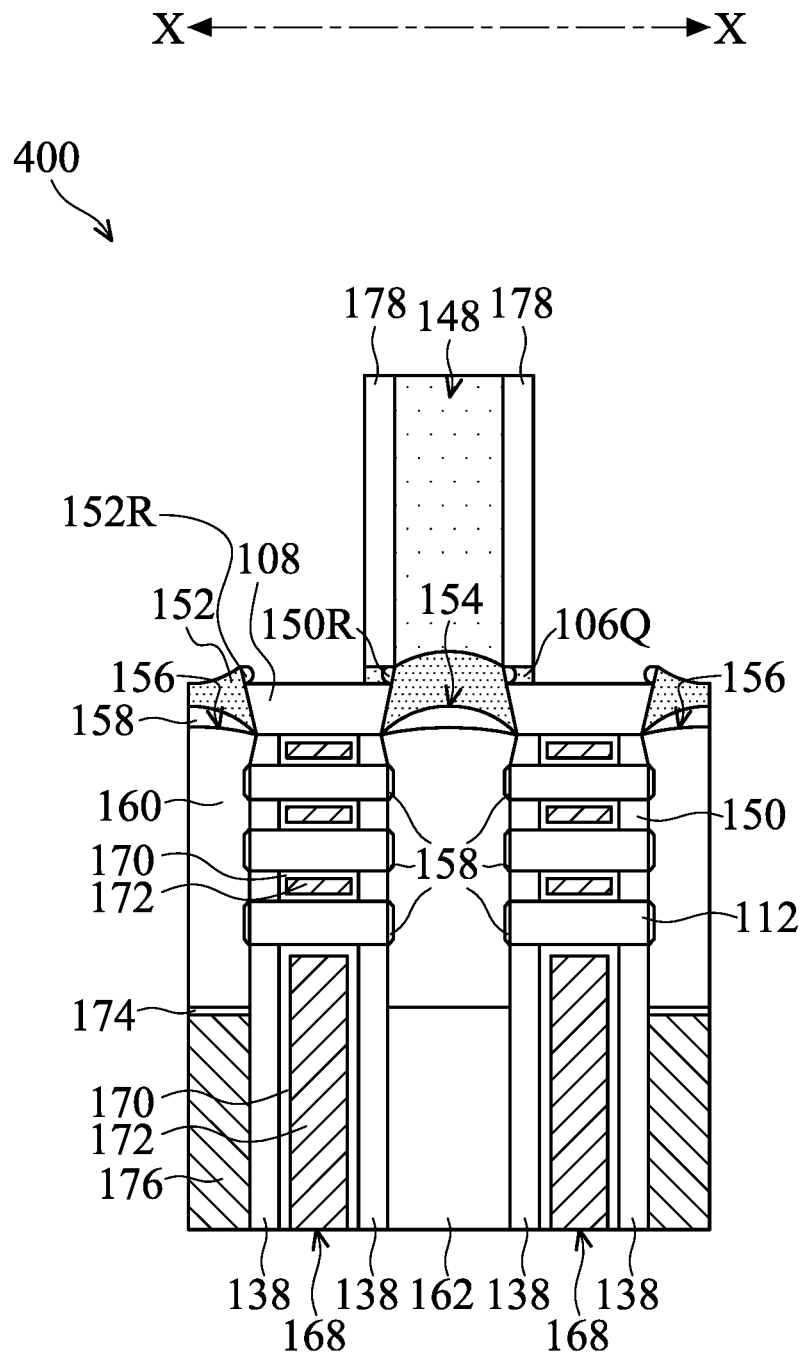
Figure 5G:
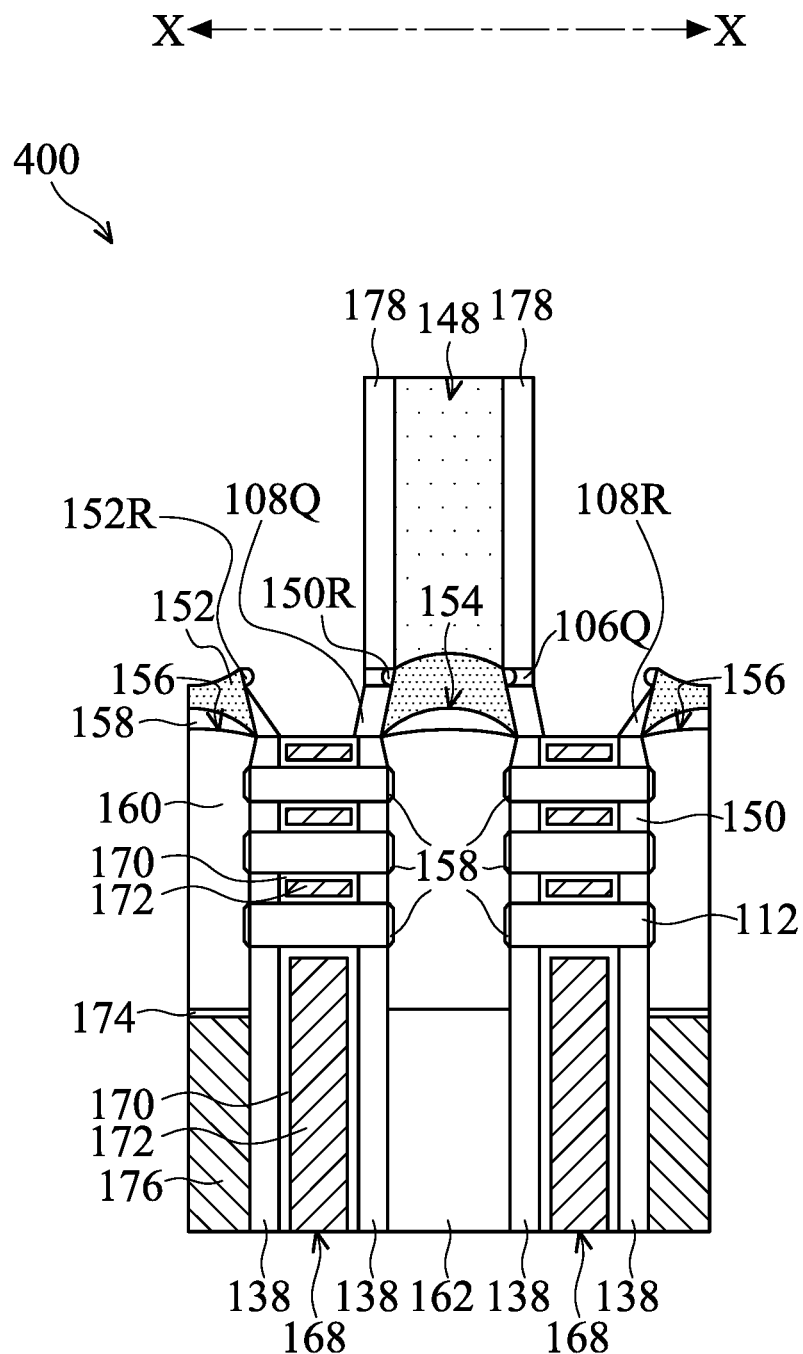
Figure 5H:
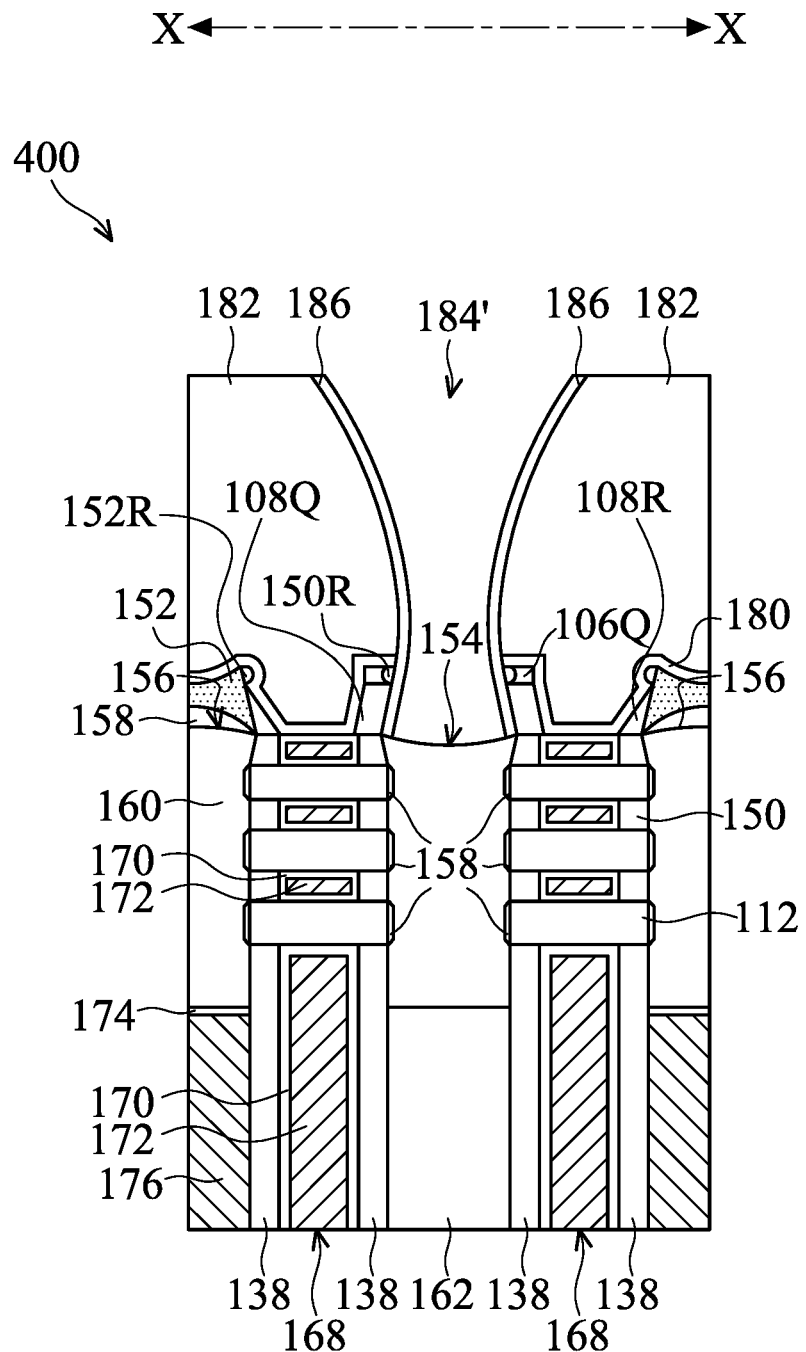
Figures 1, 5I:
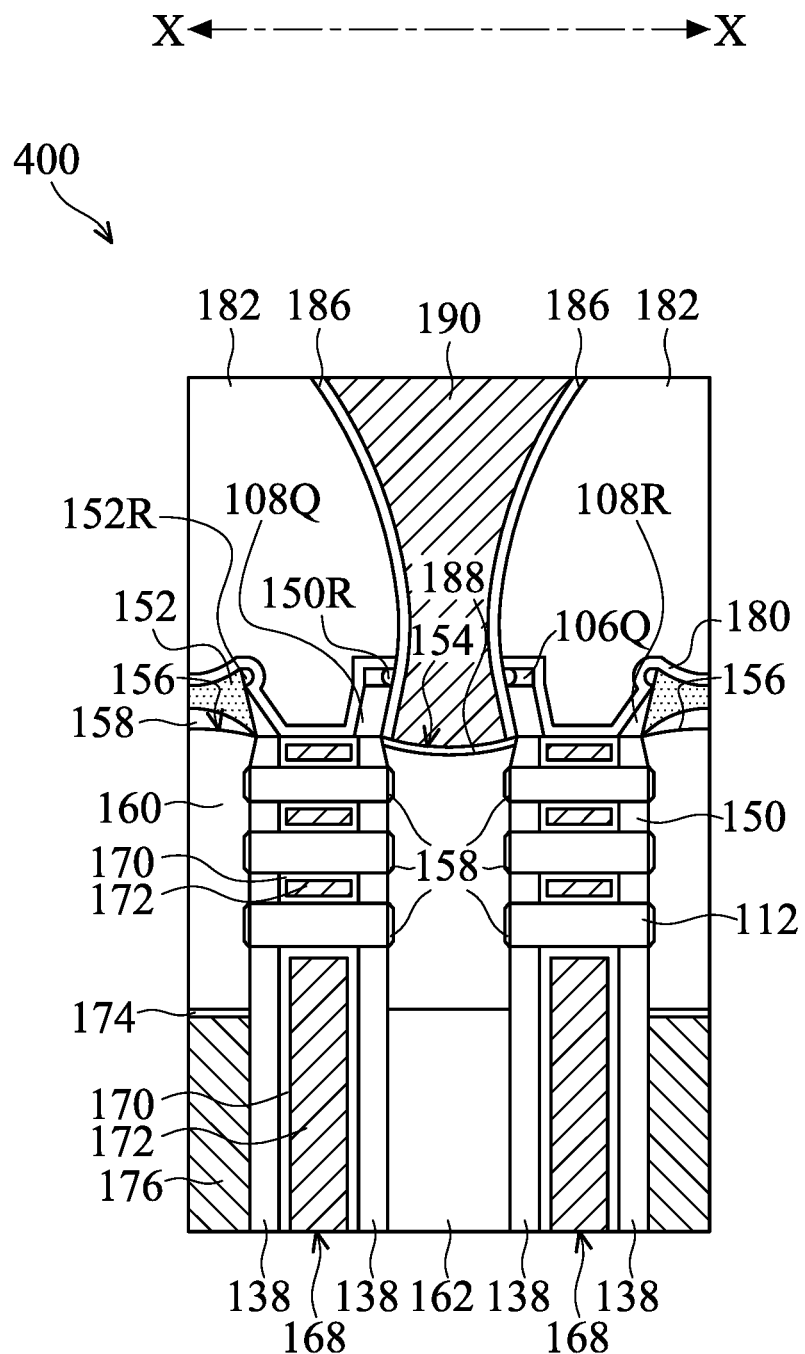
Figures 2, 5I:
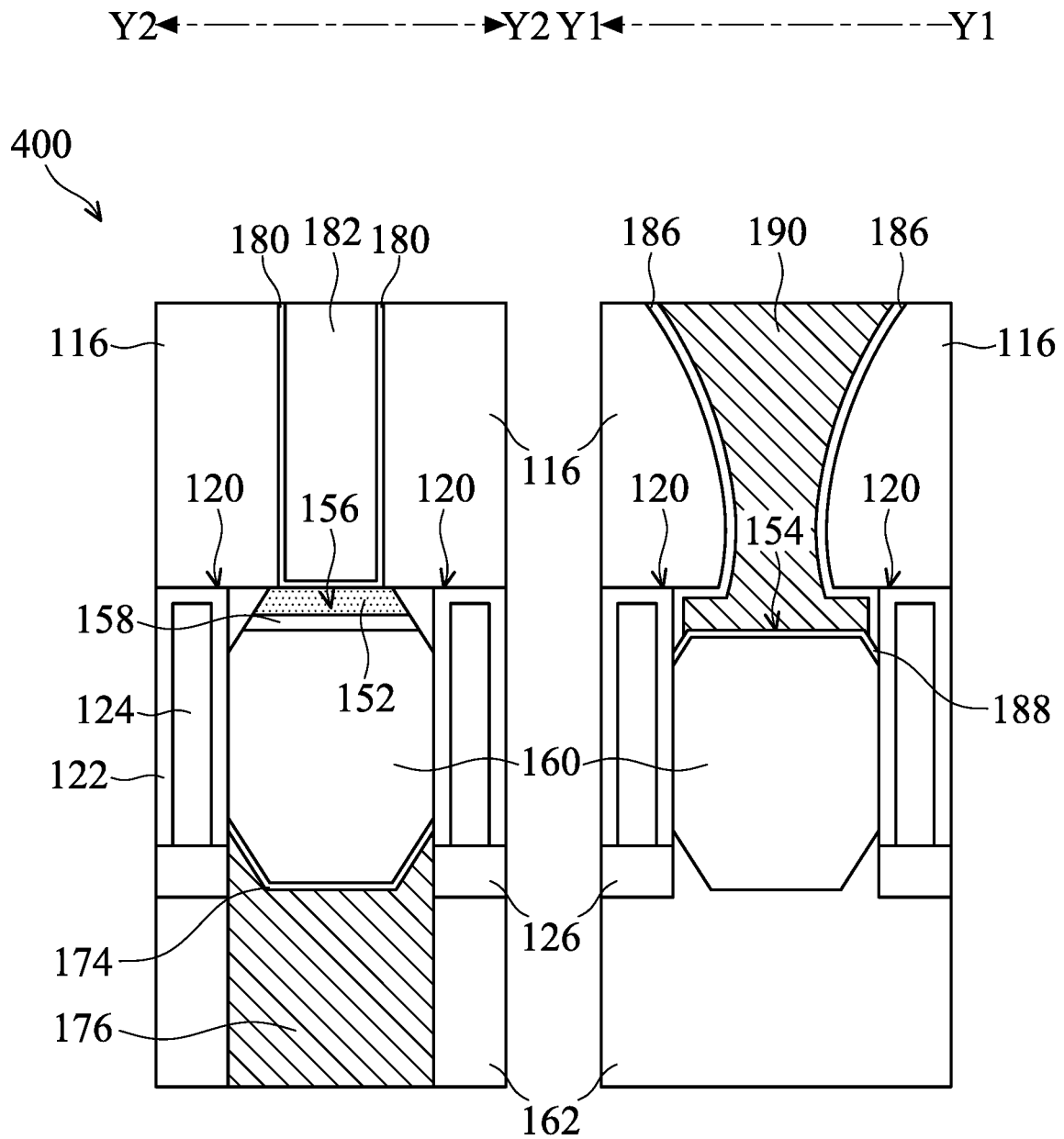

FIGS. 5A through 5H and FIGS. 5I-1 and 5I-2 are cross-sectional views illustrating the formation of a semiconductor structure at various intermediate stages, in which FIGS. 5A through 5H and FIG. 5I-1 are cross-sectional views corresponding to line X-X shown in FIG. 1 and FIG. 5I-2 is a cross-sectional view corresponding to lines Y1-Y1 and Y2-Y2 shown in FIG. 1, in accordance with some embodiments. The embodiments of FIGS. 5A through 5I-2 are similar to that shown in FIG. 2A-1 through 2V-2 except that a second protection layer 108 is thick and the percentage of germanium in the first protection layer 106 is greater.

A semiconductor structure 400 including a substrate 102 and a fin structure 104 is received or provided, as shown in FIG. 5A, in accordance with some embodiments. The semiconductor structure 400 is similar to the semiconductor structure 100 of FIG. 2A-1. The percentage of germanium in the first protection layer 106 may be greater than the first protection layer 106 as shown in FIG. 2A-1. For example, the percentage of germanium in the first protection layer 106 may be in a range from about 25 atomic % to about 45 atomic %. In some embodiments, the thickness of the second protection layer 108 is in a range from about 5 nm to about 8 nm.

FIG. 5B is a cross-sectional view of a semiconductor structure 400 after the formation of source/drain recesses 140 and 142, in accordance with some embodiments.

The steps as described above with respect to FIGS. 2B-1 through 2D-2 are performed on the semiconductor structure 400, in accordance with some embodiments. The source/drain regions of the fin structure 104 are recessed, thereby forming a first source/drain recess 140 and a second source/drain recess 142, as shown in FIG. 5B, in accordance with some embodiments. The source/drain recesses 140 and 142 pass through the alternating first and second semiconductor layer 110 and 112, then through the second protection layer 108, and then through the first protection layer 106, in accordance with some embodiments.

FIG. 5C is a cross-sectional view of a semiconductor structure 400 after the formation of inner spacer layers 150 and the sacrificial layer 148, in accordance with some embodiments.

The steps as described above with respect to FIGS. 2E-1 through 2I-2 are performed on the semiconductor structure 400, in accordance with some embodiments. An etching process is performed to form notches 144 (FIG. 2E-1), in accordance with some embodiments. In some embodiments, the first protection layer 106 contains greater germanium concentration, and thus the first protection layer 106 is also laterally recessed to form a notch 144 between the second protection layer 108 and the lower fin element 104L.

A dielectric material 146 (FIG. 2F) is conformally formed over the semiconductor structure 400 and overfills the notches 144, in accordance with some embodiments. The first source/drain recess 140 is vertically enlarged to form a source/drain recess 140' and a sacrificial contact 148 is then formed in the first source/drain recess 140' to fill a lower portion of the source/drain recess 140', in accordance with some embodiments.

In some embodiments, the sacrificial contact 148 is formed to have an upper surface substantially level with bottom surface of the second source/drain recess 142. In some embodiments, the sacrificial contact 148 does not protrude above the bottom surface of the first protection layer 106, in accordance with some embodiments.

A pull-back process is performed on the dielectric material 146 to form a plurality of inner spacer layers 150 in the notches 144, as shown in FIG. 5C, in accordance with some embodiments. The dielectric material layer remaining on the first protection layer 106 is referred to as a dielectric feature 150R.

FIG. 5D is a cross-sectional view of a semiconductor structure 400 after the formation of etching stop layers 152 and source/drain features 154 and 156, in accordance with some embodiments.

The steps as described above with respect to FIGS. 2J-1 and 2J-2 are performed on the semiconductor structure 400, in accordance with some embodiments. Etching stop layers 152 are formed in the first source/drain recess 140' and the second source/drain recess 142, in accordance with some embodiments. A first source/drain feature 154 is formed over the etching stop layers 152 in the first source/drain recesses 140' and a second source/drain feature 156 is formed over the etching stop layers 152 in the second source/drain recess 142, in accordance with some embodiments.

FIG. 5E is a cross-sectional view of a semiconductor structure 400 after turning upside down, in accordance with some embodiments.

The steps as described above with respect to FIGS. 2K-1 through 2N are performed on the semiconductor structure 400, in accordance with some embodiments. An interlayer dielectric layer 162 is formed over the source/drain features 154 and 156, in accordance with some embodiments. A channel releasing process is performed to form gate trenches 164 (FIG. 2L-1) and form nanostructure 112 and gaps 166 (FIG. 2L-1), in accordance with some embodiments. In some embodiments, the second protection layer 108 remains after the channel releasing process.

Final gate structures 168 are formed to wrap around the nanostructure 112, in accordance with some embodiments. A contact plug 176 is formed through the interlayer dielectric layer 162 and lands on the second source/drain feature 156, in accordance with some embodiments. A multilayer interconnect structure (not shown) may be formed over the frontside of the semiconductor structure 400. In some embodiments, the second source/drain feature 156 (e.g. the drain terminal) is electrically connected to the metals line of the frontside interconnect structure through the contact plug 176. Afterward, the semiconductor structure 400 is turned upside down and the substrate 102 is then removed, as shown in FIG. 5E, in accordance with some embodiments.

FIG. 5F is a cross-sectional view of a semiconductor structure 400 after the formation of spacer layers 178 and an etching process, in accordance with some embodiments.

The steps as described above with respect to FIGS. 2O through 2Q are performed on the semiconductor structure 400, in accordance with some embodiments. The lower fin element 104L is removed and spacer layers 178 are formed on the opposite sides of the sacrificial layer 148, in accordance with some embodiments. An etching process is then performed on the semiconductor structure 400 to remove the first protection layer 106 and a portion of the etching stop layer 152 until the second protection layer 108 is exposed, in accordance with some embodiments. After the etching process, the dielectric features 150R are also exposed, in accordance with some embodiments. In some embodiments, a portion of the first protection layer 106 covered by the spacer layers 178 remains above the inner spacer layer 150, abuts the dielectric feature 150R and is referred to as a protection feature 106Q.

FIG. 5G is a cross-sectional view of a semiconductor structure 400 after an etching process, in accordance with some embodiments.

An etching process is performed on the semiconductor structure 400 to remove the second protection layer 108, in accordance with some embodiments. The etching process is performed until the gate dielectric layer 170 of the final gate stack 168 is exposed, as shown in FIG. 5G, in accordance with some embodiments.

In some embodiments, a portion of the second protection layer 108 covered by the spacer layers 178 remains above the inner spacer layer 150 and is referred to as a protection feature 108Q. In some embodiments, a portion of the second protection layer 108 abutting the etching stop layer 152 remains above the inner spacer layer 150 and is referred to as a protection feature 108R.

FIG. 5H is a cross-sectional view of a semiconductor structure 400 after formation of a contact opening 184' and a dielectric lining layer 186, in accordance with some embodiments.

The steps as described above with respect to FIGS. 2S and 2U are performed on the semiconductor structure 400, in accordance with some embodiments. A dielectric lining layer 180 is conformally formed over the semiconductor structure 400 and an insulating layer 182 is formed over the dielectric lining layer 180, in accordance with some embodiments. The sacrificial contact 148, the protection layer 152 and the buffer layer 158 of the first source/drain feature 154 to form a contact opening 184, in accordance with some embodiments. A corner-rounding process is performed on the semiconductor structure 400 such that the contact opening 184 is laterally enlarged to form contact opening 184', as shown in FIG. 5H, in accordance with some embodiments. A dielectric lining layer 186 is conformally formed along the sidewalls of the contact opening 184', in accordance with some embodiments.

FIGS. 5I-1 and 5I-2 are cross-sectionals view of a semiconductor structure 400 after the formation of a silicide layer 188 and a contact plug 190, in accordance with some embodiments.

The steps as described above with respect to FIGS. 2V-1 and 2V-2 are performed on the semiconductor structure 400, in accordance with some embodiments. A silicide layer 188 is formed on the bulk layer 160 of the first source/drain feature 154 in the contact opening 184', as shown in FIGS. 5I-1 and 5I-2, in accordance with some embodiments. A contact plug 190 is formed over the silicide layer 188 in the contact opening 184', in accordance with some embodiments. A multilayer interconnect structure (not shown) may be formed over the backside of the semiconductor structure 400. In some embodiments, the first source/drain feature 154

(e.g. the source terminal) is electrically connected to the power rails of the backside interconnect structure through the contact plug 190.

As described above, the aspect of the embodiments of the present disclosure is direct to a semiconductor structure having a backside power rail and the method for forming the semiconductor structure. The method includes forming a fin structure 104 including a protection layer 106 and alternating first and second semiconductor layers 110 and 112. After source/drain features 154 and 156 and a gate stack 168 are formed over the frontside of the semiconductor structure, the semiconductor structure is turned upside down and a lower fin element 104L of the fin structure 104 is etched away using the protection layer 106 as an etching stop layer. The protection layer 106 may protect the corners of the first source/drain feature 154 from being damaged during the etching process. Therefore, the manufacturing yield and reliability of the semiconductor device are improved.

Embodiments of a method for forming a semiconductor structure may be provided. The method may include forming a fin structure including a protection layer over a substrate and alternating first and second semiconductor layers over a protection layer. The method may also include forming a source/drain recess, forming a sacrificial contact in the source/drain recess, and forming a source/drain feature over the sacrificial contact in the source/drain recess. The method may also include removing the substrate, thereby exposing the protection layer and the sacrificial contact, and replacing the sacrificial contact with a contact plug. The protection layer may protect the corners of the source/drain feature from being damaged during the etching process. Therefore, the manufacturing yield and reliability of the semiconductor device are improved.

In some embodiments, a method for forming a semiconductor structure is provided. The method includes forming a fin structure over a substrate. The fin structure includes a protection layer and alternating first semiconductor layers and second semiconductor layers over the protection layer. The method also includes etching the fin structure to form a source/drain recess, forming a sacrificial contact in the source/drain recess, and forming a source/drain feature over the sacrificial contact in the source/drain recess. The method also includes removing the first semiconductor layers of the fin structure, thereby forming a plurality of nanostructures from the second semiconductor layers of the fin structure, and forming a gate stack wrapping around the nanostructures. The method also includes removing the substrate, thereby exposing the protection layer and the sacrificial contact, etching the protection layer, thereby exposing the gate stack, and replacing the sacrificial contact with a contact plug.

In some embodiments, a semiconductor structure is provided. The semiconductor structure includes a plurality of nanostructures vertically stacked and separated from another, a gate stack wrapping around the plurality of nanostructures, and a source/drain feature adjoining the plurality of nanostructures. The semiconductor structure also includes an insulating layer over the gate stack and the source/drain feature, a contact plug in the insulating layer and landing on the source/drain feature, and a semiconductor protection feature laterally sandwiched between the insulating layer and the contact plug.

In some embodiments, a semiconductor structure is provided. The semiconductor structure includes a plurality of nanostructures vertically stacked and separated from another, a gate stack wrapping around the plurality of nanostructures, and a first source/drain feature adjoining a first side of the plurality of nanostructures. The semiconductor structure also includes a first contact plug below the first source/drain feature, an insulating layer over the first source/drain feature and the gate stack, and an etching stop feature vertically sandwiched between the first source/drain feature and the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming a semiconductor structure, comprising:
sequentially stacking a first SiGe layer and a first Si layer over a substrate;
alternatingly stacked second SiGe layers and second Si layers over first Si layer, wherein a germanium concentration of the first SiGe layer is lower than a germanium concentration of the second SiGe layers;
patterning the second Si layers, the second SiGe layers, the first Si layer, the first SiGe layer and the substrate to form a fin structure;
forming a first source/drain recess in the fin structure;
forming a sacrificial contact in the first source/drain recess;
forming an etching stop layer on the sacrificial contact in the first source/drain recess;
forming a first source/drain feature on the etching stop layer in the first source/drain recess;
removing the second SiGe layers and the first Si layer to form gaps; and
forming a gate stack to fill the gaps.

2. The method for forming the semiconductor structure as claimed in claim 1, further comprising:
turning the substrate upside down;
removing the substrate;
removing the first SiGe layer;
removing the sacrificial contact and the etching stop layer to expose a bottom surface of the first source/drain feature; and
forming a contact plug landing on the bottom surface of the first source/drain feature.

3. The method for forming the semiconductor structure as claimed in claim 1, further comprising:
forming a second source/drain recess in the fin structure, wherein the second source/drain recess is shallower than the first source/drain recess;
forming a second source/drain feature in the second source/drain recess; and
forming a contact plug landing on a top surface of the second source/drain feature.

4. The method for forming the semiconductor structure as claimed in claim 1, wherein the etching stop layer in direct contact a sidewall of the first SiGe layer.

5. A method for forming a semiconductor structure, comprising:

forming a fin structure in which a first SiGe layer, a second SiGe layer and a Si layer are sequentially stacked over a fin element;
forming a sacrificial contact through the fin element;
forming a source/drain feature over the sacrificial contact through the Si semiconductor layer and the second SiGe layer;
removing the second SiGe layer;
forming a gate stack to surround the Si layer;
replacing the fin element with an insulating layer;
removing the sacrificial contact to form an opening; and
forming a contact plug in the opening.

6. The method for forming the semiconductor structure as claimed in claim 5, wherein a germanium concentration of the first SiGe layer is lower than a germanium concentration of the second SiGe layer.

7. The method for forming the semiconductor structure as claimed in claim 5, further comprising:
forming a dielectric lining layer between the insulating layer and the sacrificial contact.

8. The method for forming the semiconductor structure as claimed in claim 5, further comprising:
laterally enlarging the opening.

9. The method for forming the semiconductor structure as claimed in claim 5, wherein replacing the fin element with the insulating layer comprises:
removing the fin element to expose the first SiGe layer and the sacrificial contact; and
forming the insulating layer to surround the sacrificial contact.

10. The method for forming the semiconductor structure as claimed in claim 9, further comprising, after removing the fin element and before forming the insulating layer:
forming a spacer layer alongside the sacrificial contact;
removing the first SiGe layer to expose the gate stack; and
removing the spacer layer.

11. The method for forming the semiconductor structure as claimed in claim 5, further comprising:
forming a source/drain recess through the fin structure;
forming the sacrificial contact in the source/drain recess;
forming an etching stop layer on the sacrificial contact in the source/drain recess; and
forming the source/drain feature on the semiconductor etching stop layer in the source/drain recess.

12. The method for forming the semiconductor structure as claimed in claim 11, further comprising:
removing the etching stop layer to expose the source/drain feature before forming the contact plug in the opening.

13. A method for forming a semiconductor structure, comprising:
forming a fin structure over a substrate, the fin structure including a protection layer and alternating first semiconductor layers and second semiconductor layers over the protection layer;
etching the fin structure to form a source/drain recess;
forming a sacrificial contact in the source/drain recess;
forming a source/drain feature over the sacrificial contact in the source/drain recess;
removing the first semiconductor layers of the fin structure, thereby forming a plurality of nanostructures from the second semiconductor layers of the fin structure;
forming a gate stack wrapping around the nanostructures;
removing the substrate thereby exposing the protection layer and the sacrificial contact;
etching the protection layer thereby exposing the gate stack; and
replacing the sacrificial contact with a contact plug.

14. The method for forming the semiconductor structure as claimed in claim 13, wherein the sacrificial contact is formed to have an upper surface above a bottom surface of the protection layer.

15. The method for forming the semiconductor structure as claimed in claim 13, wherein the sacrificial contact is formed to have an upper surface below a bottom surface of the protection layer.

16. The method for forming the semiconductor structure as claimed in claim 13, wherein forming the source/drain feature comprises:
forming a buffer layer over the sacrificial contact; and
forming a bulk layer over the buffer layer.

17. The method for forming the semiconductor structure as claimed in claim 16, further comprising:
forming an insulating layer to surround the sacrificial contact;
etching the sacrificial contact and the buffer layer to form a contact opening; and
forming the contact plug in the contact opening.

18. The method for forming the semiconductor structure as claimed in claim 17, further comprising:
forming a spacer layer along a sidewall of the sacrificial contact, wherein a first portion of the protection layer uncovered by the spacer layer is etched while a second portion of the protection layer covered by the spacer layer remains as a protection feature.

19. The method for forming the semiconductor structure as claimed in claim 18, further comprising:
removing the protection feature after etching the sacrificial contact and before etching the buffer layer.

20. The method for forming the semiconductor structure as claimed in claim 18, wherein a first portion of the buffer layer uncovered by the protection feature is etched while a second portion of the buffer layer covered by the protection feature remains.

* * * * *